(12) United States Patent
Morinaga et al.

(10) Patent No.: US 12,197,087 B2
(45) Date of Patent: Jan. 14, 2025

(54) DISPLAY DEVICE

(71) Applicant: Sharp Display Technology Corporation, Kameyama (JP)

(72) Inventors: Junichi Morinaga, Kameyama (JP); Hikaru Yoshino, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 213 days.

(21) Appl. No.: 18/095,959

(22) Filed: Jan. 11, 2023

(65) Prior Publication Data

US 2023/0251530 A1  Aug. 10, 2023

(30) Foreign Application Priority Data

Feb. 4, 2022  (JP) .................................. 2022-016128

(51) Int. Cl.

| | |
|---|---|
| *G02F 1/1339* | (2006.01) |
| *G02F 1/1335* | (2006.01) |
| *G02F 1/1343* | (2006.01) |
| *G02F 1/1362* | (2006.01) |
| *G02F 1/1368* | (2006.01) |
| *H01L 27/12* | (2006.01) |

(52) U.S. Cl.
CPC .... *G02F 1/13396* (2021.01); *G02F 1/133512* (2013.01); *G02F 1/133514* (2013.01); *G02F 1/134309* (2013.01); *G02F 1/136286* (2013.01); *G02F 1/1368* (2013.01); *H01L 27/124* (2013.01); *G02F 1/13394* (2013.01)

(58) Field of Classification Search
CPC ............. G02F 1/1335; G02F 1/133512; G02F 1/133514; G02F 1/1339; G02F 1/13394; G02F 1/13396; G02F 1/1343; G02F 1/134309; G02F 1/134318; G02F 1/134363; G02F 1/134381; G02F 1/1362; G02F 1/136222; G02F 1/136286; G02F 1/1368; H01L 27/124; H01L 27/1218; H01L 27/125; H01L 27/1248
See application file for complete search history.

(56) References Cited

U.S. PATENT DOCUMENTS

2009/0322996 A1  12/2009 Dong
2015/0192834 A1* 7/2015 Morinaga ......... G02F 1/136213
349/39

FOREIGN PATENT DOCUMENTS

JP           2010015122 A        1/2010

* cited by examiner

*Primary Examiner* — Thoi V Duong
(74) *Attorney, Agent, or Firm* — ScienBiziP, P.C.

(57) ABSTRACT

A display device includes an array substrate, a counter substrate facing the array substrate at an interval therebetween, a plurality of pixels constituted by the plurality of pixel electrodes and the plurality of color filters, and a plurality of thin film transistors. The plurality of pixels include a plurality of first pixels each having the highest relative luminous efficiency, a plurality of second pixels each having the lowest relative luminous efficiency, and a plurality of third pixels each having relative luminous efficiency lower than the relative luminous efficiency of the first pixels and higher than the relative luminous efficiency of the second pixels, a plurality of spacers include a plurality of spacers having different overlapping relationships with the thin film transistors being overlapping targets.

14 Claims, 35 Drawing Sheets

| AMOUNT OF DEVIATION IN Y-AXIS DIRECTION | AMOUNT OF DEVIATION IN X-AXIS DIRECTION | | | | | | | | | | |
|---|---|---|---|---|---|---|---|---|---|---|---|
| | −5 μm | −4 μm | −3 μm | −2 μm | −1 μm | 0 μm | +1 μm | +2 μm | +3 μm | +4 μm | +5 μm |
| +5 μm | 0.0203 | 0.0222 | 0.0239 | 0.0252 | 0.0257 | 0.0256 | 0.0243 | 0.0218 | 0.0188 | 0.0159 | 0.0135 |
| +4 μm | 0.0223 | 0.0244 | 0.0263 | 0.0276 | 0.0282 | 0.0281 | 0.0267 | 0.0239 | 0.0207 | 0.0175 | 0.0148 |
| +3 μm | 0.0242 | 0.0266 | 0.0286 | 0.0301 | 0.0307 | 0.0306 | 0.0290 | 0.0260 | 0.0225 | 0.0190 | 0.0162 |
| +2 μm | 0.0257 | 0.0281 | 0.0302 | 0.0318 | 0.0325 | 0.0324 | 0.0307 | 0.0276 | 0.0238 | 0.0201 | 0.0171 |
| +1 μm | 0.0264 | 0.0290 | 0.0311 | 0.0328 | 0.0335 | 0.0333 | 0.0317 | 0.0284 | 0.0246 | 0.0207 | 0.0176 |
| 0 μm | 0.0268 | 0.0294 | 0.0316 | 0.0332 | 0.0340 | 0.0338 | 0.0321 | 0.0288 | 0.0249 | 0.0210 | 0.0178 |
| −1 μm | 0.0256 | 0.0281 | 0.0302 | 0.0318 | 0.0325 | 0.0323 | 0.0307 | 0.0275 | 0.0238 | 0.0201 | 0.0171 |
| −2 μm | 0.0240 | 0.0263 | 0.0282 | 0.0297 | 0.0304 | 0.0302 | 0.0287 | 0.0258 | 0.0223 | 0.0188 | 0.0160 |
| −3 μm | 0.0221 | 0.0242 | 0.0260 | 0.0274 | 0.0280 | 0.0279 | 0.0265 | 0.0237 | 0.0205 | 0.0173 | 0.0147 |
| −4 μm | 0.0199 | 0.0218 | 0.0234 | 0.0247 | 0.0252 | 0.0251 | 0.0238 | 0.0214 | 0.0185 | 0.0156 | 0.0132 |
| −5 μm | 0.0180 | 0.0197 | 0.0212 | 0.0223 | 0.0228 | 0.0227 | 0.0215 | 0.0193 | 0.0167 | 0.0141 | 0.0120 |

FIG. 34

| | | AMOUNT OF DEVIATION IN X-AXIS DIRECTION | | | | | | | | | |
|---|---|---|---|---|---|---|---|---|---|---|---|
| | | −5 μm | −4 μm | −3 μm | −2 μm | −1 μm | 0 μm | +1 μm | +2 μm | +3 μm | +4 μm | +5 μm |
| AMOUNT OF DEVIATION IN Y-AXIS DIRECTION | +5 μm | 0.0165 | 0.0182 | 0.0198 | 0.0211 | 0.0219 | 0.0224 | 0.0223 | 0.0216 | 0.0205 | 0.0189 | 0.0172 |
| | +4 μm | 0.0181 | 0.0201 | 0.0218 | 0.0233 | 0.0242 | 0.0247 | 0.0246 | 0.0238 | 0.0226 | 0.0209 | 0.0190 |
| | +3 μm | 0.0196 | 0.0217 | 0.0236 | 0.0252 | 0.0261 | 0.0267 | 0.0266 | 0.0258 | 0.0244 | 0.0226 | 0.0206 |
| | +2 μm | 0.0208 | 0.0230 | 0.0251 | 0.0267 | 0.0277 | 0.0283 | 0.0282 | 0.0273 | 0.0259 | 0.0239 | 0.0218 |
| | +1 μm | 0.0217 | 0.0241 | 0.0262 | 0.0279 | 0.0290 | 0.0296 | 0.0295 | 0.0286 | 0.0271 | 0.0250 | 0.0228 |
| | 0 μm | 0.0219 | 0.0242 | 0.0263 | 0.0281 | 0.0292 | 0.0298 | 0.0297 | 0.0288 | 0.0272 | 0.0252 | 0.0230 |
| | −1 μm | 0.0214 | 0.0237 | 0.0258 | 0.0275 | 0.0285 | 0.0292 | 0.0290 | 0.0282 | 0.0267 | 0.0247 | 0.0225 |
| | −2 μm | 0.0206 | 0.0228 | 0.0248 | 0.0265 | 0.0275 | 0.0281 | 0.0281 | 0.0272 | 0.0258 | 0.0238 | 0.0218 |
| | −3 μm | 0.0191 | 0.0212 | 0.0231 | 0.0246 | 0.0256 | 0.0262 | 0.0261 | 0.0253 | 0.0240 | 0.0222 | 0.0202 |
| | −4 μm | 0.0176 | 0.0195 | 0.0212 | 0.0226 | 0.0235 | 0.0240 | 0.0240 | 0.0233 | 0.0221 | 0.0204 | 0.0186 |
| | −5 μm | 0.0160 | 0.0177 | 0.0193 | 0.0205 | 0.0214 | 0.0219 | 0.0218 | 0.0212 | 0.0201 | 0.0186 | 0.0169 |

FIG. 35

DISPLAY DEVICE

CROSS-REFERENCE TO RELATED APPLICATIONS

This application claims the benefit of priority to Japanese Patent Application Number 2022-016128 filed on Feb. 4, 2022. The entire contents of the above-identified application are hereby incorporated by reference.

BACKGROUND

Technical Field

The technique disclosed in the present specification relates to a display device.

As an example of a liquid crystal display device in the related art, there is known a liquid crystal display device described in JP 2010-15122 A. A liquid crystal display device described in JP 2010-15122 A includes a liquid crystal display panel including an array substrate and a color filter substrate bonded together. The color filter substrate is provided with a main photo spacer, and the tip of the color filter substrate is provided in contact with the position of a subpixel of the array substrate, and one or two or more subpixels correspond to one main photo spacer. The main photo spacers are divided into at least two main photo spacer groups, and the main photo spacers have the same preset position and shape of a tip end face for each main photo spacer group.

SUMMARY

Incidentally, in the vicinity of the main photo spacer provided in the liquid crystal display device described in JP 2010-15122 A, an alignment failure of liquid crystal molecules tends to easily occur, and a display failure such as a bright spot defect in which light is transmitted at all times is more likely to occur, as compared to the vicinity of a sub-photo spacer. JP 2010-15122 A describes three types of main photo spacers belonging to three groups having different overlapping relationships with respect to a channel of a thin film transistor. In a case where light blocking ranges in the vicinities of these three main photo spacers are made uniform, there is a concern that a display failure such as a bright spot defect is likely to be visually recognized depending on the arrangement of the main photo spacers with respect to the channel.

The technique described in the present specification is made based on the circumstances described above, and an object thereof is to suppress the degradation of display quality due to a spacer.

(1) A display device according to the technique described in the present specification includes an array substrate, a counter substrate spacing apart from and facing the array substrate, a plurality of color filters provided in the array substrate or the counter substrate, the plurality of color filters exhibiting different colors, a plurality of pixel electrodes provided in the array substrate, the plurality of pixel electrodes overlapping the plurality of color filters, a plurality of pixels constituted by the plurality of color filters and the plurality of pixel electrodes, the plurality of pixels having different relative luminous efficiency, a plurality of thin film transistors provided in the array substrate, the plurality of thin film transistors respectively connected to the plurality of pixel electrodes, and a plurality of spacers provided in at least the counter substrate, the plurality of spacers protruding toward the array substrate from the counter substrate, the plurality of spacers disposed to overlap at least some of the plurality of thin film transistors, in which the plurality of pixels include a plurality of first pixels each having the highest relative luminous efficiency, a plurality of second pixels each having the lowest relative luminous efficiency, and a plurality of third pixels disposed adjacent to the second pixels, the plurality of third pixels each having relative luminous efficiency lower than the relative luminous efficiency of the plurality of first pixels and higher than the relative luminous efficiency of the plurality of second pixels, the plurality of spacers include a plurality of spacers having different overlapping relationships with the plurality of thin film transistors each being an overlapping target, and an overlapping target of each of the plurality of spacers having different overlapping relationships is a thin film transistor of the plurality of thin film transistors that is closest to a boundary between a second pixel of the plurality of second pixels and a third pixel of the plurality of third pixels.

(2) Further, in addition to (1), in the display device, the counter substrate may include a plurality of pixel openings respectively overlapping the plurality of pixel electrodes, and a light blocking portion disposed to overlap the plurality of spacers, and the plurality of spacers having different overlapping relationships may include a plurality of the spacers having shortest distances being equal to each other, the shortest distances being distances from opening edges of two of the plurality of pixel openings overlapping a pixel electrode of the plurality of pixel electrodes of the second pixel and a pixel electrode of the plurality of pixel electrodes of the third pixel that sandwich the boundary closest to the thin film transistor being an overlapping target.

(3) Further, in addition to (2), in the display device, the plurality of spacers having the shortest distances being equal to each other may be configured such that distances between centers of the plurality of spacers and respective centers of the plurality of thin film transistors each being an overlapping target are equal to each other.

(4) Further, in addition to (3), in the display device, the plurality of spacers having the shortest distances being equal to each other may be disposed at positions that are concentric with vertexes of a regular polygon that is concentric with each of the centers of the plurality of thin film transistors being an overlapping target.

(5) Further, in addition to any one of (2) to (4), in the display device, the light blocking portion may be configured such that, among the plurality of pixel openings respectively overlapping the pixel electrodes of the plurality of second pixels and the pixel electrodes of the plurality of third pixels that sandwich a plurality of the boundaries closest to the plurality of thin film transistors respectively overlapping the plurality of spacers having the shortest distances being equal to each other, planar shapes of the plurality of pixel openings respectively overlapping the pixel electrodes of the plurality of second pixels are the same, and planar shapes of the plurality of pixel openings respectively overlapping the pixel electrodes of the plurality of third pixels are the same.

(6) Further, in addition to any one of (2) to (5), in the display device, the plurality of spacers having the shortest distances being equal to each other may be disposed to overlap the respective centers of the plurality of thin film transistors each being an overlapping target.

(7) Further, in addition to any one of (2) to (6), in the display device, the plurality of spacers having different overlapping relationships may include a spacer of the plurality of spacers disposed concentrically with the thin film transistor being an overlapping target, and the spacer disposed in a concentric manner has the shortest distance larger than the shortest distances of the plurality of spacers having the shortest distances being equal to each other.

(8) Further, in addition to any one of (2) to (6), in the display device, the plurality of spacers having different overlapping relationships may include a spacer of the plurality of spacers disposed concentrically with the thin film transistor being an overlapping target, and the spacer disposed in a concentric manner and the plurality of spacers having the shortest distances being equal to each other may have the same shortest distances.

(9) Further, in addition to (8), the display device may further include a plurality of sub-spacers provided in at least the counter substrate, the plurality of sub-spacers protruding toward the array substrate from the counter substrate, the plurality of sub-spacers having protrusion dimensions smaller than protrusion dimensions of the plurality of the spacers, in which the plurality of sub-spacers may be disposed to overlap at least some of a plurality of thin film transistors in which the plurality of spacers are not disposed among the plurality of thin film transistors, and the light blocking portion may be disposed to overlap the plurality of sub-spacers and may be configured such that, among the plurality of pixel openings, planar shapes of the plurality of pixel openings overlapping the plurality of pixel electrodes respectively connected to the plurality of thin film transistors respectively overlapping the plurality of sub-spacers and planar shapes of two of the plurality of pixel openings overlapping the pixel electrode of the second pixel and the pixel electrode of the third pixel that sandwich the boundary closest to the thin film transistor overlapping the spacer disposed in a concentric manner are the same.

(10) Further, in addition to (1), in the display device, the thin film transistor may include a gate electrode, an island-shaped semiconductor portion disposed to overlap the gate electrode with a gate insulating film interposed between the gate electrode and the island-shaped semiconductor portion, the island-shaped semiconductor portion constituted by a semiconductor film, the island-shaped semiconductor portion including a channel portion, a source electrode being in contact with a portion of the semiconductor portion, and a drain electrode disposed spaced apart from the source electrode, the drain electrode being in contact with a portion of the semiconductor portion, the source electrode and the drain electrode may have different contact areas with the semiconductor portion, and the plurality of spacers may be unevenly distributed to be closer to the electrode having a large contact area out of the source electrode and the drain electrode.

(11) Further, in addition to (10), in the display device, the counter substrate may include a plurality of pixel openings respectively overlapping the plurality of pixel electrodes, and a light blocking portion disposed to overlap the plurality of spacers, and the plurality of spacers may be unevenly distributed to be closer to the second pixel out of the second pixel and the third pixel that sandwich the boundary closest to the thin film transistor being an overlapping target.

(12) Further, in addition to any one of (1) to (11), the display device may further include a source wiring line extending along the boundary closest to the thin film transistor overlapping a spacer of the plurality of spacers, and a gate wiring line intersecting the source wiring line, in which the thin film transistor may include a gate electrode constituted by a first conductive film, an island-shaped semiconductor portion disposed to overlap the gate electrode with a gate insulating film interposed between the gate electrode and the island-shaped semiconductor portion, the island-shaped semiconductor portion constituted by a semiconductor film, the island-shaped semiconductor portion including a channel portion, a source electrode constituted by a second conductive film, the source electrode being in contact with a portion of the semiconductor portion, and a drain electrode constituted by a portion of the second conductive film, the portion being separate from the source electrode, the drain electrode disposed spaced apart from the source electrode, the drain electrode being in contact with a portion of the semiconductor portion, the gate wiring line may be constituted by a portion of the first conductive film, the portion being separate from the gate electrode, and may be continuous with the gate electrode, the source wiring line may be constituted by a portion of the second conductive film, the portion being separate from the source electrode and the drain electrode, and may be continuous with the source electrode, and the display device may further include a first overlapping portion disposed to overlap a portion of the spacer included in the plurality of spacers having different overlapping relationships, and a portion of the gate wiring line, the first overlapping portion constituted by a portion of the semiconductor film, the portion being separate from the semiconductor portion, and a second overlapping portion disposed to overlap the first overlapping portion and constituted by a portion of the second conductive film, the portion being separate from the source electrode, the drain electrode, and the source wiring line.

(13) Further, in addition to (12), the display device may further include a third overlapping portion disposed to overlap a portion of the spacer included in the plurality of spacers having different overlapping relationships, and a portion of the source wiring line, the third overlapping portion constituted by a portion of the first conductive film, the portion being separate from the gate electrode and the gate wiring line, and a fourth overlapping portion disposed to overlap the third overlapping portion, the fourth overlapping portion constituted by a portion of the semiconductor film, the portion being separate from the semiconductor portion and the first overlapping portion.

(14) Further, in addition to any one of (1) to (11), the display device may further include a source wiring line extending along the boundary closest to the thin film transistor overlapping a spacer of the plurality of spacers, and a gate wiring line intersecting the source wiring line, in which the thin film transistor may include a gate electrode constituted by a first conductive film, an island-shaped semiconductor portion disposed to overlap the gate electrode through a gate insulating film interposed between the gate electrode and the island-shaped semiconductor portion, the island-shaped semiconductor portion constituted by a semiconductor film, the island-shaped semiconductor portion including a channel portion, a source electrode constituted by a second conductive film, the source electrode being in contact with a portion of the semiconductor portion, and a drain electrode constituted by a portion of the second conductive film, the portion being separate from the source electrode, the drain electrode disposed spaced apart from the source electrode, the drain electrode being in contact with a portion of the semiconductor portion, the gate wiring line may be constituted by a portion of the first conductive film, the portion being separate from the gate electrode, and may be continuous with the gate electrode, the source wiring line may be constituted by a portion of the second conductive film, the portion being separate from the source electrode and the drain electrode, and may be continuous with the source electrode, and the display device may further include a third overlapping portion disposed to overlap a portion of the spacer included in the plurality of spacers having different overlapping relationships, and a portion of the source wiring line, and constituted by a portion of the first conductive film, the portion being separate from the gate electrode and the gate wiring line, and a fourth overlapping portion disposed to overlap the third overlapping portion and constituted by a portion of the semiconductor film, the portion being separate from the semiconductor portion.

According to the technique described in the present specification, the degradation of display quality due to a spacer can be suppressed.

BRIEF DESCRIPTION OF DRAWINGS

The disclosure will be described with reference to the accompanying drawings, wherein like numbers reference like elements.

FIG. 6 is a cross-sectional view of the liquid crystal panel taken along line vi-vi in

FIG. 3.

FIG. 8 is a cross-sectional view of the liquid crystal panel taken along line viii-viii in

FIG. 3.

FIG. 34 is a table showing experimental results of a comparative example according to a comparative experiment.

FIG. 35 is a table showing experimental results of an example according to a comparative experiment.

DESCRIPTION OF EMBODIMENTS

First Embodiment

A first embodiment will be described with reference to FIG. 1 to FIG. 16. In the present embodiment, a liquid crystal panel (display device) 10 will be exemplified. Note that an X axis, a Y axis, and a Z axis are illustrated in a portion of each drawing, and each axial direction is illustrated to represent a direction in each drawing.

Figure 1:
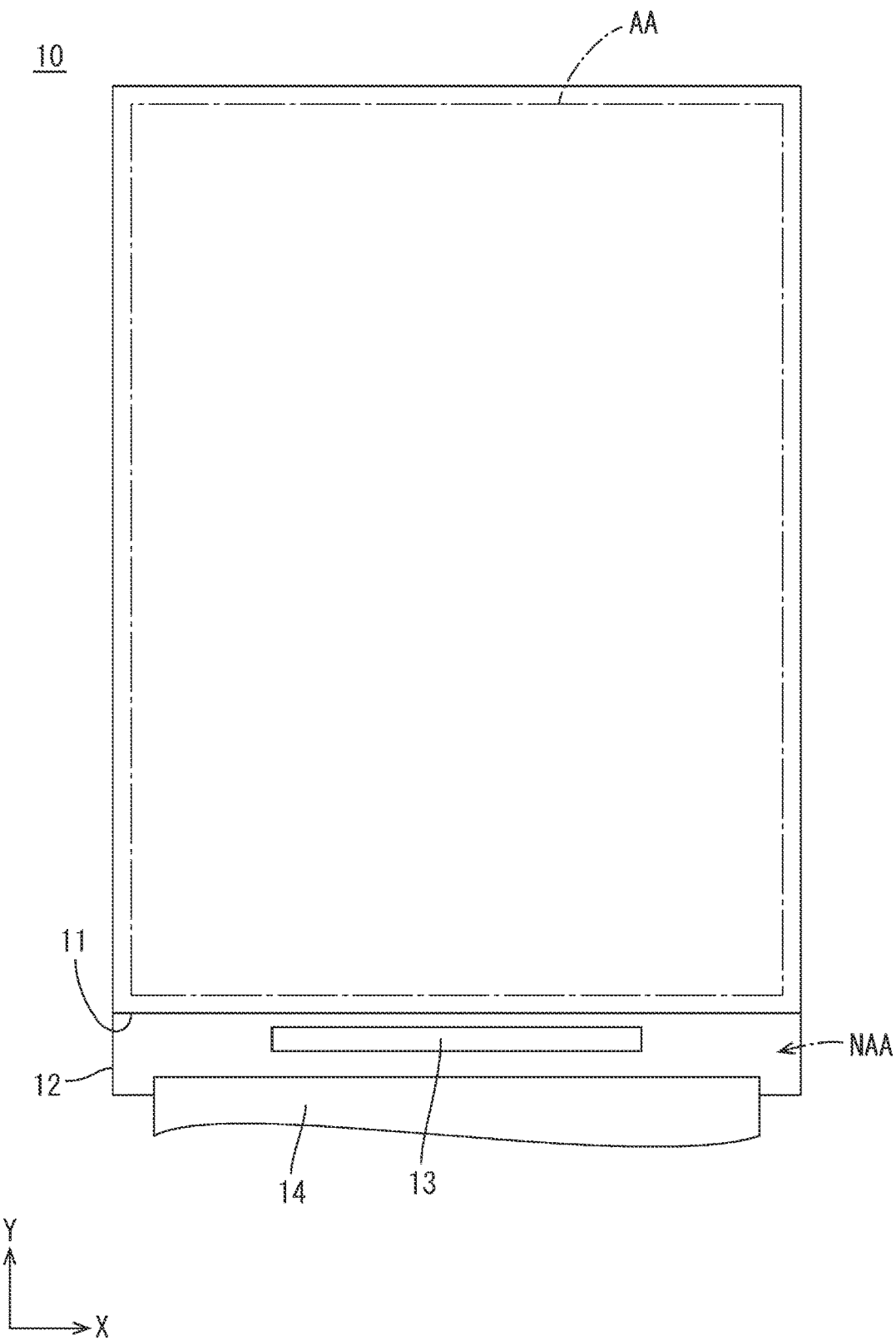
FIG. 1 is a plan view of a liquid crystal panel according to a first embodiment.

A schematic configuration of a liquid crystal panel 10 will be described with reference to FIG. 1 and FIG. 2. The liquid crystal panel 10 according to the present embodiment has a planar shape being a substantially rectangular shape which is vertically long as a whole, as illustrated in FIG. 1. Note that the planar shape of the liquid crystal panel 10 may not only be a substantially rectangular shape which is vertically long, but may be a variant (non-rectangle) such as a substantially rectangular shape which is horizontally long, a substantially square shape, or a circular shape. A short-side direction, a long-side direction, and a plate-thickness direction of the liquid crystal panel 10 match an X-axis direction, a Y-axis direction, and a Z-axis direction, respectively. The liquid crystal panel 10 can display an image by using illumination light radiated from a backlight device (illumination device). The center-side portion of the screen of the liquid crystal panel 10 is a display region AA in which images are displayed. A frame-shaped outer peripheral portion surrounding the display region AA on the screen of the liquid crystal panel 10 is a non-display region NAA in which no images are displayed. Note that a range surrounded by an alternating dotted-dashed line in FIG. 1 is the display region AA.

The liquid crystal panel 10 includes a pair of glass substrates 11 and 12 that are substantially transparent and have excellent light-transmitting properties as illustrated in FIG. 1. The liquid crystal panel 10 is configured such that a liquid crystal layer containing liquid crystal molecules that are a substance having optical characteristics that change depending on an applied electrical field is sandwiched between the pair of substrates 11 and 12. Out of the pair of substrates 11 and 12, the substrate disposed on the front side is a counter substrate (CF substrate) 11, and the substrate disposed on the back side is an array substrate (thin film transistor substrate) 12. The counter substrate 11 and the array substrate 12 are both formed by layering various films on the inner surface sides of glass substrates (substrates). Among these, the array substrate 12 has a long side dimension greater than a long side dimension of the counter substrate 11 and has one end portion in the long-side direction which does not overlap the counter substrate 11, and a driver (signal supply unit) 13 and a flexible substrate 14 are mounted at the one end portion of the array substrate 12. The driver 13 is constituted by an LSI chip having a drive circuit therein. The driver 13 processes various signals transmitted by the flexible substrate 14. The driver 13 is mounted on the array substrate 12 in a Chip-On-Glass (COG) manner. The flexible substrate 14 has a configuration in which a large number of wiring line patterns (not illustrated) are formed on a base material formed of a synthetic resin material (for example, a polyimide resin or the like) having insulating properties and flexibility. One end side of the flexible substrate 14 is connected to the array substrate 12, and the other end side thereof is connected to an external control substrate (signal supply source). Various signals supplied from the control substrate are transmitted to the liquid crystal panel 10 via the flexible substrate 14.

Figure 2:
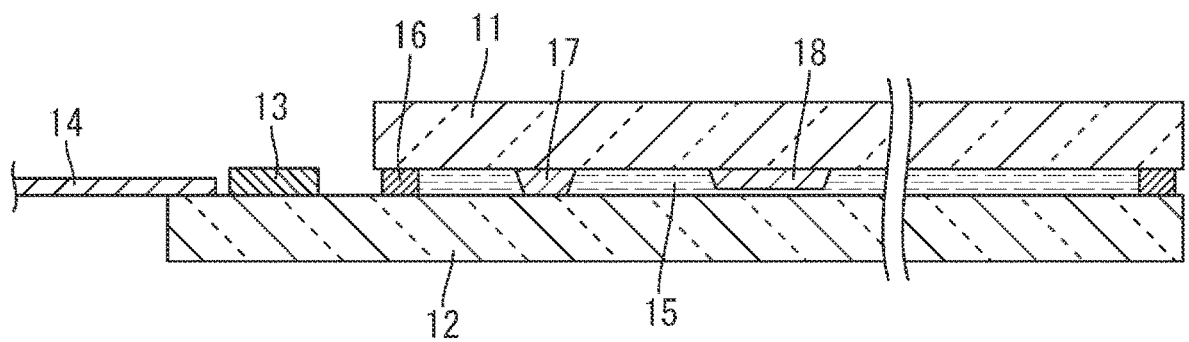
FIG. 2 is a schematic cross-sectional view of the liquid crystal panel.

The liquid crystal panel 10 includes a liquid crystal layer (medium layer) 15 filling the internal space between the pair of substrates 11 and 12 as illustrated in FIG. 2. The liquid crystal layer 15 includes liquid crystal molecules that are a substance having optical characteristics changing according to an applied electric field. The liquid crystal layer 15 is sealed by a sealing portion 16 surrounding the internal space between the pair of substrates 11 and 12. The sealing portion 16 is disposed in the non-display region NAA, and is formed in a rectangular frame shape (endless ring shape) to surround the entire circumference of the internal space between both the substrates 11 and 12. A main spacer (spacer) 17 and a sub-spacer 18 that protrude toward the array substrate 12 are provided on the inner surface of the counter substrate 11. The main spacer 17 and the sub-spacer 18 can maintain an interval between the pair of substrates 11 and 12, that is, a cell gap. The main spacer 17 has a protrusion dimension larger than that of the sub-spacer 18, and is in contact with the inner surface of the array substrate 12 at all times. The sub-spacer 18 has a protrusion dimension smaller than that of the main spacer 17, and is not always in contact with the inner surface of the array substrate 12, but is in contact with the inner surface of the array substrate 12 when an external force is applied to the counter substrate 11 and/or the array substrate 12. In addition, a pair of polarizers are attached to the outer surfaces of the pair of substrates 11 and 12.

Figure 3:
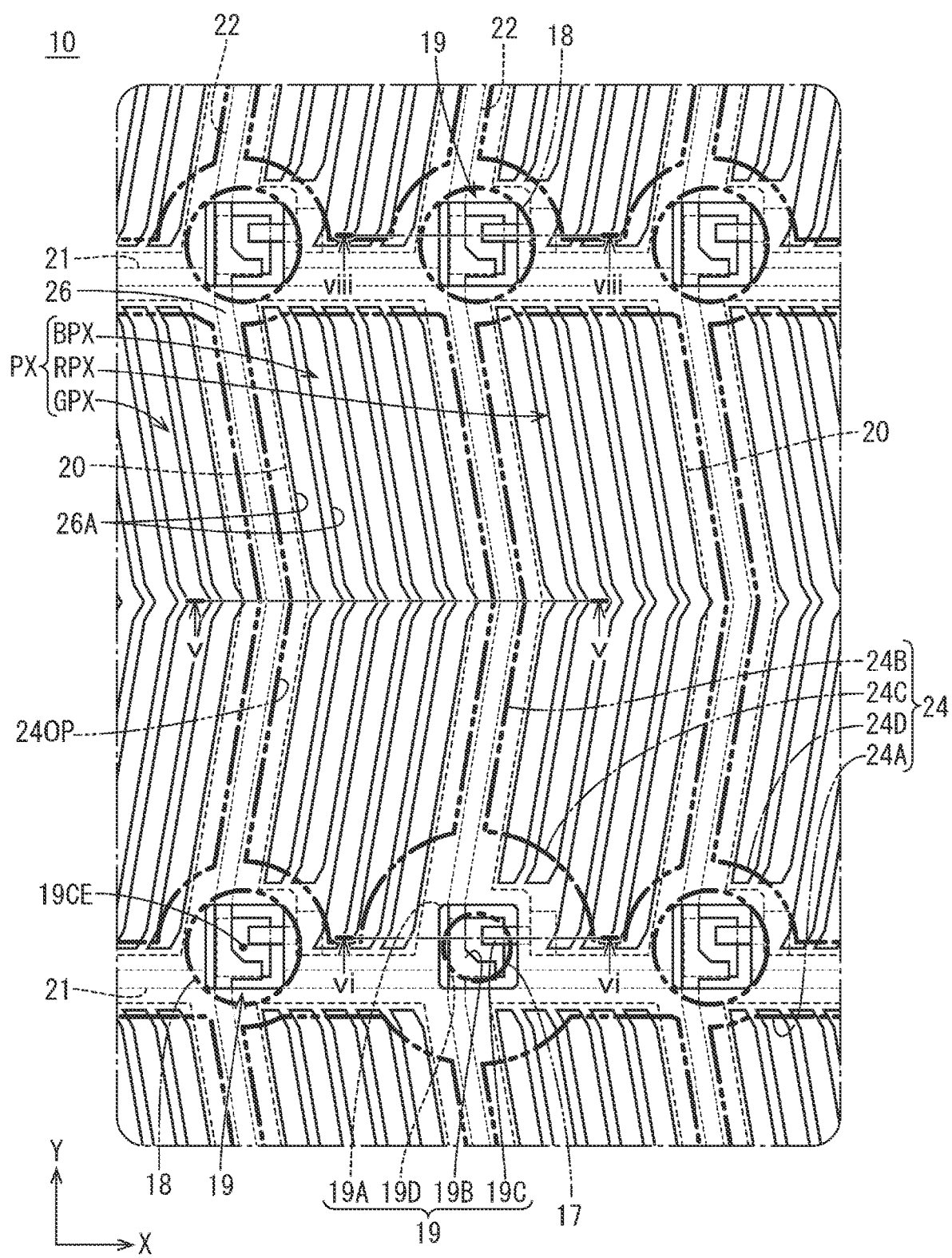
FIG. 3 is a plan view illustrating a pixel array in a display region of the liquid crystal panel.

A pixel array in the display region AA of the array substrate 12 will be described with reference to FIG. 3. As illustrated in FIG. 3, a plurality of TFTs (thin film transistors, switching elements) 19 and a plurality of pixel electrodes 20 are provided side by side at intervals in the plane of the array substrate 12 on the inner surface side of the array substrate 12 in the display region AA. The plurality of TFTs 19 and the plurality of pixel electrodes 20 are provided side by side in a matrix shape at intervals in the X-axis direction (first direction) and the Y-axis direction (second direction) that intersect each other. The pixel electrode 20 has a vertically long shape when viewed in a plan view and is bent in the middle thereof in the longitudinal direction. Specifically, the pixel electrode 20 is configured such that both side edges in the longitudinal direction thereof are slightly inclined with respect to the Y-axis direction, and is bent once at a substantially central position thereof, thereby forming a shallow V-shape in which the apex angle is an obtuse angle. A gate wiring line (scanning wiring line) 21 and a source wiring line (signal wiring line) 22, which are formed in a lattice pattern, are disposed to surround the TFTs 19 and the pixel electrodes 20. The gate wiring line 21 extends substantially linearly in the X-axis direction, and a plurality of the gate wiring lines 21 are disposed side by side at intervals so as to sandwich the pixel electrodes 20 in the Y-axis direction. The line width of the gate wiring line 21 changes depending on the position in the X-axis direction. The source wiring line 22 is parallel to the side edge of the pixel electrode 20 in the longitudinal direction, and extends substantially in the Y-axis direction while being repeatedly bent into a zigzag shape. A plurality of the source wiring lines 22 are disposed side by side at intervals so as to sandwich the pixel electrodes 20 in the X-axis direction. The gate wiring line 21 and the source wiring line 22 intersect each other, and the number of intersections is a value obtained by multiplying the number of the gate wiring lines 21 installed by the number of the source wiring lines 22 installed.

As illustrated in FIG. 3, the gate wiring line 21 is connected to gate electrodes 19A provided in the plurality of TFTs 19 aligned in the X-axis direction. The source wiring line 22 is connected to source electrodes 19B provided in the plurality of TFTs 19 aligned in the Y-axis direction. The pixel electrode 20 is connected to a drain electrode 19C provided in the TFT 19. The TFT 19 is driven with a scanning signal supplied to the gate wiring line 21, and the pixel electrode 20 is charged to a potential based on an image signal supplied to the source wiring line 22 in association with the driving. The TFT 19 is disposed at an intersection between the gate wiring line 21 and the source wiring line 22. Specifically, the TFT 19 is disposed at an intersection between the gate wiring line 21 positioned on the lower side in FIG. 3 with respect to the pixel electrode 20 to be connected, and the source wiring line 22 positioned on the left side in FIG. 3 with respect to the pixel electrode 20 to be connected. The TFT 19 is biased to one side (the left side in FIG. 3) in the X-axis direction with respect to the pixel electrode 20 to be connected, and is biased on one side (the lower side in FIG. 3) in the Y-axis direction. Specifically, the TFT 19 is disposed in the vicinity of a left lower corner of the pixel electrode 20 to be connected in FIG. 3.

Figure 4:
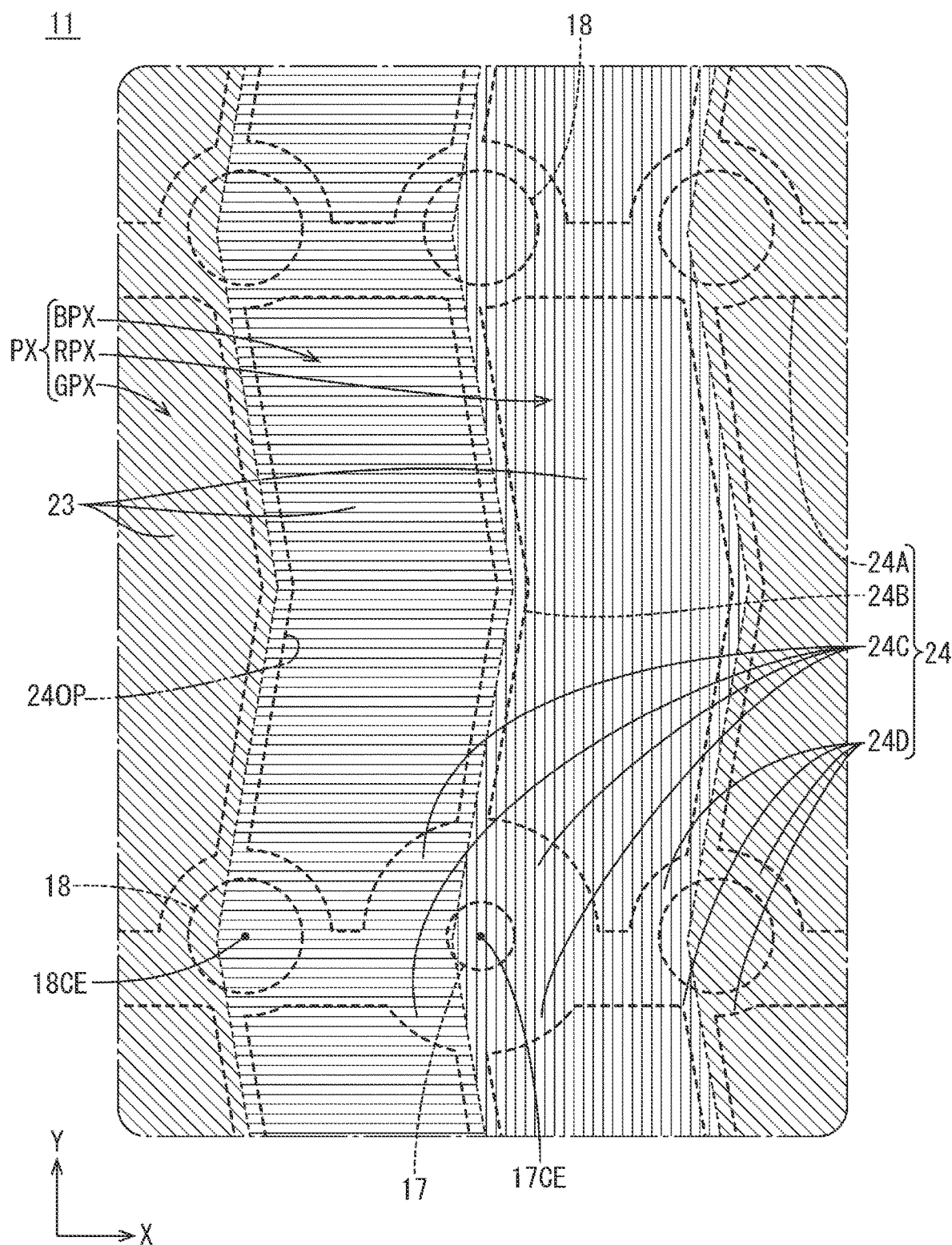
FIG. 4 is a plan view illustrating a pixel array in a display region of a counter substrate constituting the liquid crystal panel.

A pixel array in the display region AA of the counter substrate 11 will be described with reference to FIG. 4. As illustrated in FIG. 4, color filters 23 and a light blocking portion (an inter-pixel light blocking portion, a black matrix) 24 are provided on the inner surface side of the counter substrate 11 in the display region AA, in addition to the main spacer 17 and the sub-spacer 18 described above. The color filter 23 exhibits blue (B), green (G) and red (R) colors. In FIG. 4, the color filter 23 is illustrated in a shaded pattern which is different for each color. The plurality of color filters 23 exhibiting colors different from each other are disposed side by side so as to be adjacent to each other in the X-axis direction (an extending direction of the gate wiring line 21). The plurality of color filters 23 exhibiting colors different from each other extend in the Y-axis direction (an extending direction of the source wiring line 22). In this manner, the plurality of color filters 23 exhibiting colors different from each other are arranged in a stripe shape as a whole.

The light blocking portion 24 is formed of a light blocking material having light blocking properties (for example, a material containing a pigment such as a carbon black in a photosensitive resin material such as an acrylic or polyimide). The light blocking portion 24 can block light emitted from a backlight device or the like. As illustrated in FIG. 4, the light blocking portion 24 has a planar shape being a substantially lattice pattern in the display region AA. The light blocking portion 24 separates adjacent pixel electrodes 20. The light blocking portion 24 is disposed to overlap at least the gate wiring line 21 and the source wiring line 22 on the array substrate 12 side when viewed in a plan view. The light blocking portion 24 includes a first light blocking portion 24A that extends in the X-axis direction, and a second light blocking portion 24B that extends substantially in the Y-axis direction and intersects the first light blocking portion 24A. The mutual intersections of the first light blocking portion 24A and the second light blocking portion 24B are contiguous with each other. The number of the first light blocking portions 24A installed matches the number of the gate wiring lines 21 installed. The number of the second light blocking portions 24B installed matches the number of the source wiring lines 22 installed. In the light blocking portion 24, the number of intersections between the plurality of first light blocking portions 24A and the plurality of second light blocking portions 24B matches the number of intersections between the plurality of gate wiring lines 21 and the plurality of source wiring lines 22. The main spacer 17 and the sub-spacer 18 are disposed to overlap each other when viewed in a plan view at the intersection between the first light blocking portion 24A and the second light blocking portion 24B. Detailed configurations of the main spacer 17 and the sub-spacer 18 will be described later again. The first light blocking portion 24A is wider than the second light blocking portion 24B. The first light blocking portion 24A is disposed to overlap at least the spacers 17 and 18, the TFT 19, and the gate wiring line 21 (see FIG. 3 and FIG. 4). The second light blocking portion 24B is narrower than the first light blocking portion 24A. The second light blocking portion 24B is disposed to overlap at least the spacers 17 and 18, the TFT 19, and the source wiring line 22. A region surrounded by the first light blocking portion 24A and the second light blocking portion 24B in the plane of the counter substrate 11 is positioned to overlap most of the pixel electrode 20 and most of the color filter 23. The above-described region constitutes a pixel opening 24OP, transmits light transmitted through the pixel electrode 20 and the color filter 23, and emits the light to the outside of the liquid crystal panel 10. Note that the light blocking portion 24 is also provided in the non-display region NAA of the counter substrate 11, and is disposed in a solid form over substantially the entire region in the non-display region NAA.

Figure 5:
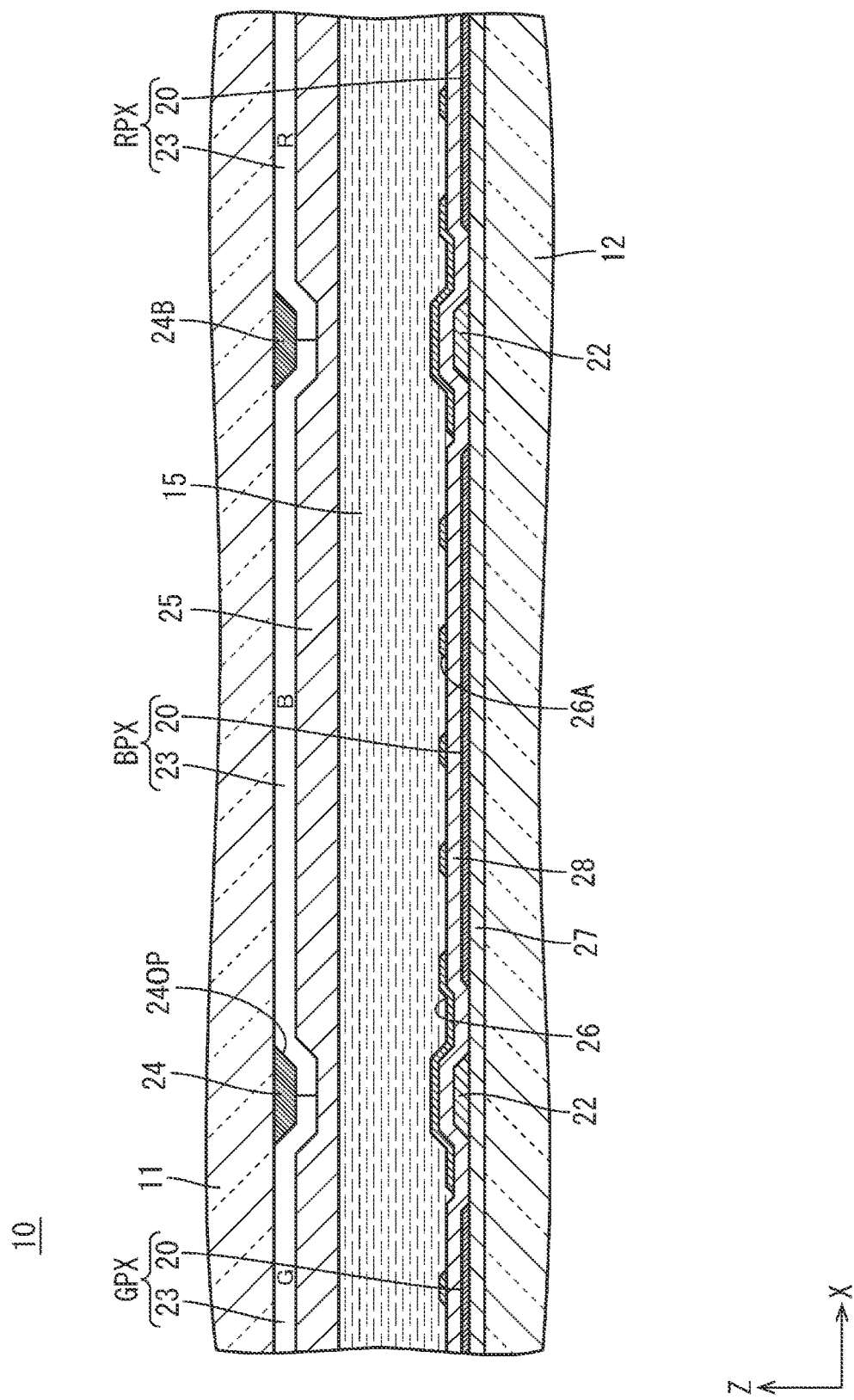
FIG. 5 is a cross-sectional view of the liquid crystal panel taken along line v-v in FIG. 3.

A cross-sectional configuration in the vicinity of the center of the pixel electrode 20 (pixel PX) in the liquid crystal panel 10 will be described with reference to FIG. 5. The color filter 23 provided in the counter substrate 11 is disposed to overlap the pixel electrode 20 provided in the array substrate 12 when viewed in a plan view, as illustrated in FIG. 5. A plurality of color filters 23 exhibiting colors different from each other in the counter substrate 11 are disposed such that the boundaries (color boundaries) therebetween overlap the source wiring line 22 of the array substrate 12. In the liquid crystal panel 10, the color filters 23 exhibiting red, green, and blue colors aligned in the X-axis direction and three pixel electrodes 20 facing the respective color filters 23 constitute pixels PX of three colors, respectively. The pixels PX of three colors includes a green pixel (first pixel) GPX, a blue pixel (second pixel) BPX, and a red pixel (third pixel) RPX. The green pixel GPX is constituted by the color filter 23 exhibiting a green color and a pixel electrode 20 that faces the color filter 23 exhibiting a green color. The green pixel GPX selectively transmits green light having a wavelength included in a green wavelength region (approximately 500 nm to approximately 570 nm). The green pixel GPX has the highest relative luminous efficiency. The blue pixel BPX is constituted by the color filter 23 exhibiting a blue color and a pixel electrode 20 that faces the color filter 23 exhibiting a blue color. The blue pixel BPX selectively transmits blue light included in a blue wavelength region (approximately 400 nm to approximately 500 nm). The blue pixel BPX has the lowest relative luminous efficiency. The red pixel RPX is constituted by the color filter 23 exhibiting a red color and a pixel electrode 20 that faces the color filter 23 exhibiting a red color. The red pixel RPX selectively transmits red light having a wavelength included in a red wavelength region (approximately 600 nm to approximately 780 nm). The red pixel RPX has relative luminous efficiency lower than that of the green pixel GPX, but has relative luminous efficiency higher than that of the blue pixel BPX.

The pixels PX of three colors are repeatedly disposed side by side in the order of the green pixel GPX, the blue pixel BPX, and the red pixel RPX from the left side illustrated in FIG. 5. The blue pixel BPX is adjacent to the green pixel GPX on the right side in FIG. 5, and the red pixel RPX is adjacent to the green pixel GPX on the left side in FIG. 5. The red pixel RPX is adjacent to the blue pixel BPX on the right side in FIG. 5, and the green pixel GPX is adjacent to the blue pixel BPX on the left side in FIG. 5. The green pixel GPX is adjacent to the red pixel RPX on the right side in FIG. 5, and the blue pixel BPX is adjacent to the red pixel RPX on the left side in FIG. 5. Then, in the liquid crystal panel 10, a display pixel capable of color display with predetermined gray scale is constituted by the pixels PX of three R, G, and B colors adjacent to each other in the X-axis direction. An array pitch of the pixels PX in the Y-axis direction is approximately three times an array pitch thereof in the X-axis direction. The light blocking portion 24 is disposed to separate the adjacent color filters 23 or the adjacent pixels PX. Specifically, the first light blocking portion 24A separates two pixels PX adjacent to each other in the Y-axis direction. The second light blocking portion 24B separates two color filters 23 adjacent to each other in the X-axis direction. In addition, in the counter substrate 11, an overcoat film 25 for flattening is disposed in a solid form over substantially the entire region of the counter substrate 11 on the upper layer side (liquid crystal layer 15 side) of the color filters 23.

Next, the pixel electrodes 20 and a common electrode 26 provided in the array substrate 12 will be described. On the inner surface side of the array substrate 12 in the display region AA, the common electrode 26 is formed on the upper layer side of the pixel electrodes 20 so as to overlap all of the pixel electrodes 20, as illustrated in FIG. 5. The common electrode 26 extends over substantially the entire display region AA. A common wiring line is connected to the common electrode 26, and a common potential signal (reference potential signal) of a common potential (reference potential) is supplied via the common wiring line. The flexible substrate 14 is connected to the common wiring line, and a common potential signal is supplied from a control substrate (see FIG. 1). In a portion of the common electrode 26 which overlaps the pixel electrodes 20, a plurality of slits 26A extending in the long-side direction of each pixel electrode 20 are formed to be open. Note that a specific number of the slits 26A installed, and the shape, formation range, and the like thereof can be appropriately changed other than those illustrated in the drawings. In addition, an opening is provided at a position of the common electrode 26 which overlaps each TFT 19. When the pixel electrode 20 is charged in association with the driving of the TFT 19, a potential difference is generated between the pixel electrode 20 and the common electrode 26 overlapping each other. Then, a fringe electrical field (oblique electrical field) containing a component in a normal direction with respect to the plate surface of the array substrate 12 in addition to a component along the plate surface of the array substrate 12 is generated between the pixel electrode 20 and an opening edge of the slit 26A. By using the fringe electrical field, the alignment state of the liquid crystal molecules contained in the liquid crystal layer 15 can be controlled. In other words, the liquid crystal panel 10 according to the present embodiment has an operation mode of a fringe field switching (FFS) mode. In addition, alignment films for aligning the liquid crystal molecules contained in the liquid crystal layer 15 are provided on the innermost surfaces of the counter substrate 11 and the array substrate 12, respectively. The alignment film is a photo-alignment film that allows an alignment regulating force to be imparted to the liquid crystal molecules by light photo-alignment treatment being performed on the surface thereof.

Various films layered on the inner surface side of the array substrate 12 will now be described with reference to FIG. 5 and FIG. 6. As illustrated in FIG. 5, in the array substrate 12, a first metal film (first conductive film), a gate insulating film 27, a semiconductor film, a second metal film (second conductive film), a first transparent electrode film, an interlayer insulating film 28, a second transparent electrode film, and an alignment film are layered in this order from the lower layer side (glass substrate side). The first metal film and the second metal film are each a single layer film formed of one type of metal material selected from copper, titanium, aluminum, molybdenum, tungsten, and the like, or a layered film or alloy formed of different types of metal materials, and thus have conductivity and light blocking properties. The first metal film constitutes the gate wiring line 21, the gate electrode 19A of the TFT 19, and the like. The second metal film constitutes the source wiring line 22, the source electrode 19B and the drain electrode 19C of the TFT 19, and the like. The semiconductor film is constituted by a thin film using, for example, an oxide semiconductor, amorphous silicon, or the like as the material thereof, and constitutes an island-shaped semiconductor portion 19D including a channel portion of the TFT 19, and the like. In particular, a case where an oxide semiconductor is used as the material of the semiconductor film is preferable to achieve miniaturization of the TFT 19 because of a high charging capability, as compared to a case where an amorphous silicon is used. When the TFT 19 is miniaturized, the aperture ratio of each pixel PX can be increased. The first transparent electrode film and the second transparent electrode film are formed of a transparent electrode material (for example, indium tin oxide (ITO), indium zinc oxide (IZO), or the like). The first transparent electrode film constitutes the pixel electrode 20 and the like. The second transparent electrode film constitutes the common electrode 26 and the like. The alignment film is as described above.

The gate insulating film 27 and the interlayer insulating film 28 are formed of an inorganic material such as silicon nitride (SiNx) or silicon oxide ($SiO_2$). The gate insulating film 27 and the interlayer insulating film 28 have a film thickness which is substantially larger than those of the first transparent electrode film and the second transparent electrode film. The gate insulating film 27 maintains an insulated state between the first metal film on the lower layer side and the semiconductor film, the second metal film, and the first transparent electrode film on the upper layer side. For example, an intersection between the gate wiring line 21 constituted by the first metal film and the source wiring line 22 constituted by the second metal film is maintained in an insulated state by the gate insulating film 27. In addition, an overlapping point between the gate electrode 19A constituted by the first metal film and the island-shaped semiconductor portion 19D constituted by the semiconductor film is maintained in an insulated state by the gate insulating film 27. The interlayer insulating film 28 maintains an insulated state between the semiconductor film, the second metal film, and the first transparent electrode film on the lower layer side and the second transparent electrode film on the upper layer side. For example, an overlapping point between the pixel electrode 20 constituted by the first transparent electrode film and the common electrode 26 constituted by the second transparent electrode film is maintained in an insulated state by the interlayer insulating film 28. In addition, an overlapping point between the source wiring line 22 constituted by the second metal film and the common electrode 26 constituted by the second transparent electrode film is maintained in an insulated state by the interlayer insulating film 28. As described above, the semiconductor film, the second metal film, and the first transparent electrode film are interposed between the gate insulating film 27 on the lower layer side and the interlayer insulating film 28 on the upper layer side. Thus, portions overlapping each other in the components (the island-shaped semiconductor portion 19D, the source electrode 19B, the drain electrode 19C, the source wiring line 22, and the pixel electrode 20) which are constituted by the semiconductor film, the second metal film, and the first transparent electrode film are in direct contact with each other.

Next, the TFT 19 will be described with reference to FIG. 3 and FIG. 6. As illustrated in FIG. 3 and FIG. 6, the TFT 19 includes the gate electrode 19A. The gate electrode 19A is constituted by a portion of the gate wiring line 21 (an intersection with the source wiring line 22). Specifically, the gate wiring line 21 is widened such that an intersection between the gate wiring line 21 and the source wiring line 22 partially protrudes upward in FIG. 3 (toward the pixel electrode 20 side to which the TFT 19 is to be connected) in the Y-axis direction. The gate electrode 19A is constituted by a widened portion of the gate wiring line 21, and has a planar shape being a rectangular shape (substantially a square shape). The gate electrode 19A drives the TFT 19 based on a scanning signal supplied to the gate wiring line 21. The TFT 19 is disposed on the right side illustrated in FIG. 3 and FIG. 6 with respect to the source wiring line 22 to be connected.

Figure 6:
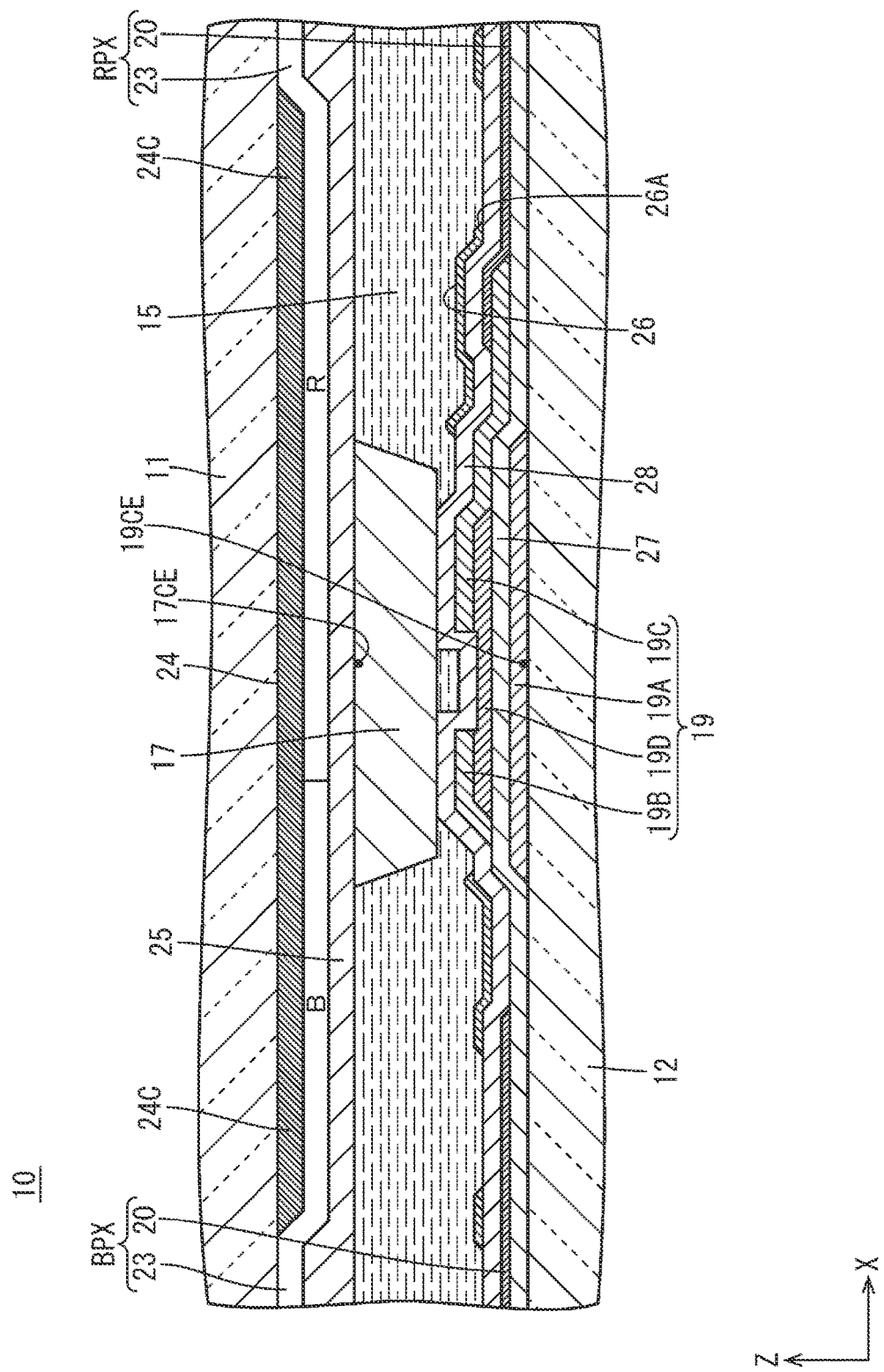

As illustrated in FIG. 3 and FIG. 6, the TFT 19 includes the source electrode 19B. The source electrode 19B is constituted by a portion of the source wiring line 22 to be connected (an intersection with the gate wiring line 21). Specifically, the source wiring line 22 is widened such that an intersection between the source wiring line 22 and the gate wiring line 21 partially protrudes rightward in FIG. 3 (toward the pixel electrode 20 side to which the TFT 19 is to be connected) in the X-axis direction. The source electrode 19B is constituted by a portion (including a non-widened portion and a widened portion) of the source wiring line 22 which overlaps the gate electrode 19A, and has a planar shape being a substantially L-shape. Substantially the entire region of the source electrode 19B overlaps a portion of the island-shaped semiconductor portion 19D including a channel portion, and is in contact with the island-shaped semiconductor portion 19D. Comparing with the drain electrode 19C to be described next, the source electrode 19B has a large area (a contact area, an overlapping area) in contact with the island-shaped semiconductor portion 19D.

As illustrated in FIG. 3 and FIG. 6, the TFT 19 includes the drain electrode 19C. The drain electrode 19C is disposed at a position spaced apart from the source electrode 19B in the X-axis direction. The drain electrode 19C is configured by connecting a horizontally long portion (semiconductor connection portion) that extends in the X-axis direction and has a rectangular shape which is horizontally long when viewed in a plan view and a vertically long portion (pixel connection portion) that extends in the Y-axis direction and has a rectangular shape which is vertically long when viewed in a plan view. In the horizontally long portion of the drain electrode 19C, a portion thereof is layered on the upper layer side of a portion of the semiconductor portion 19D and is in contact with the island-shaped semiconductor portion 19D. The horizontally long portion of the drain electrode 19C is disposed at a position diagonal to the corner of the source electrode 19B having a substantially L-shape when viewed in a plan view. The drain electrode 19C has a smaller area (a contact area, an overlapping area) in contact with the island-shaped semiconductor portion 19D than that of the source electrode 19B. In this manner, the TFT 19 according to the present embodiment has a left-right asymmetric shape when viewed in a plan view. In the vertically long portion of the drain electrode 19C, substantially the entire region thereof is layered on the lower layer side with respect to a portion of the pixel electrode 20 and is in contact with the pixel electrode 20.

As illustrated in FIG. 3 and FIG. 6, the TFT 19 includes the island-shaped semiconductor portion 19D including a channel portion. The island-shaped semiconductor portion 19D overlaps the gate electrode 19A through the gate insulating film 27. The island-shaped semiconductor portion 19D has a rectangular shape (substantially a square shape) which is one size smaller than the gate electrode 19A when viewed in a plan view. The island-shaped semiconductor portion 19D is positioned concentrically with the gate electrode 19A. Note that the term "concentric" or "concentrically" such as in the "concentrically with the gate electrode 19A" also includes being substantially concentric. For example, it is assumed that a difference of 0.1 µm or less indicates being substantially concentric. The center of each of the gate electrode 19A and the semiconductor portion 19D matches a center 19CE of the TFT 19 (indicated by a black circle in FIG. 3). Note that the term "match" such as in "matches a center 19CE of the TFT 19" also includes substantially matching. For example, it can be said that a difference of 0.1 µm or less is substantially matching. A substantially L-shaped portion of the island-shaped semiconductor portion 19D which overlaps the source electrode 19B is in contact with the source electrode 19B, and a rectangular portion thereof which overlaps the drain electrode 19C is in contact with the drain electrode 19C. A portion of the island-shaped semiconductor portion 19D which overlaps the gate electrode 19A but does not overlap the source electrode 19B and the drain electrode 19C is a channel portion that functions as a channel (current path). A portion of the island-shaped semiconductor portion 19D which overlaps the source electrode 19B and the drain electrode 19C is a portion that does not function as a channel.

Figure 7:
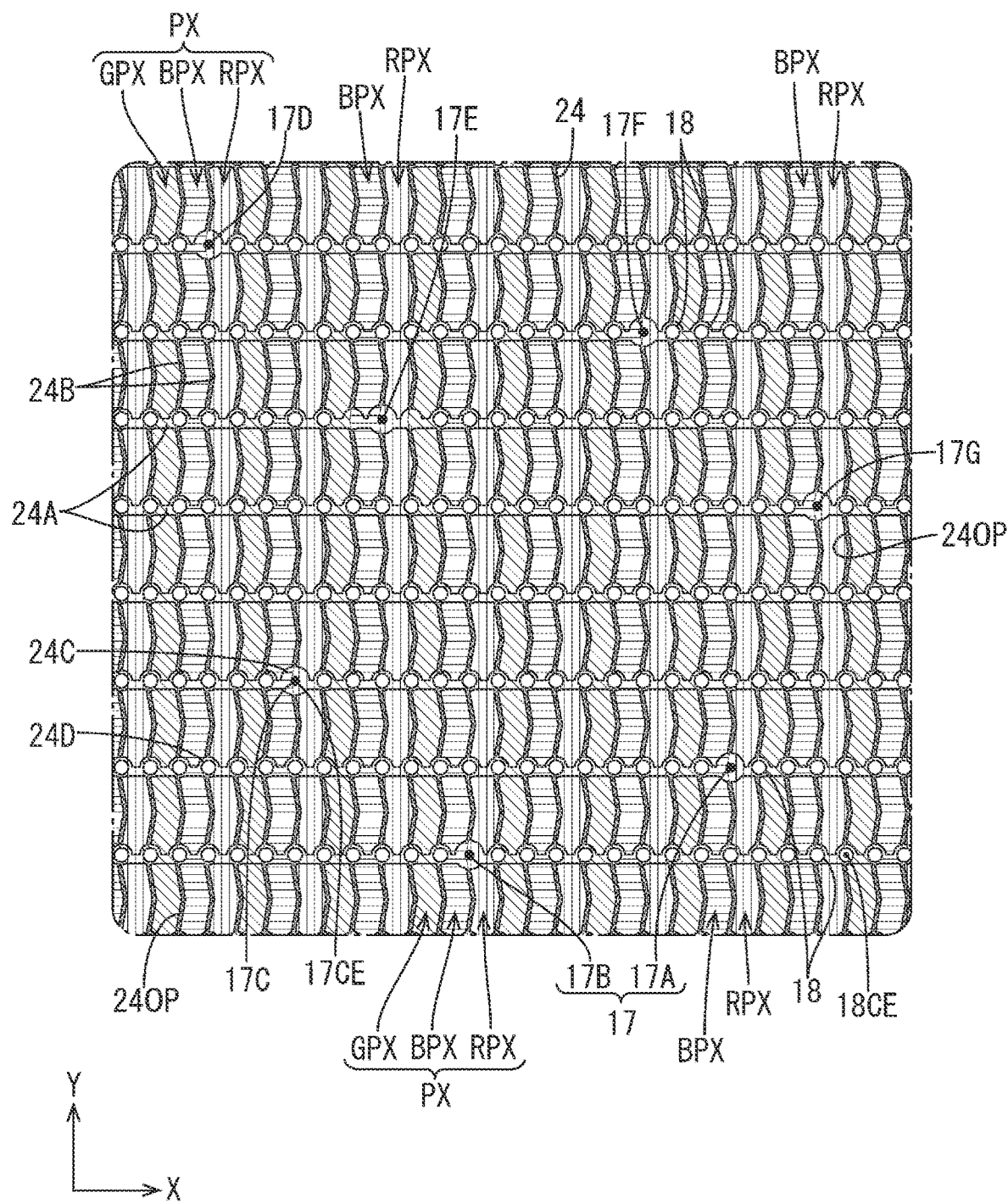
FIG. 7 is a plan view illustrating seven main spacers having different overlapping relationships with respect to a TFT being an overlapping target in the display region of the counter substrate.

Next, the main spacer 17 and the sub-spacer 18 will be described with reference to FIG. 4, FIG. 6, FIG. 7, and FIG. 8. Note that the main spacer 17 is illustrated in a black color in FIG. 7 so as to be distinguished from the sub-spacer 18. In addition, similarly to FIG. 4, the color filter 23 is illustrated in a shaded pattern which is different for each color in FIG. 7. As illustrated in FIG. 4 and FIG. 7, a plurality of the main spacers 17 and a plurality of the sub-spacers 18 are disposed to overlap most of intersections between the plurality of first light blocking portions 24A and the plurality of second light blocking portions 24B constituting the light blocking portion 24. As described above, the intersections between the first light blocking portions 24A and the second light blocking portions 24B match the intersections between the gate wiring lines 21 and the source wiring lines 22 of the array substrate 12. From this, both the main spacer 17 and the sub-spacer 18 are disposed to overlap the TFT 19. The plurality of main spacers 17 and the plurality of sub-spacers 18 are arranged at substantially equal pitches at intervals each corresponding to one pixel PX in the X-axis direction and the Y-axis direction. A predetermined number (for example, seven) of main spacers 17 are disposed to be dispersed in a predetermined range (a range in which 27 pixels PX are aligned in the X-axis direction, and nine pixels PX are aligned in the Y-axis direction) of the display region AA illustrated in FIG. 7. In the range illustrated in FIG. 7, the main spacers 17 are arranged such that two or more main spacers 17 are not aligned in either the X-axis direction or the Y-axis direction. In the range illustrated in FIG. 7, the sub-spacers 18 are disposed to overlap most of the intersections where the main spacers 17 are not disposed, among the intersections between the plurality of first light blocking portions 24A and the plurality of second light blocking portions 24B.

Figure 8:
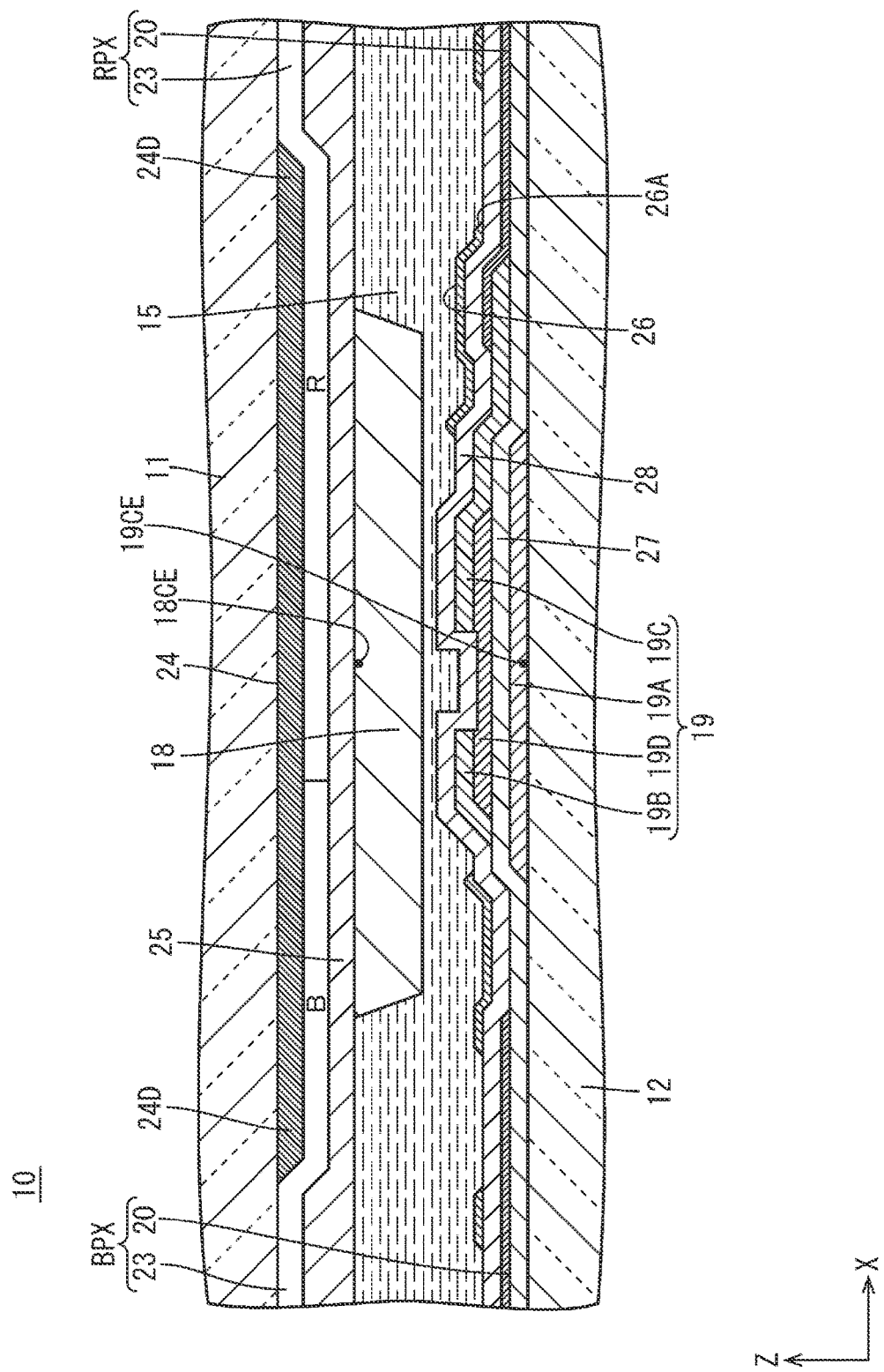

As illustrated in FIG. 4, FIG. 6, and FIG. 8, both the main spacer 17 and the sub-spacer 18 have a planar shape being a substantially circular shape and protrude toward the array substrate 12 side from the counter substrate 11. Specifically, the main spacer 17 and the sub-spacer 18 are formed of a resin material and protrude in the Z-axis direction (the normal direction of the plate surface of the counter substrate 11) toward the liquid crystal layer 15 side from the surface of the overcoat film 25 in the display region AA of the counter substrate 11, and protrusion tip end faces thereof face the inner surface of the array substrate 12. The main spacer 17 and the sub-spacer 18 have a slightly tapered cylindrical shape as a whole (see FIG. 6 and FIG. 8).

As illustrated in FIG. 4 and FIG. 6, the main spacer 17 has a small diameter dimension and a large protrusion dimension as compared to the sub-spacer 18. The diameter dimension of the main spacer 17 is, for example, 15.3 inn. The protrusion dimension of the main spacer 17 substantially matches an interval between the inner surfaces of the counter substrate 11 and the array substrate 12 that are bonded together. Thus, the main spacer 17 penetrates the liquid crystal layer 15, and the protrusion tip end face thereof is in contact with the inner surface (actually an alignment film) of the array substrate 12 at all times. In particular, the main spacer 17 is disposed to overlap the TFT 19, which is a part in which the inner surface of the array substrate 12 is highest, when viewed in a plan view, and thus the protrusion tip end face of the main spacer 17 is satisfactorily in contact with the inner surface of the array substrate 12. On the other hand, as illustrated in FIG. 4 and FIG. 8, the sub-spacer 18 has a large diameter dimension and a small protrusion dimension as compared to the main spacer 17. The protrusion dimension of the sub-spacer 18 is smaller than an interval between the inner surfaces of the counter substrate 11 and the array substrate 12 that are bonded together. Thus, the protrusion tip end face of the sub-spacer 18 is not always in contact with the inner surface of the array substrate 12. In a case where an external force for pressing any one of the counter substrate 11 and the array substrate 12 inward from the outside is not applied, a clearance is provided between the protrusion tip end face of the sub-spacer 18 and the inner surface of the array substrate 12. On the other hand, in a case where an external force for pressing any one of the counter substrate 11 and the array substrate 12 inward from the outside is applied, deflection (deformation) is allowed for any one of the counter substrate 11 and the array substrate 12 by the degree of clearance between the sub-spacer 18 and the inner surface of the array substrate 12. However, when any one of the counter substrate 11 and the array substrate 12 deflects to some extent, the protrusion tip end face of the sub-spacer 18 is brought into contact with the inner surface of the array substrate 12. Thereby, further bending of any one of the counter substrate 11 and the array substrate 12 is regulated. In this manner, an interval (cell gap) corresponding to the thickness of the liquid crystal layer 15 is maintained between the counter substrate 11 and the array substrate 12 by the main spacer 17 and the sub-spacer 18.

In the vicinity of the main spacer 17 and the sub-spacer 18 that are configured as described above, an alignment failure occurs in the liquid crystal molecules contained in the liquid crystal layer 15, and there is a concern that a display failure, such as a bright spot defect in which light is transmitted at all times due to an alignment failure, may occur. In particular, in the vicinity of the main spacer 17, the protrusion tip end face of the main spacer 17 rubs against the alignment film provided on the inner surface of the array substrate 12, which results in shavings of the alignment film, and a display failure such as a bright spot defect in which light is transmitted at all times tends to easily occur due to the shavings. In this regard, as illustrated in FIG. 4, the main spacer 17 and the sub-spacer 18 are disposed to overlap intersections between the first light blocking portions 24A and the second light blocking portions 24B constituting the light blocking portion 24. In addition, the light blocking portion 24 includes a third light blocking portion 24C and a fourth light blocking portion 24D that are disposed to surround the main spacer 17 and the sub-spacer 18, respectively. The third light blocking portion 24C and the fourth light blocking portion 24D are connected to the intersection between the first light blocking portion 24A and the second light blocking portion 24B. The pixel opening 240P has an opening range narrowed by the third light blocking portion 24C and the fourth light blocking portion 24D.

As illustrated in FIG. 4, the third light blocking portion 24C is disposed to surround the main spacer 17 and has a substantially fan shape that is concentric with the main spacer 17. Four third light blocking portions 24C are contiguous with each other at an intersection overlapping the main spacer 17, the intersection being between the first light blocking portion 24A and the second light blocking portion 24B. The four third light blocking portions 24C collectively have a substantially circular shape corresponding to the planar shape of the main spacer 17, and the diameter dimension thereof is larger than the diameter dimension of the main spacer 17. The diameter dimensions and the sum of the areas of the four third light blocking portions 24C is larger than the diameter dimensions and the sum of the areas of the four fourth light blocking portions 24D to be described below. Here, a range in which a display failure such as a bright spot defect in which light is transmitted at all times in the vicinity of the main spacer 17 occurs is likely to become wider than the range of a display failure occurring in the vicinity of the sub-spacer 18. A conceivable reason for this is that shavings of the alignment film are likely to be generated in the vicinity of the main spacer 17. In this regard, the four third light blocking portions 24C are provided in a range wider than the four fourth light blocking portions 24D as described above, and thus it is difficult to visually recognize a display failure caused by the main spacers 17. The four third light blocking portions 24C include a third light blocking portion 24C (the third light blocking portion 24C positioned on the upper right side in FIG. 4 with respect to a center 17CE of the main spacer 17) which overlaps a portion of the main spacer 17. Each of the four third light blocking portions 24C overlaps a portion (the vicinity of the corner portion) of the pixel electrode 20.

As illustrated in FIG. 4, the fourth light blocking portion 24D is disposed to surround the periphery of the sub-spacer 18 and has a substantially fan shape that is concentric with the sub-spacer 18. Four fourth light blocking portions 24D are contiguous with each other at an intersection overlapping the sub-spacers 18, the intersection being between the first light blocking portion 24A and the second light blocking portion 24B. The four fourth light blocking portions 24D collectively have a substantially circular shape corresponding to the planar shape of the sub-spacer 18, and the diameter dimension thereof is larger than the diameter dimension of the sub-spacer 18. The diameter dimensions and the sum of the areas of the four fourth light blocking portions 24D is smaller than the diameter dimensions and the sum of the areas of the four third light blocking portions 24C. The four fourth light blocking portions 24D include a fourth light blocking portion 24D (two fourth light blocking portions 24D positioned on the upper side in FIG. 4 with respect to a center 18CE of the sub-spacer 18) which overlaps a portion of the sub-spacer 18. The four fourth light blocking portions 24D include a fourth light blocking portion 24D (three fourth light blocking portions 24D except for the fourth light blocking portion 24D positioned on the lower left side in FIG. 4 with respect to the center 18CE of the sub-spacer 18) which overlaps a portion (the vicinity of a corner portion) of the pixel electrode 20. An overlapping area of the fourth light blocking portion 24D with respect to the pixel electrode 20 is substantially smaller than an overlapping area of the third light blocking portion 24C with respect to the pixel electrode 20. By blocking light in the vicinity of the main spacer 17 and the sub-spacer 18 by the light blocking portion 24 including the third light blocking portion 24C and the fourth light blocking portion 24D, it is difficult to visually recognize light leakage (display failure) caused by the main spacer 17 and the sub-spacer 18.

Further, as illustrated in FIG. 9 to FIG. 16, the plurality of main spacers 17 include a plurality of main spacers 17 having different overlapping relationships with the TFTs 19 being overlapping targets. The term "different overlapping relationships" as mentioned here means that the main spacer 17 overlaps the TFT 19 being an overlapping target in different ways. In other words, it means that a positional relationship between the center 17CE of the main spacer 17 and the center 19CE (the center of the island-shaped semiconductor portion 19D) of the TFT 19 being an overlapping target is different. Note that, as illustrated in FIG. 4, all of the sub-spacers 18 provided in the counter substrate 11 are disposed at positions where the respective centers 18CE thereof match the center 19CE of the TFT 19 being an overlapping target.

Figure 15:
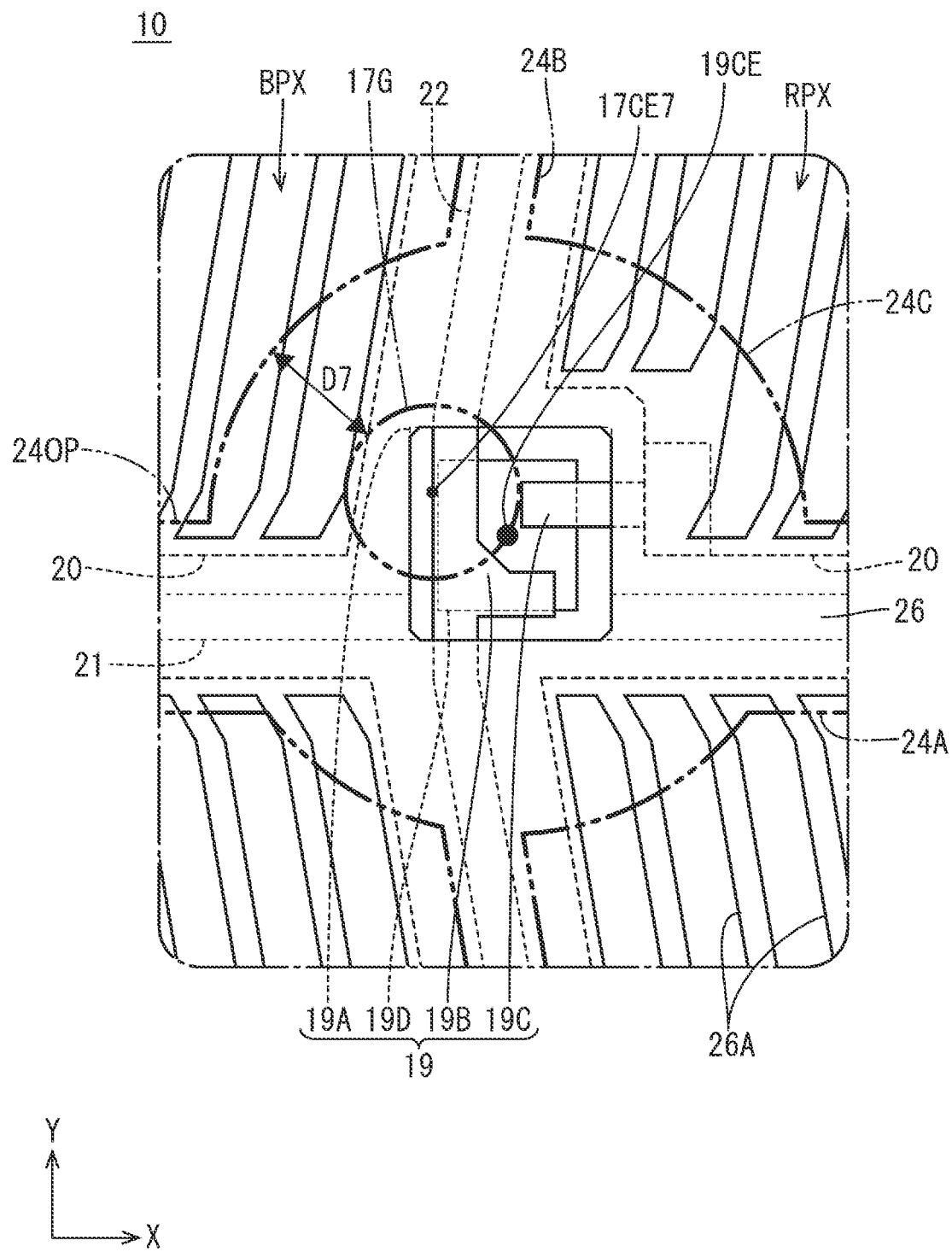
FIG. 15 is a plan view illustrating a positional relationship between a seventh main spacer, the TFT, and the light blocking portion in the display region of the liquid crystal panel.
Figure 16:
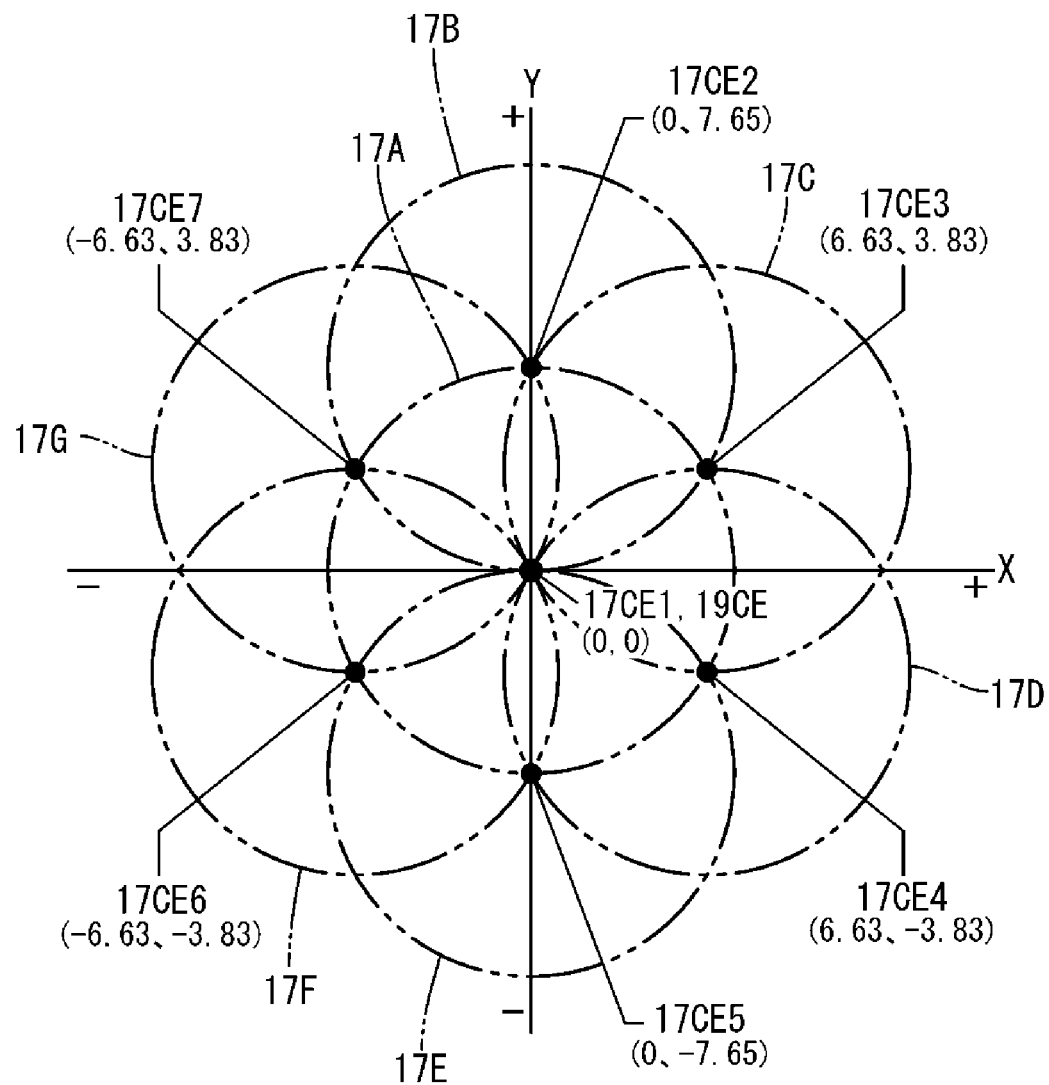
FIG. 16 is a graph showing centers of the seven main spacers having different overlapping relationships with respect to the TFT being an overlapping target, the centers being integrated into one coordinate system.

The range illustrated in FIG. 7 in the display region AA of the counter substrate 11 includes seven main spacers 17 having different overlapping relationships with the TFTs 19 being overlapping targets. All of the seven main spacers 17 illustrated in FIG. 7 have different overlapping relationships with the TFT 19. The seven main spacers 17 having different overlapping relationships include a first main spacer 17A illustrated in FIG. 9, a second main spacer 17B illustrated in FIG. 10, a third main spacer 17C illustrated in FIG. 11, a fourth main spacer 17D illustrated in FIG. 12, a fifth main spacer 17E illustrated in FIG. 13, a sixth main spacer 17F illustrated in FIG. 14, and a seventh main spacer 17G illustrated in FIG. 15. The seven main spacers 17A to 17G are disposed such that a plurality of main spacers are dispersed in the plane of the display region AA. A graph in which centers 17CE1 to 17CE7 of the seven main spacers 17A to 17G are collectively shown in one coordinate system is shown in FIG. 16. In the graph of FIG. 16, the center 19CE of the TFT 19 is set to be the origin (0, 0), and the unit of the coordinate system is 1 µm. In FIG. 16, the horizontal axis represents a position in the X-axis direction, and the vertical axis represents a position in the Y-axis direction. A sign (+) attached to the horizontal axis in FIG. 16 means that any one of the centers 17CE1 to 17CE7 of the respective main spacers 17A to 17G is positioned on the right side in each of FIG. 9 to FIG. 15 with respect to the center 19CE of the TFT 19. A sign (−) attached to the horizontal axis in FIG. 16 means that any one of the centers 17CE1 to 17CE7 of the respective main spacers 17A to 17G is positioned on the left side in each of FIG. 9 to FIG. 15 with respect to the center 19CE of the TFT 19. A sign (+) attached to the vertical axis in FIG. 16 means that any one of the centers 17CE1 to 17CE7 of the respective main spacers 17A to 17G is positioned on the upper side in each of FIG. 9 to FIG. 15 with respect to the center 19CE of the TFT 19. A sign (−) attached to the vertical axis in FIG. 16 means that any one of the centers 17CE1 to 17CE7 of the respective main spacers 17A to 17G is positioned on the lower side in each of FIG. 9 to FIG. 15 with respect to the center 19CE of the TFT 19.

Note that, in a case where the seven main spacers 17 having different overlapping relationships with the TFTs 19 being overlapping targets are distinguished from each other, a suffix "A" is appended to the reference numeral of the first main spacer, a suffix "B" is appended to the reference numeral of the second main spacer, a suffix "C" is appended to the reference numeral of the third main spacer, a suffix "D" is appended to the reference numeral of the fourth main spacer, a suffix "E" is appended to the reference numeral of the fifth main spacer, a suffix "F" is appended to the reference numeral of the sixth main spacer, and a suffix "G" is appended to the reference numeral of the seventh main spacer, and in a case where the seven main spacers 17 are collectively referred to without distinction, no suffix is appended to the reference numerals. Further, in a case where the centers 17CE of the seven main spacers 17 having different overlapping relationships with the TFTs 19 being overlapping targets are distinguished from each other, a suffix "1" is appended to the reference numeral of the center of the first main spacer 17A, a suffix "2" is appended to the reference numeral of the center of the second main spacer 17B, a suffix "3" is appended to the reference numeral of the center of the third main spacer 17C, a suffix "4" is appended to the reference numeral of the center of the fourth main spacer 17D, a suffix "5" is appended to the reference numeral of the center of the fifth main spacer 17E, a suffix "6" is appended to the reference numeral of the center of the sixth main spacer 17F, and a suffix "7" is appended to the reference numeral of the center of the seventh main spacer 17G, and in a case where the centers 17CE are collectively referred to without distinction, no suffix is appended to the reference numerals.

Figure 9:
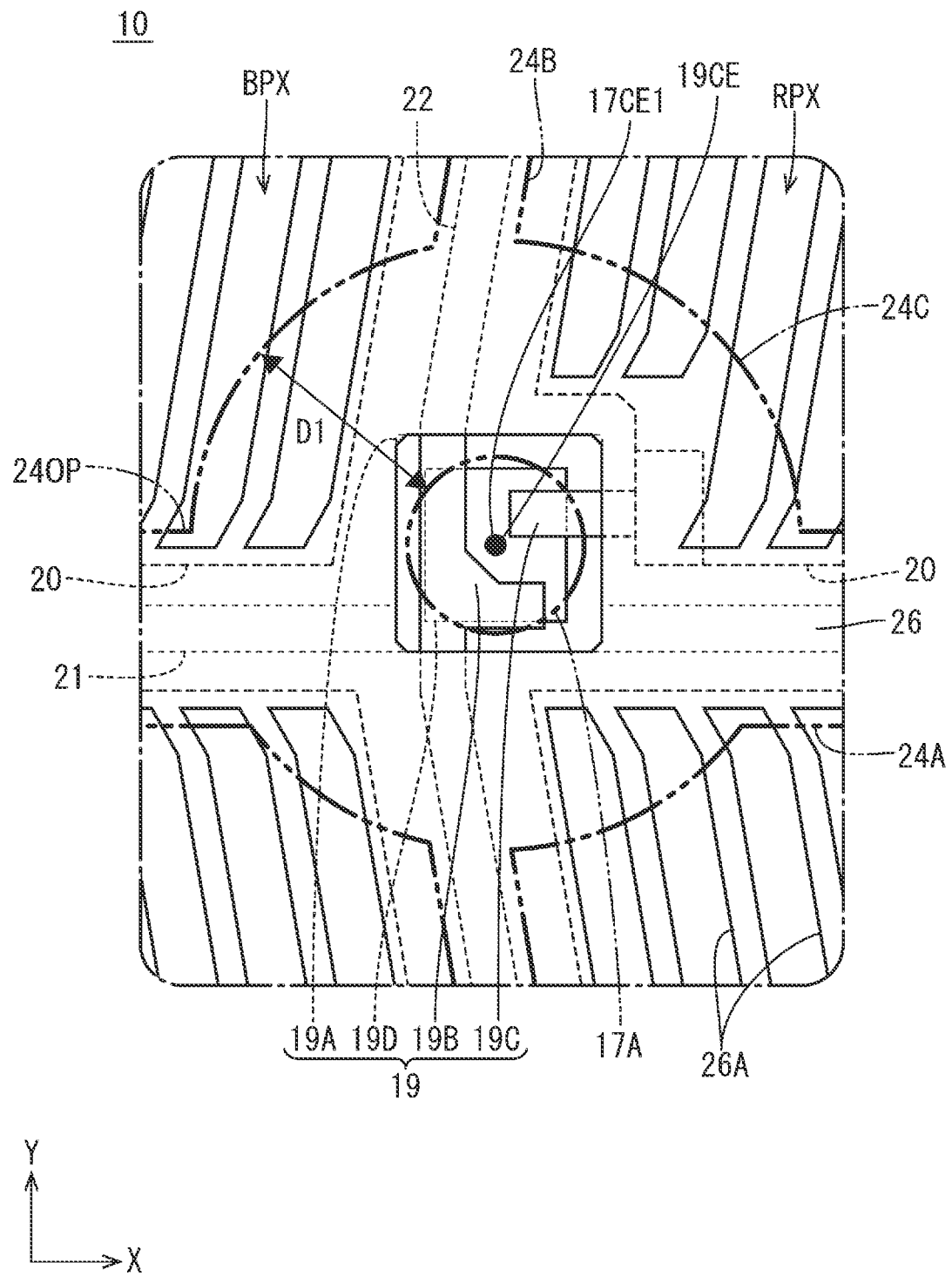
FIG. 9 is a plan view illustrating a positional relationship between a first main spacer, a TFT, and a light blocking portion in the display region of the liquid crystal panel.

As illustrated in FIG. 9, the first main spacer 17A is disposed at a position where the center 17CE1 matches the center 19CE of the TFT 19 being an overlapping target. That is, it can be said that the first main spacer 17A constitutes a "concentric spacer" disposed concentrically with the TFT 19 being an overlapping target. Thus, the coordinate value of the center 17CE1 of the first main spacer 17A shown in FIG. 16 is (0, 0), which matches the origin of the coordinate system.

On the other hand, as illustrated in FIG. 10 to FIG. 15, the second main spacer 17B, the third main spacer 17C, the fourth main spacer 17D, the fifth main spacer 17E, the sixth main spacer 17F, and the seventh main spacer 17G are disposed at positions where the respective centers 17CE2 to 17CE7 thereof do not match the center 19CE of the TFT 19 being an overlapping target. That is, it can be said that the second main spacer 17B, the third main spacer 17C, the fourth main spacer 17D, the fifth main spacer 17E, the sixth main spacer 17F, and the seventh main spacer 17G constitute a "non-concentric spacer" which is disposed non-concentrically with the TFT 19 being an overlapping target. In other words, it can be said that the second main spacer 17B, the third main spacer 17C, the fourth main spacer 17D, the fifth main spacer 17E, the sixth main spacer 17F, and the seventh main spacer 17G constitute an "unevenly distributed spacer" in which the centers 17CE2 to 17CE7 are unevenly distributed with respect to the center 19CE of the TFT 19 being an overlapping target.

Figure 10:
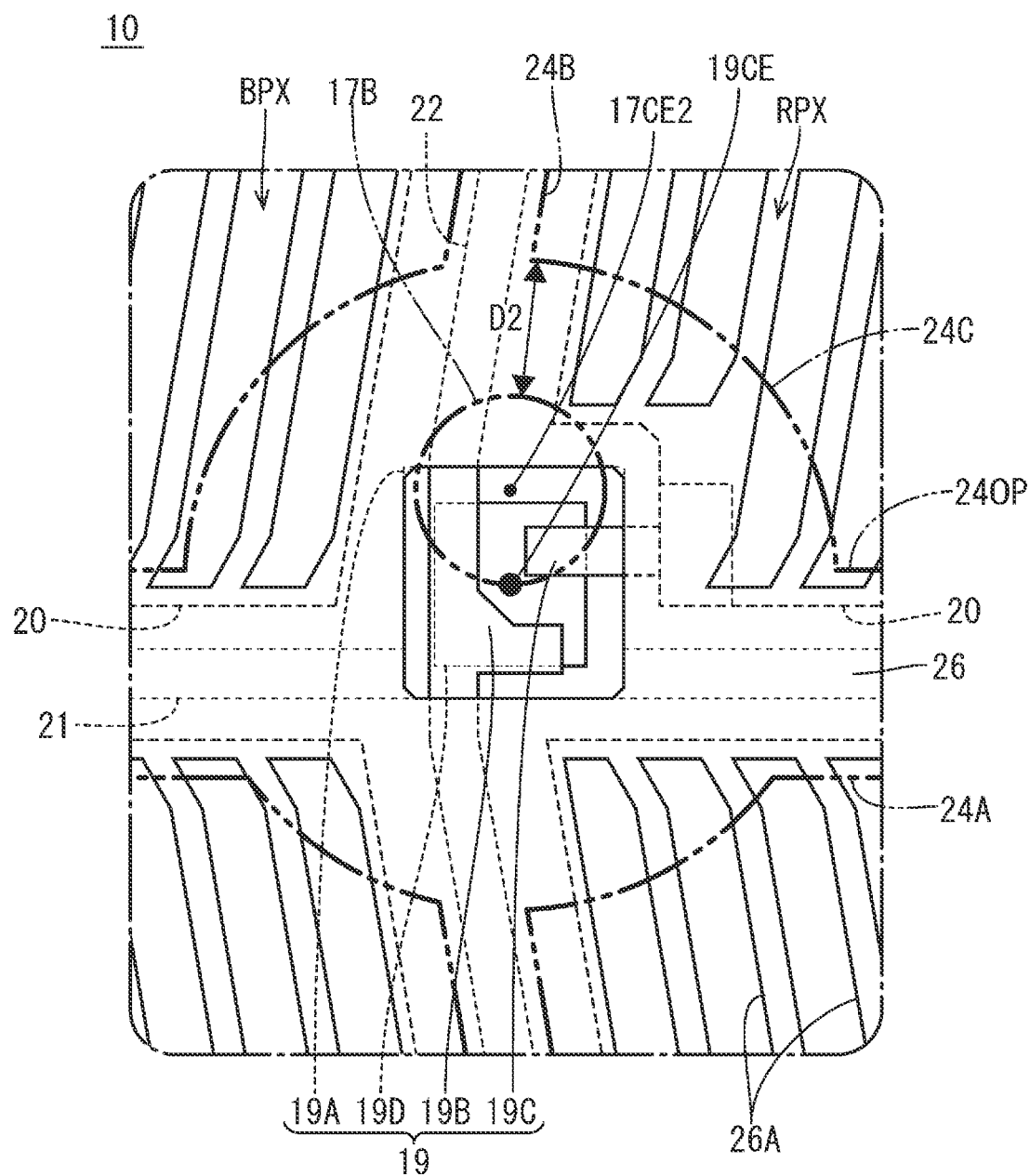
FIG. 10 is a plan view illustrating a positional relationship between a second main spacer, the TFT, and the light blocking portion in the display region of the liquid crystal panel.
Figure 11:
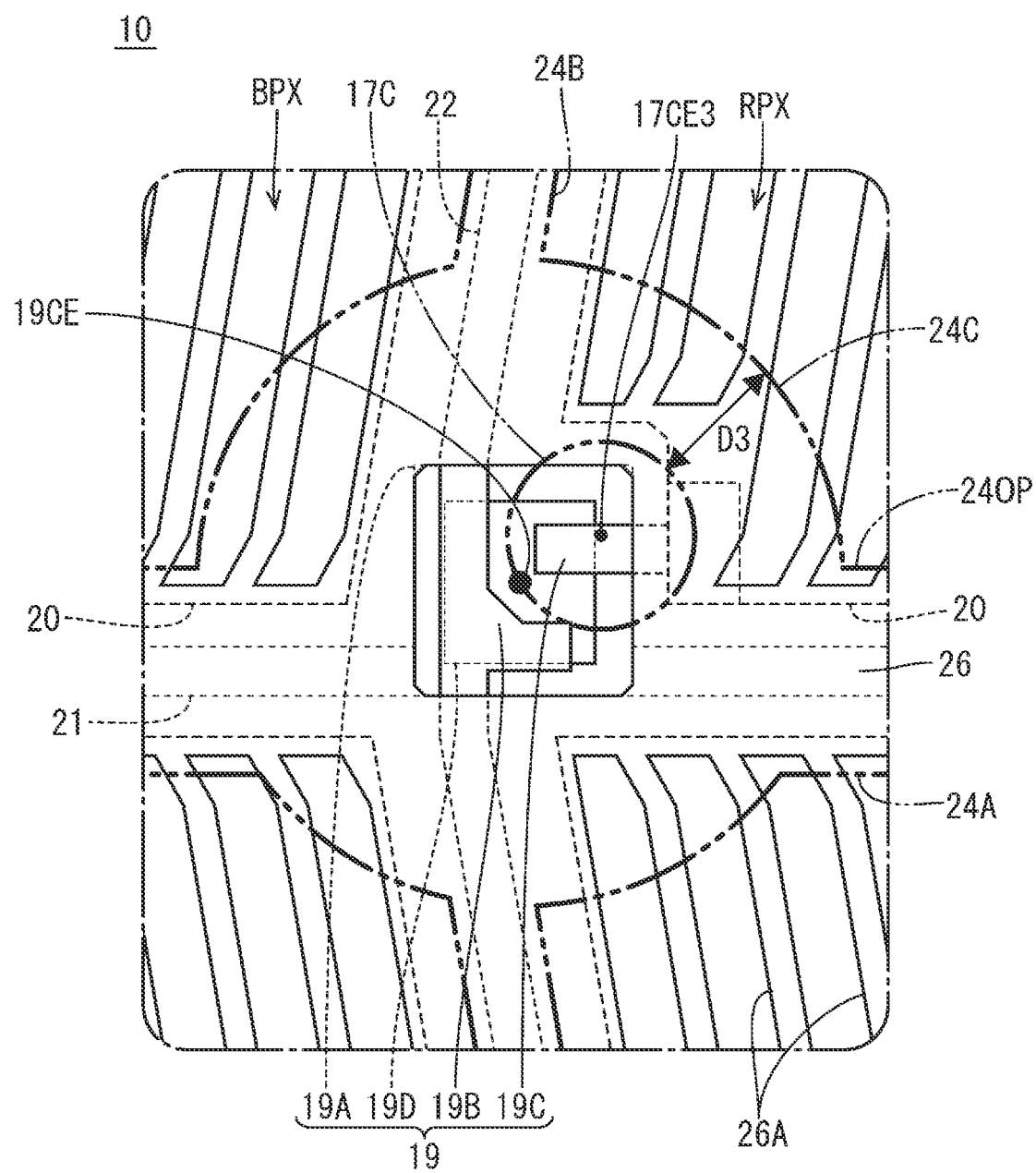
FIG. 11 is a plan view illustrating a positional relationship between a third main spacer, the TFT, and the light blocking portion in the display region of the liquid crystal panel.
Figure 12:
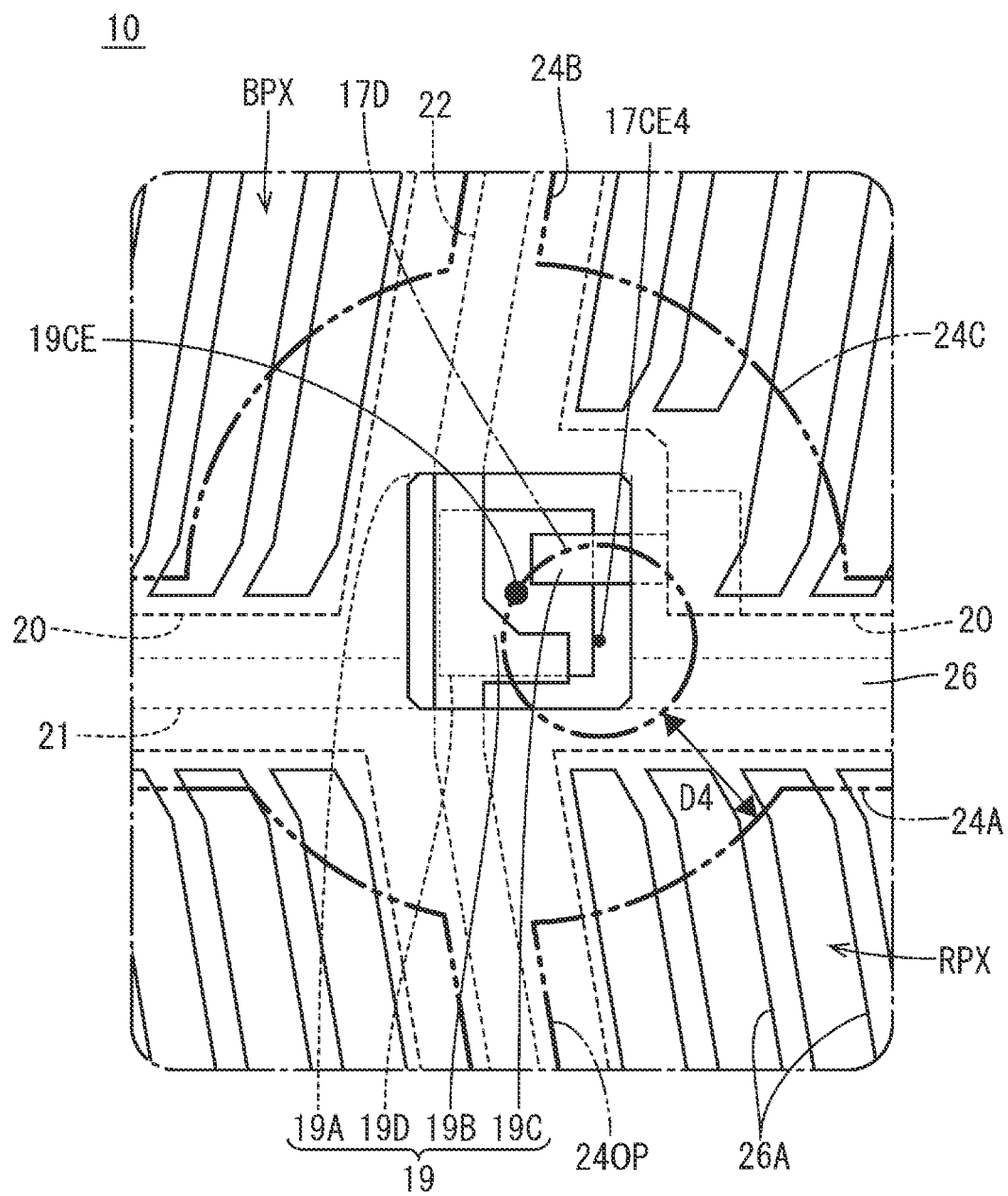
FIG. 12 is a plan view illustrating a positional relationship between a fourth main spacer, the TFT, and the light blocking portion in the display region of the liquid crystal panel.
Figure 13:
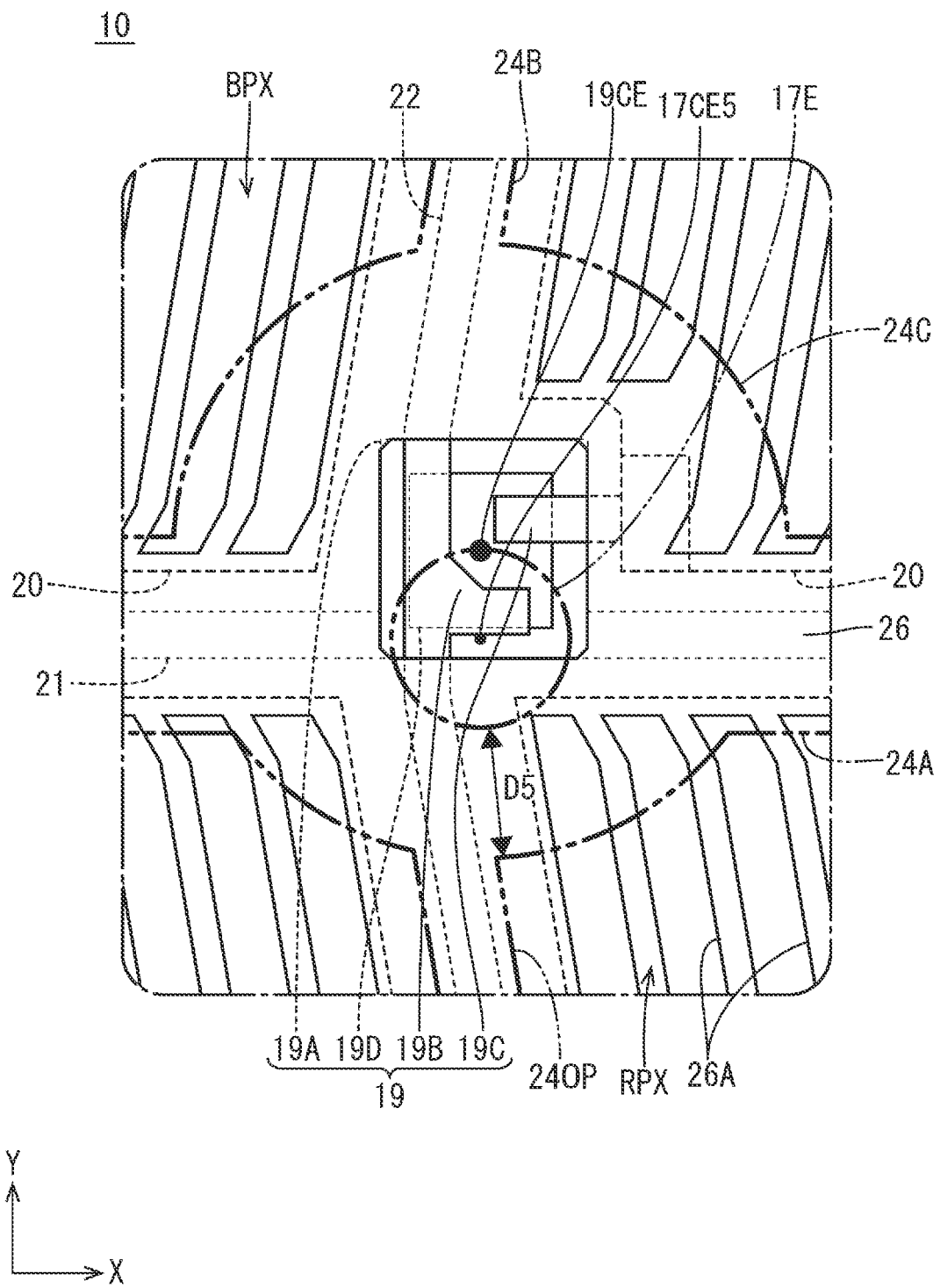
FIG. 13 is a plan view illustrating a positional relationship between a fifth main spacer, the TFT, and the light blocking portion in the display region of the liquid crystal panel.
Figure 14:
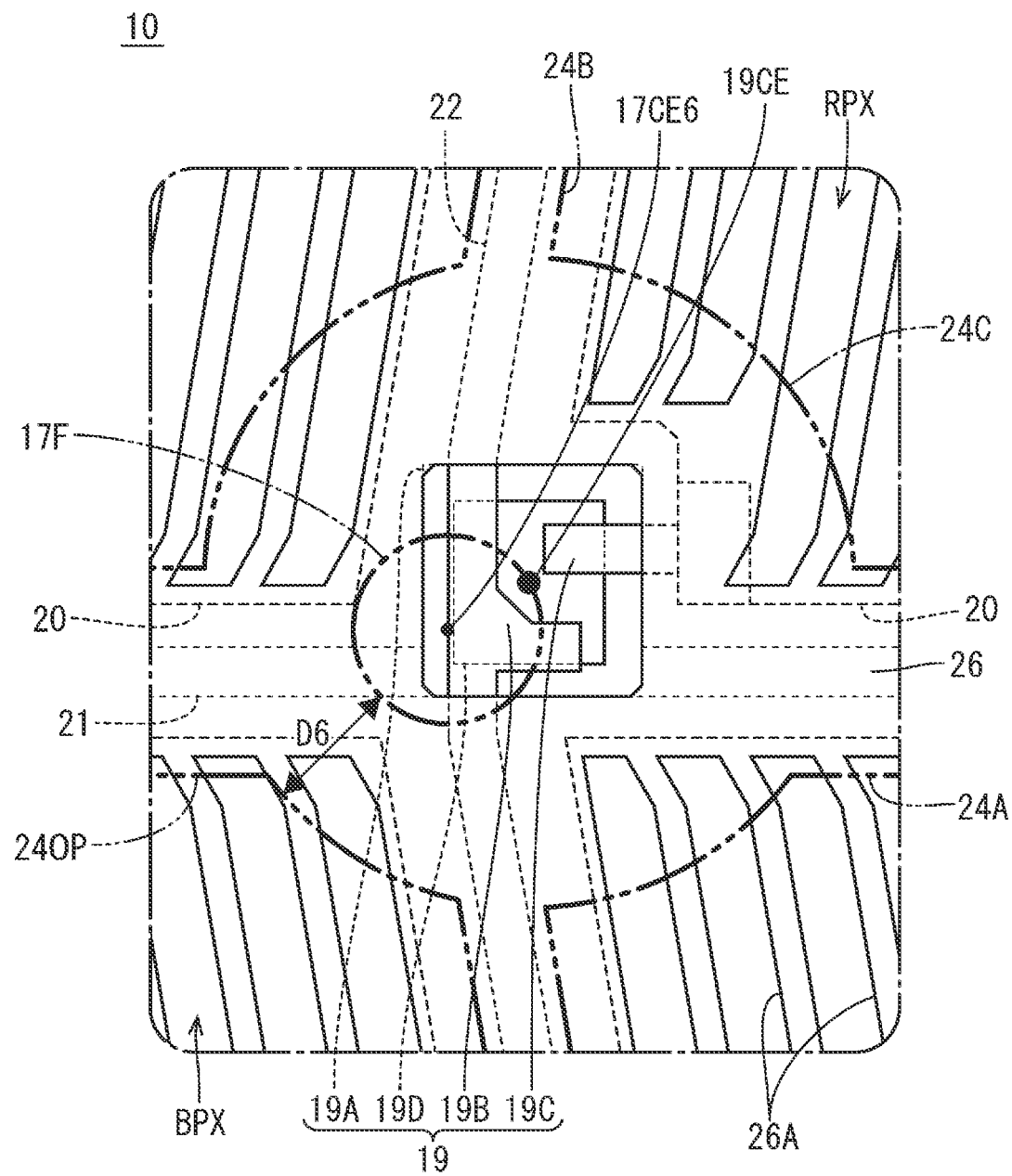
FIG. 14 is a plan view illustrating a positional relationship between a sixth main spacer, the TFT, and the light blocking portion in the display region of the liquid crystal panel.

As illustrated in FIG. 10, in the second main spacer 17B, the center 17CE2 thereof deviates upward in FIG. 10 with respect to the center 19CE of the TFT 19 being an overlapping target. The coordinate value of the center 17CE2 of the second main spacer 17B shown in FIG. 16 is (0, 7.65). As illustrated in FIG. 11, in the third main spacer 17C, the center 17CE3 thereof deviates upward in an obliquely right direction in FIG. 10 with respect to the center 19CE of the TFT 19 being an overlapping target. The coordinate value of the center 17CE3 of the third main spacer 17C shown in FIG. 16 is (6.63, 3.83). As illustrated in FIG. 12, in the fourth main spacer 17D, the center 17CE4 thereof deviates downward in an obliquely right direction in FIG. 10 with respect to the center 19CE of the TFT 19 being an overlapping target. A coordinate value of the center 17CE4 of the fourth main spacer 17D shown in FIG. 16 is (6.63, −3.83). As illustrated in FIG. 13, in the fifth main spacer 17E, the center 17CE5 thereof deviates downward in FIG. 10 with respect to the center 19CE of the TFT 19 being an overlapping target. The coordinate value of the center 17CE5 of the fifth main spacer 17E shown in FIG. 16 is (0, −7.65). As illustrated in FIG. 14, in the sixth main spacer 17F, the center 17CE6 thereof deviates downward in an obliquely left direction in FIG. 10 with respect to the center 19CE of the TFT 19 being an overlapping target. The coordinate value of the center 17CE6 of the sixth main spacer 17F shown in FIG. 16 is (−6.63, −3.83). As illustrated in FIG. 15, in the seventh main spacer 17G, the center 17CE7 thereof deviates upward in an obliquely left direction in FIG. 10 with respect to the center 19CE of the TFT 19 being an overlapping target. The coordinate value of the center 17CE7 of the seventh main spacer 17G shown in FIG. 16 is (−6.63, 3.83). In the second main spacer 17B, the third main spacer 17C, the fourth main spacer 17D, the fifth main spacer 17E, the sixth main spacer 17F, and the seventh main spacer 17G, the centers 17CE2 to 17CE7 are positioned slightly further outside than the outer end of the island-shaped semiconductor portion 19D of the TFT 19 as illustrated in FIG. 10 to FIG. 15.

Distances when viewed in a plan view between the centers 17CE2 to 17CE7 of the second main spacer 17B, the third main spacer 17C, the fourth main spacer 17D, the fifth main spacer 17E, the sixth main spacer 17F, and the seventh main spacer 17G and the center 19CE (the origin in FIG. 16) of the TFT 19 being an overlapping target are all substantially equal, as shown in FIG. 16. The values of the distances are substantially equal to the diameter dimension of the main spacer 17. Thus, the outer ends of the second main spacer 17B, the third main spacer 17C, the fourth main spacer 17D, the fifth main spacer 17E, the sixth main spacer 17F, and the seventh main spacer 17G are disposed to overlap the center 19CE of the TFT 19 being an overlapping target. In addition, the centers 17CE2 to 17CE7 of the second main spacer 17B, the third main spacer 17C, the fourth main spacer 17D, the fifth main spacer 17E, the sixth main spacer 17F, and seventh main spacer 17G are positioned on the outer end of the first main spacer 17A. In addition, the second main spacer 17B, the third main spacer 17C, the fourth main spacer 17D, the fifth main spacer 17E, the sixth main spacer 17F, and the seventh main spacer 17G are disposed at positions that are concentric with vertexes of a regular hexagon that is concentric with the center 19CE of the TFT 19 being an overlapping target. Thus, the centers 17CE2 to 17CE7 of the second main spacer 17B, the third main spacer 17C, the fourth main spacer 17D, the fifth main spacer 17E, the sixth main spacer 17F, and the seventh main spacer 17G are disposed side by side at equal angular intervals (angular intervals of 60 degrees) around the center 19CE of the TFT 19 being an overlapping target.

In this manner, the plurality of main spacers 17 include the seven main spacers 17A to 17G having different overlapping relationships with the TFTs 19 being overlapping targets, and thus contact areas between the seven main spacers 17A to 17G and the array substrate 12 are not likely to fluctuate even when a positional deviation occurs at the time of bonding the array substrate 12 and the counter substrate 11 together. Thereby, an interval between the array substrate 12 and the counter substrate 11 is maintained more satisfactorily. Further, in the second main spacer 17B, the third main spacer 17C, the fourth main spacer 17D, the fifth main spacer 17E, the sixth main spacer 17F, and the seventh main spacer 17G, distances between the centers 17CE2 to 17CE7 and the center 19CE of the TFT 19 being an overlapping target are equal to each other. In this manner, in a case where a positional deviation occurs at the time of bonding the array substrate 12 and the counter substrate 11 together, the sum of overlapping areas between the main spacers 17B to 17G described above and the plurality of TFTs 19 being overlapping targets is less likely to fluctuate. Thereby, an interval between the array substrate 12 and the counter substrate 11 is maintained more satisfactorily. Further, the second main spacer 17B, the third main spacer 17C, the fourth main spacer 17D, the fifth main spacer 17E, the sixth main spacer 17F, and the seventh main spacer 17G are arranged at equal angular intervals around the center 19CE of the TFT 19 being an overlapping target. Thereby, the sum of overlapping areas between the main spacers 17B to 17G described above and the plurality of TFTs 19 being overlapping targets is less likely to fluctuate regardless of the direction of the positional deviation that may occur at the time of bonding the array substrate 12 and the counter substrate 11 together. Thereby, an interval between the array substrate 12 and the counter substrate 11 is maintained more satisfactorily.

As described above, an overlapping target of each of the seven main spacers 17A to 17G having different overlapping relationships is the TFT 19 which is closest to a boundary between the blue pixel BPX and the red pixel RPX as illustrated in FIG. 3, FIG. 4, and FIG. 7. The source wiring line 22 is disposed to overlap the boundary between the blue pixel BPX and the red pixel RPX, and the source wiring line 22 is provided with the source electrode 19B of the TFT 19 connected to the pixel electrode 20 constituting the red pixel RPX. Thus, the TFT 19 closest to the boundary between the blue pixel BPX and the red pixel RPX is the TFT 19 connected to the pixel electrode 20 constituting the red pixel RPX. The seven main spacers 17A to 17G having different overlapping relationships are all disposed to overlap the TFT 19 connected to the pixel electrode 20 constituting the red pixel RPX. Here, the third light blocking portion 24C having an area larger than that of the fourth light blocking portion 24D is provided in the vicinity of the main spacer 17, and thus a display failure due to the main spacer 17 is not likely to be visually recognized, but there is a possibility that the display with the pixel PX in the vicinity of the main spacer 17 will be adversely affected in some cases. In this regard, an overlapping target of each of the seven main spacers 17A to 17G having different overlapping relationships is the TFT 19 which is closest to the boundary between the blue pixel BPX and the red pixel RPX. Thereby, in the vicinity of each of the seven main spacers 17A to 17G having different overlapping relationships, there are blue pixels BPX and red pixels RPX having relative luminous efficiency lower than that of the green pixel GPX, and thus a little effect is exerted on the overall display quality even when the display with the blue pixel BPX and the red pixel RPX is adversely affected. In addition, the display with the green pixel GPX having the highest relative luminous efficiency is not likely to be adversely affected by the main spacers 17A to 17G, and thus the overall display quality can be maintained satisfactorily.

Next, shortest distances D1 to D7 when viewed in a plan view between the main spacers 17A to 17G and opening edges of two pixel openings 240P overlapping the pixel electrode 20 of the blue pixel BPX and the pixel electrode 20 of the red pixel RPX that sandwich the boundary closest to the TFT 19 being an overlapping target will be described. As illustrated in FIG. 9 to FIG. 15, the shortest distance D1 related to the first main spacer 17A is larger than the shortest distances D2 to D7 related to the other six main spacers 17B to 17G. In this manner, as compared to the other six main spacers 17B to 17G, a little adverse effect is exerted on the display with the blue pixel BPX and the red pixel RPX that sandwich the boundary closest to the TFT 19 overlapping the first main spacer 17A. Thereby, the display quality is maintained more satisfactorily.

On the other hand, the shortest distances D2 to D7 related to the six main spacers 17B to 17G, which are disposed at positions that are not concentric with the center 19CE of the TFT 19 being an overlapping target, are equal to each other. The shortest distances D2 to D7 related to the six main spacers 17B to 17G are, for example, 11.3 μm or the like. The difference between the shortest distance D1 related to the first main spacer 17A and the shortest distances D2 to D7 related to the other six main spacers 17B to 17G is substantially equal to the distance when viewed in a plan view between the centers 17CE2 to 17CE7 of the other six main spacers 17B to 17G and the center 17CE1 of the first main spacer 17A (the center 19CE of the TFT 19 being an overlapping target). The display with two pixels, that is, the blue pixel BPX and the red pixel RPX that sandwich a boundary closest to each of the TFTs 19 respectively overlapping the six main spacers 17B to 17G having the above-described shortest distances D2 to D7 being equal to each other is adversely affected by the main spacers 17B to 17G, but the degrees of the effects are equivalent to each other. Thereby, the display quality is maintained more satisfactorily. In addition, the six main spacers 17B to 17G having the shortest distances D2 to D7 being equal to each other are disposed to overlap the center 19CE of the TFT 19 being an overlapping target. In this manner, the six main spacers 17B to 17G having the shortest distance D2 to D7 being equal to each other are avoided being excessively separated from the center 19CE of the TFT 19 being an overlapping target and excessively approaching the opening edge of the pixel opening 240P. Thereby, a little adverse effect is exerted on the display with the blue pixel BPX and the red pixel RPX that sandwich the boundary closest to each of the TFTs 19 overlapping the six main spacers 17B to 17G having the shortest distances D2 to D7 being equal to each other. Thereby, the display quality is maintained more satisfactorily. Note that the term "equal" or "concentric" such as in "the shortest distances D2 to D7 are equal" also include being substantially equal and being substantially concentric. For example, it is assumed that a difference of 0.1 μm or less indicates being substantially equal (substantially concentric with each other).

In addition, as illustrated in FIG. 9 to FIG. 15, four third light blocking portions 24C surrounding each of the seven main spacers 17A to 17G having different overlapping relationships have the same planar shape and area. Thus, the seven pixel openings 240P overlapping the pixel electrodes 20 of the seven blue pixels BPX positioned obliquely on the upper left side illustrated in FIG. 9 to FIG. 15 with respect to the main spacers 17A to 17G have the same planar shape. In this manner, the aperture ratios of the seven blue pixels BPX described above are equal to each other, and thus the amount of light emitted from the blue pixels BPX is less likely to vary. Similarly, the seven pixel openings 240P overlapping the pixel electrodes 20 of the seven blue pixels BPX positioned obliquely on the lower left side illustrated in FIG. 9 to FIG. 15 with respect to the main spacers 17A to 17G have the same planar shape. In this manner, the aperture ratios of the seven blue pixels BPX described above are equal to each other, and thus the amount of light emitted from the blue pixels BPX is less likely to vary. The seven pixel openings 240P overlapping the pixel electrodes 20 of the seven red pixels RPX positioned obliquely on the upper right side illustrated in FIG. 9 to FIG. 15 with respect to the main spacers 17A to 17G have the same planar shape. In this manner, the aperture ratios of the seven red pixels RPX described above are equal to each other, and thus the amount of light emitted from the red pixels RPX is less likely to vary. The seven pixel openings 240P overlapping the pixel electrodes 20 of the seven red pixels RPX positioned obliquely on the lower right side illustrated in FIG. 9 to FIG. 15 with respect to the main spacers 17A to 17G have the same planar shape. In this manner, the aperture ratios of the seven red pixels RPX described above are equal to each other, and thus the amount of light emitted from the red pixels RPX is less likely to vary. As described above, the display quality is maintained more satisfactorily.

As described above, the liquid crystal panel (display device) 10 according to the present embodiment includes the array substrate 12, the counter substrate 11 that faces the array substrate 12 at an interval therebetween, the plurality of color filters 23 that are provided in the array substrate 12 or the counter substrate 11 and exhibit different colors, the plurality of pixel electrodes 20 that are provided in the array substrate 12 and overlap the plurality of color filters 23, the plurality of pixels PX that are constituted by the plurality of color filters 23 and the plurality of pixel electrodes 20 and have different relative luminous efficiency, the plurality of thin film transistors (TFTs) 19 that are provided in the array substrate 12 and respectively connected to the plurality of pixel electrodes 20, and the plurality of main spacers (spacers) 17 that are provided in a least the counter substrate 11, protrude toward the array substrate 12 from the counter substrate 11, and are disposed to overlap at least some of the plurality of TFTs 19. The plurality of pixels PX include the plurality of green pixels (first pixels) GPX having the highest relative luminous efficiency, the plurality of blue pixels (second pixels) BPX having the lowest relative luminous efficiency, and the plurality of red pixels (third pixels) RPX that are disposed adjacent to the blue pixels BPX and each of which has relative luminous efficiency lower than the relative luminous efficiency of the green pixel GPX and higher than the relative luminous efficiency of the blue pixel BPX. The plurality of main spacers 17 include the plurality of main spacers 17 having different overlapping relationships with the TFTs 19 being overlapping targets, and an overlapping target of each of the plurality of main spacers 17A to 17G having different overlapping relationships is the TFT 19 closest to a boundary between the blue pixel BPX and the red pixel RPX.

When the plurality of TFTs 19 are driven, the plurality of pixel electrodes 20 connected are charged, and an image is displayed. An interval between the array substrate 12 and the counter substrate 11 is maintained by the plurality of main spacers 17 interposed therebetween. Here, as compared to other structures, the TFT 19 has a large number of films layered and is a part having a large height (thickness), and thus an interval between the array substrate 12 and the counter substrate 11 is maintained satisfactorily by the main spacers 17 being disposed to overlap at least some of the TFTs 19. The plurality of main spacers 17 include the plurality of main spacers 17A to 17G having different overlapping relationships with the TFTs 19 being overlapping targets. Thereby, even in a case where a positional deviation has occurred at the time of bonding the array substrate 12 and the counter substrate 11 together, contact areas between the plurality of main spacers 17A to 17G and the array substrate 12 are not likely to fluctuate, and an interval between the array substrate 12 and the counter substrate 11 is maintained more satisfactorily.

In a case where a display failure such as bright spot defects, which are constantly transmitting light in the vicinity of the above-described plurality of main spacers 17A to 17G having different overlapping relationships occurs, there is a tendency for the display on the pixels PX present in the plurality of main spacers 17A to 17G having different overlapping relationships to be adversely affected. In this regard, an overlapping target of each of the plurality of main spacers 17A to 17G having different overlapping relationships is the TFT 19 closest to a boundary between the blue pixel BPX and the red pixel RPX. Thereby, in the vicinity of each of the plurality of main spacers 17A to 17G having different overlapping relationships, there are blue pixels BPX and red pixels RPX having relative luminous efficiency lower than that of the green pixel GPX, and thus a little effect is exerted on the overall display quality even when the display with the blue pixel BPX and the red pixel RPX is adversely affected. In addition, the display with the green pixel GPX having the highest relative luminous efficiency is not likely to be adversely affected by the main spacers 17A to 17G, and thus the overall display quality can be maintained satisfactorily.

Further, the counter substrate 11 includes the plurality of pixel openings 240P that overlap the plurality of pixel electrodes 20, respectively, and includes the light blocking portion 24 disposed to overlap the plurality of main spacers 17. The plurality of main spacers 17A to 17G having different overlapping relationships include the plurality of main spacers 17B to 17G having the shortest distances D2 to D7 being equal to each other, the shortest distances being distances from the opening edges of two pixel openings 240P overlapping the pixel electrode 20 of the blue pixel BPX and the pixel electrode 20 of the red pixel RPX that sandwich a boundary closest to the TFT 19 being an overlapping target. The display with two pixels, that is, the blue pixel BPX and the red pixel RPX that sandwich a boundary closest to each of the TFTs 19 respectively overlapping the plurality of main spacers 17B to 17G having the above-described shortest distances D2 to D7 being equal to each other is adversely affected by the main spacers 17B to 17G, but the degrees of the effects are equivalent to each other. Thereby, the display quality is maintained more satisfactorily.

Further, in the plurality of main spacers 17B to 17G having the shortest distances D2 to D7 being equal to each other, distances between the centers 17CE2 to 17CE7 of the main spacers 17B to 17G and the center 19CE of the TFT 19 being an overlapping target are equal to each other. In this manner, in a case where a positional deviation has occurred at the time of bonding the array substrate 12 and the counter substrate 11 together, the sum of overlapping areas between the plurality of main spacers 17B to 17G having the above-described shortest distances D2 to D7 being equal to each other and the plurality of TFTs 19 being overlapping targets is less likely to fluctuate. Thereby, an interval between the array substrate 12 and the counter substrate 11 is maintained more satisfactorily.

Additionally, the plurality of main spacers 17B to 17G having the shortest distances D2 to D7 being equal to each other are disposed at positions that are concentric with vertexes of a regular polygon that is concentric with the center 19CE of the TFT 19 being an overlapping target. In this manner, the plurality of main spacers 17B to 17G having the above-described shortest distances D2 to D7 being equal to each other are arranged at equal angular intervals around the center 19CE of the TFT 19 being an overlapping target. Thereby, the sum of overlapping areas between the plurality of main spacers 17B to 17G having the above-described shortest distances D2 to D7 being equal to each other and the plurality of TFTs 19 being overlapping targets is less likely to fluctuate regardless of the direction of the positional deviation that may occur at the time of bonding the array substrate 12 and the counter substrate 11 together. Thereby, an interval between the array substrate 12 and the counter substrate 11 is maintained more satisfactorily.

Further, in the light blocking portion 24, among the plurality of pixel openings 240P overlapping the pixel electrodes 20 of the plurality of blue pixels BPX and the pixel electrodes 20 of the plurality of red pixels RPX that sandwich a plurality of boundaries respectively closest to the plurality of TFTs 19 overlapping the plurality of main spacers 17B to 17G having the shortest distances D2 to D7 being equal to each other, the plurality of pixel openings 240P overlapping the pixel electrodes 20 of the plurality of blue pixels BPX have the same planar shape, and the plurality of pixel openings 240P overlapping the pixel electrodes 20 of the plurality of red pixels RPX have the same planar shape. In this manner, the aperture ratios of the plurality of blue pixels BPX described above are equal to each other, and thus the amount of light emitted from the blue pixels BPX is less likely to vary. Similarly, the aperture ratios of the plurality of red pixels RPX described above are equal to each other, and thus the amount of light emitted from the red pixels RPX is less likely to vary. Thereby, the display quality is maintained more satisfactorily.

Additionally, the plurality of main spacers 17B to 17G having the shortest distances D2 to D7 being equal to each other are disposed to overlap the center 19CE of the TFT 19 being an overlapping target. In this manner, the plurality of main spacers 17B to 17G having the above-described shortest distances D2 to D7 being equal to each other are avoided being excessively separated from the center 19CE of the TFT 19 being an overlapping target and excessively approaching the opening edge of the pixel opening 240P. Thereby, a little adverse effect is exerted on the display with the blue pixel BPX and the red pixel RPX that sandwich the boundary closest to each of the TFTs 19 overlapping the main spacers 17B to 17G. Thereby, the display quality is maintained more satisfactorily.

In addition, the plurality of main spacers 17A to 17G having different overlapping relationships include the first main spacer 17A disposed concentrically with the TFT 19 being an overlapping target, and the first main spacer 17A disposed in a concentric manner has the shortest distance D1 being larger than those of the plurality of main spacers 17B to 17G having the shortest distances D2 to D7 being equal to each other. In this manner, as compared to the plurality of main spacers 17B to 17G having the above-described shortest distances D2 to D7 being equal to each other, a little adverse effect is exerted on the display with the blue pixel BPX and the red pixel RPX that sandwich the boundary closest to the TFT 19 overlapping the above-described first main spacer 17A disposed in a concentric manner. Thereby, the display quality is maintained more satisfactorily.

Second Embodiment

A second embodiment will be described with reference to FIG. 17. In this second embodiment, a case where a configuration of a light blocking portion 124 is changed will be described. Note that repetitive descriptions of the same and/or similar structures, actions, and effects as those of the first embodiment described above will be omitted.

Figure 17:
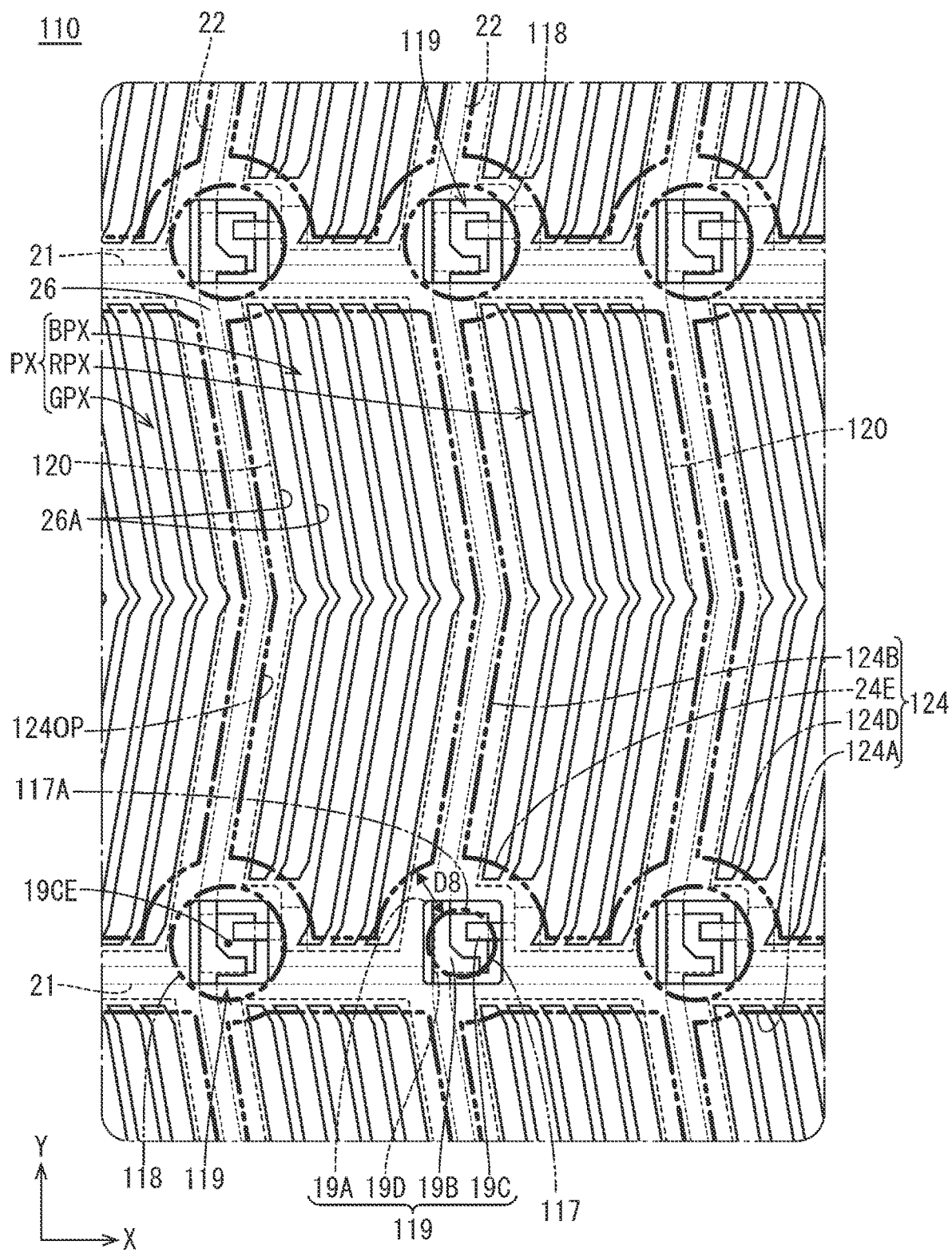
FIG. 17 is a plan view illustrating a positional relationship between a first main spacer, a TFT, and a light blocking portion in a display region of a liquid crystal panel according to a second embodiment.

As illustrated in FIG. 17, the light blocking portion 124 according to the present embodiment includes a fifth light blocking portion 24E disposed to surround a first main spacer 117A disposed concentrically with a TFT 119 being an overlapping target. The fifth light blocking portion 24E has a substantially fan shape that is concentric with the first main spacer 117A. Four fifth light blocking portions 24E are contiguous with each other at an intersection overlapping the first main spacers 117A, the intersection being between a first light blocking portion 124A and a second light blocking portion 124B. The four fifth light blocking portions 24E collectively have a substantially circular shape corresponding to the planar shape of the first main spacer 117A, and the diameter dimension thereof is larger than the diameter dimension of the first main spacer 117A. The diameter dimensions and the sum of the areas of the four fifth light blocking portions 24E is equal to the diameter dimensions and the sum of the areas of four fourth light blocking portions 124D surrounding a sub-spacer 118. Thus, the planar shapes of two pixel openings 1240P overlapping a pixel electrode 120 of a blue pixel BPX and a pixel electrode 120 of a red pixel RPX that sandwich a boundary closest to the TFT 119 overlapping the first main spacer 117A are the same as the planar shapes of a plurality of pixel openings 1240P overlapping the plurality of pixel electrodes 120 respectively connected to the plurality of TFTs 119 overlapping the plurality of sub-spacers 118. In this manner, aperture ratios in a plurality of pixels PX corresponding to the plurality of pixel electrodes 120 respectively connected to the plurality of TFTs 119 overlapping the plurality of sub-spacers 118 and the blue pixel BPX and the red pixel RPX that sandwich the boundary closest to the TFT 119 overlapping the first main spacer 117A are equal to each other. Thereby, the amount of light emitted from the pixels PX is less likely to vary. Thereby, the display quality is maintained more satisfactorily.

Next, description will be given of a shortest distance D8 when viewed in a plan view between the first main spacer 117A disposed concentrically with the TFT 119 being an overlapping target and opening edges of the two pixel openings 1240P overlapping the blue pixel BPX and the red pixel RPX that sandwich the boundary closest to the TFT 119 being an overlapping target. The shortest distance D8 related to the first main spacer 117A according to the present embodiment is equal to the shortest distances D2 to D7 related to the other six main spacers 17B to 17G illustrated in FIG. 10 to FIG. 15. In this manner, as compared to the six main spacers 17B to 17G having the above-described shortest distances D2 to D7 being equal to each other, adverse effects exerted on the display with the blue pixel BPX and the red pixel RPX that sandwich the boundary closest to the TFT 119 overlapping the first main spacer 117A described above are the same. Thereby, display unevenness is not likely to be visually recognized, and the display quality is maintained more satisfactorily.

As described above, according to the present embodiment, the plurality of main spacers 117 having different overlapping relationships include the first main spacer 117A disposed concentrically with the TFT 119 being an overlapping target, and the first main spacer 117A disposed in a concentric manner has the shortest distance D8 which is the same as the shortest distances D2 to D7 of the plurality of main spacers 17B to 17G, the shortest distances D2 to D7 being equal to each other. In this manner, as compared to the plurality of main spacers 17B to 17G having the above-described shortest distances D2 to D7 being equal to each other, adverse effects exerted on the display with the blue pixel BPX and the red pixel RPX that sandwich the boundary closest to the TFT 119 overlapping the above-described first main spacer 117A disposed in a concentric manner are the same. Thereby, display unevenness is not likely to be visually recognized, and the display quality is maintained more satisfactorily.

In addition, there are provided a plurality of sub-spacers 118 that are provided in at least a counter substrate 11, protrude toward an array substrate 12 from the counter substrate 11, and each of which has a protrusion dimension smaller than that of the main spacer 117. The plurality of sub-spacers 118 are disposed to overlap at least some of the plurality of TFTs 119 in which the plurality of main spacers 117 are not disposed among the plurality of TFTs 119. The light blocking portion 124 is disposed to overlap the plurality of sub-spacers 118. Among the plurality of pixel openings 1240P, the planar shapes of the plurality of pixel openings 1240P overlapping the plurality of pixel electrodes 120 respectively connected to the plurality of TFTs 119 overlapping the plurality of sub-spacers 118 and the planar shapes of the two pixel openings 1240P overlapping the pixel electrodes 120 of the blue pixels BPX and the pixel electrodes 120 of the red pixel RPX that sandwich the boundary closest to the TFT 119 overlapping the first main spacer 117A disposed in a concentric manner are the same. In this manner, aperture ratios in a plurality of pixels PX corresponding to the plurality of pixel electrodes 120 respectively connected to the plurality of TFTs 119 overlapping the plurality of sub-spacers 118 and the blue pixel BPX and the red pixel RPX that sandwich the boundary closest to the TFT 119 overlapping the first main spacer 117A disposed in a concentric manner are equal to each other. Thereby, the amount of light emitted from the pixels PX is less likely to vary. Thereby, the display quality is maintained more satisfactorily.

Third Embodiment

A third embodiment will be described with reference to FIG. 18. In the third embodiment, a case where the arrangement of main spacers 217 is changed from the first embodiment described above will be described. Note that repetitive descriptions of the same and/or similar structures, actions, and effects as those of the first embodiment described above will be omitted.

Figure 18:
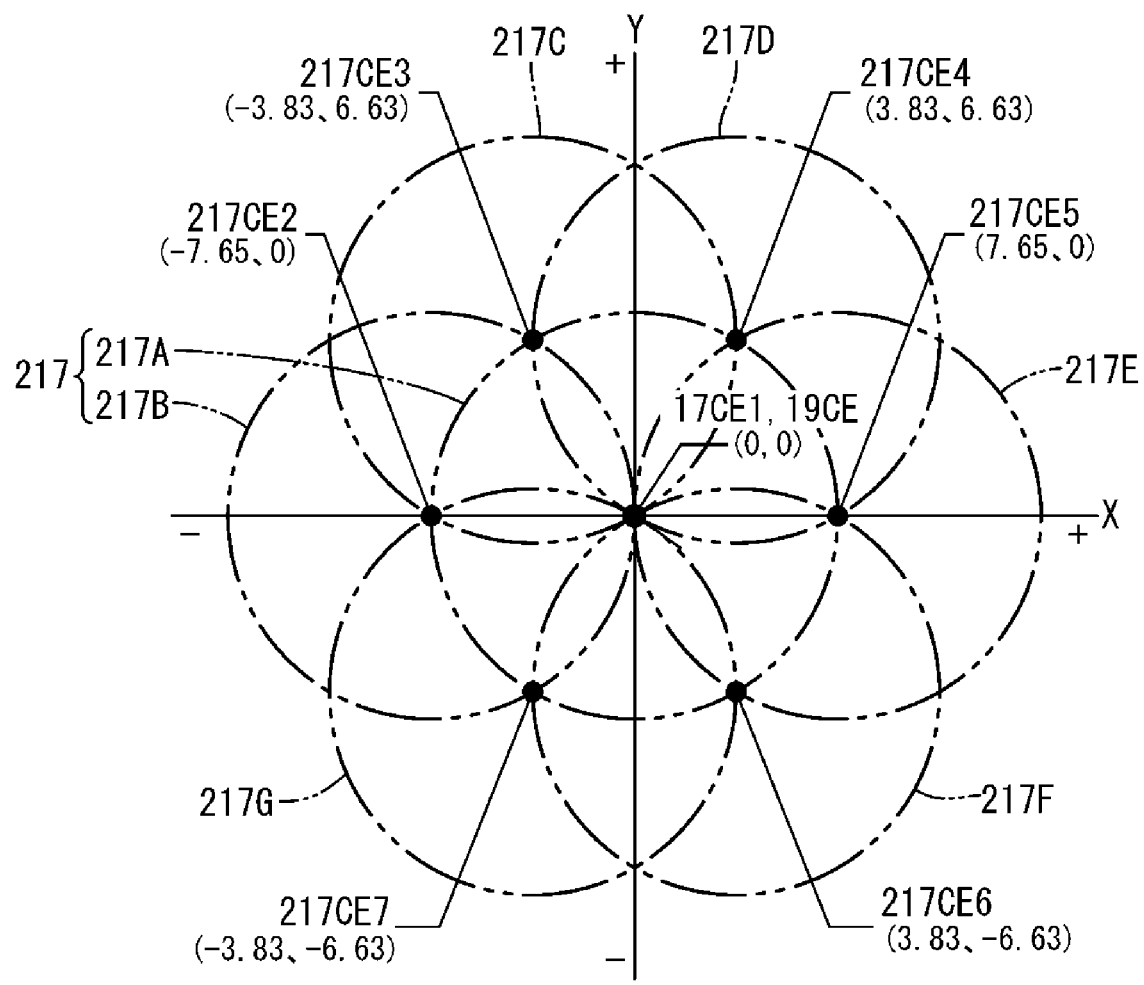
FIG. 18 is a graph showing centers of seven main spacers having different overlapping relationships with respect to a TFT being an overlapping target according to a third embodiment, the centers being integrated into one coordinate system.

As shown in FIG. 18, the plurality of main spacers 217 according to the present embodiment are disposed such that the plurality of main spacers 17 described in the first embodiment (see FIG. 16) are rotated by 90 degrees around the origin. Note that FIG. 18 shows a graph representing a coordinate system that is the same as or similar to that in FIG. 16 described above in the first embodiment. That is, arrangement related to a first main spacer 217A is the same and/or similar to that in the first embodiment described above, whereas arrangement according to the other six main spacers 217B to 217G has been changed as described below from the first embodiment described above. Specifically, in the second main spacer 217B, a center 217CE2 thereof deviates leftward in FIG. 18 with respect to the origin (the center of the TFT being an overlapping target). The coordinate value of the center 217CE2 of the second main spacer 217B shown in FIG. 18 is (−7.65, 0). In the third main spacer 217C, a center 217CE3 thereof deviates upward in an obliquely left direction in FIG. 18 with respect to the origin. The coordinate value of the center 217CE3 of the third main spacer 217C shown in FIG. 18 is (−3.83, 6.63). In the fourth main spacer 217D, a center 217CE4 thereof deviates upward in an obliquely right direction in FIG. 18 with respect to the origin. The coordinate value of the center 217CE4 of the fourth main spacer 217D shown in FIG. 18 is (3.83, 6.63). In the fifth main spacer 217E, a center 217CE5 thereof deviates rightward in FIG. 18 with respect to the origin. The coordinate value of the center 217CE5 of the fifth main spacer 217E shown in FIG. 18 is (7.65, 0). In the sixth main spacer 217F, a center 217CE6 thereof deviates downward in an obliquely right direction in FIG. 18 with respect to the origin. The coordinate value of the center 217CE6 of the sixth main spacer 217F shown in FIG. 18 is (3.83, −6.63). In the seventh main spacer 217G, a center 217CE7 thereof deviates downward in an obliquely left direction in FIG. 18 with respect to the origin. The coordinate value of the center 217CE7 of the seventh main spacer 217G shown in FIG. 18 is (−3.83, −6.63). Even with such a configuration, the same and/or similar actions and effects as those of the first embodiment described above can be obtained.

Fourth Embodiment

A fourth embodiment will be described with reference to FIG. 19. In the fourth embodiment, a case where the number of main spacers 317 installed and the arrangement thereof are changed from the first embodiment described above will be described. Note that repetitive descriptions of the same and/or similar structures, actions, and effects as those of the first embodiment described above will be omitted.

Figure 19:
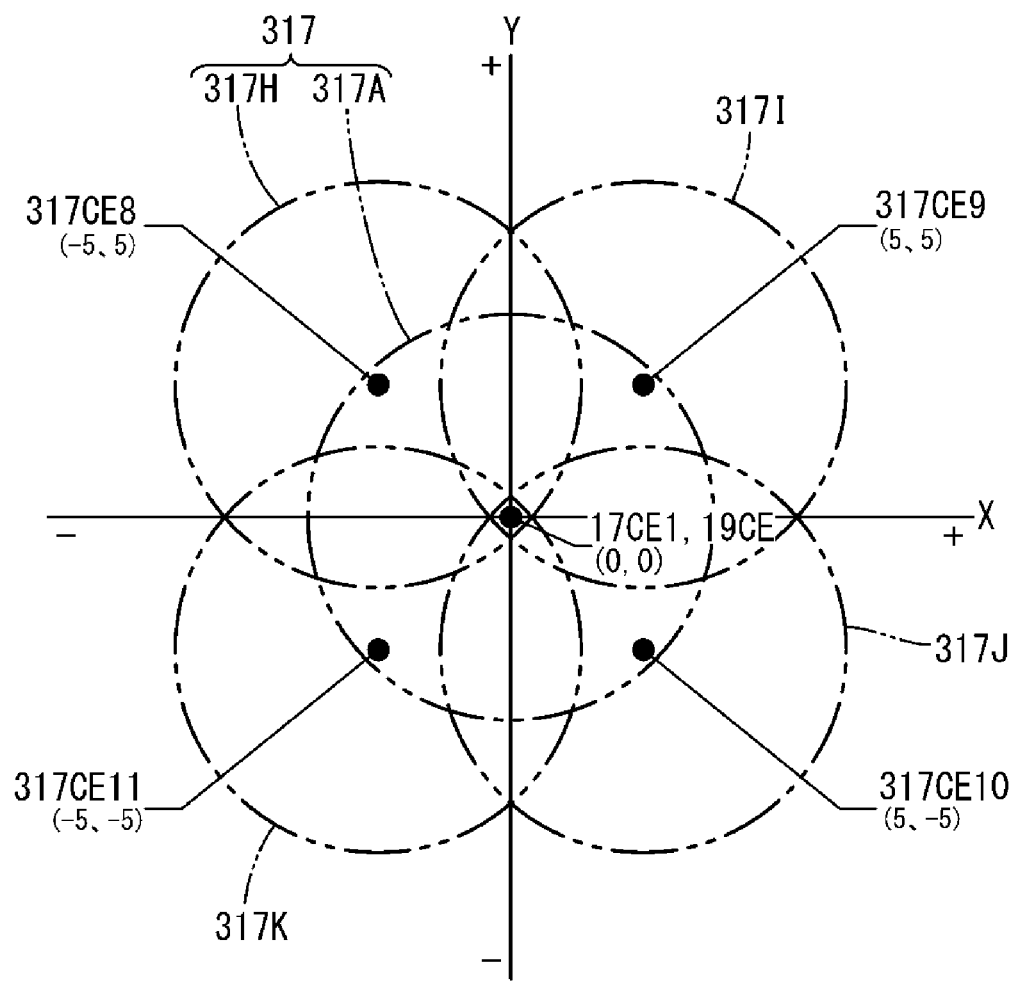
FIG. 19 is a graph showing centers of five main spacers having different overlapping relationships with respect to a TFT being an overlapping target according to a fourth embodiment, the centers being integrated into one coordinate system.

As shown in FIG. 19, the plurality of main spacers 317 according to the present embodiment include a first main spacer 317A that is concentric with the origin (the center 19CE of the TFT 19 being an overlapping target), and four main spacers 317H to 317K that are not concentric with the origin. Note that FIG. 19 showing a graph representing a coordinate system that is the same as and/or similar to that in FIG. 16 described above in the first embodiment. Among them, arrangement related to the first main spacer 317A is the same and/or similar to that in the first embodiment described above. The four main spacers 317H to 317K that are not concentric with the origin include an eighth main spacer 317H, a ninth main spacer 317I, a tenth main spacer 317J, and an eleventh main spacer 317K. The arrangement of the four main spacers 317H to 317K is as follows.

Note that, in a case where the four main spacers 317H to 317K that are not concentric with the origin are distinguished from each other, a suffix "H" is appended to the reference numeral of the eighth main spacer, a suffix "I" is appended to the reference numeral of the ninth main spacer, a suffix "J" is appended to the reference numeral of the tenth main spacer, and a suffix "K" is appended to the reference numeral of the eleventh main spacer, and in a case where the main spacers 317 are collectively referred to without distinction, no suffix is appended to the reference numerals. Further, in a case where centers 317CE8 to 317CE11 of the four main spacers 317H to 317K that are not concentric with the origin are distinguished from each other, a suffix "8" is appended to the reference numeral of the center of the eighth main spacer 317H, a suffix "9" is appended to the reference numeral of the center of the ninth main spacer 317I, a suffix "10" is appended to the reference numeral of the center of the tenth main spacer 317J, and a suffix "11" is appended to the reference numeral of the center of the eleventh main spacer 317K, and in a case where the centers 317CE are collectively referred to without distinction, no suffix is appended to the reference numerals.

In the eighth main spacer 317H, the center 317CE8 thereof deviates upward in an obliquely left direction in FIG. 19 with respect to the origin. The coordinate value of the center 317CE8 of the eighth main spacer 317H shown in FIG. 19 is (−5, 5). In the ninth main spacer 317I, a center 317CE9 thereof deviates upward in an obliquely right direction in FIG. 19 with respect to the origin. The coordinate value of the center 317CE9 of the ninth main spacer 317I shown in FIG. 19 is (5, 5). In the tenth main spacer 317J, a center 317CE10 thereof deviates downward in an obliquely right direction in FIG. 19 with respect to the origin. The coordinate value of the center 317CE10 of the tenth main spacer 317J shown in FIG. 19 is (5, −5). In the eleventh main spacer 317K, a center 317CE11 thereof deviates downward in an obliquely left direction in FIG. 19 with respect to the origin. The coordinate value of the center 317CE11 of the eleventh main spacer 317K shown in FIG. 19 is (−5, −5). The centers 317CE8 to 317CE11 of the four main spacers 317H to 317K are positioned on a side closer to the inner periphery than the outer end of the first main spacer 317A and overlap the first main spacer 317A. The four main spacers 317H to 317K are disposed at positions that are concentric with vertexes of a square that is concentric with the origin (the center of the TFT being an overlapping target). Thus, the centers 317CE8 to 317CE11 of the four main spacers 317H to 317K are disposed side by side at equal angular intervals (angular intervals of 90 degrees) around the origin. Even with such a configuration, substantially the same and/or similar actions and effects as those of the first embodiment described above can be obtained.

Fifth Embodiment

A fifth embodiment will be described with reference to FIG. 20 to FIG. 25. In the fifth embodiment, a case where a configuration of an array substrate 412 is changed from the first embodiment described above will be described. Note that repetitive descriptions of the same and/or similar structures, actions, and effects as those of the first embodiment described above will be omitted.

Figure 20:
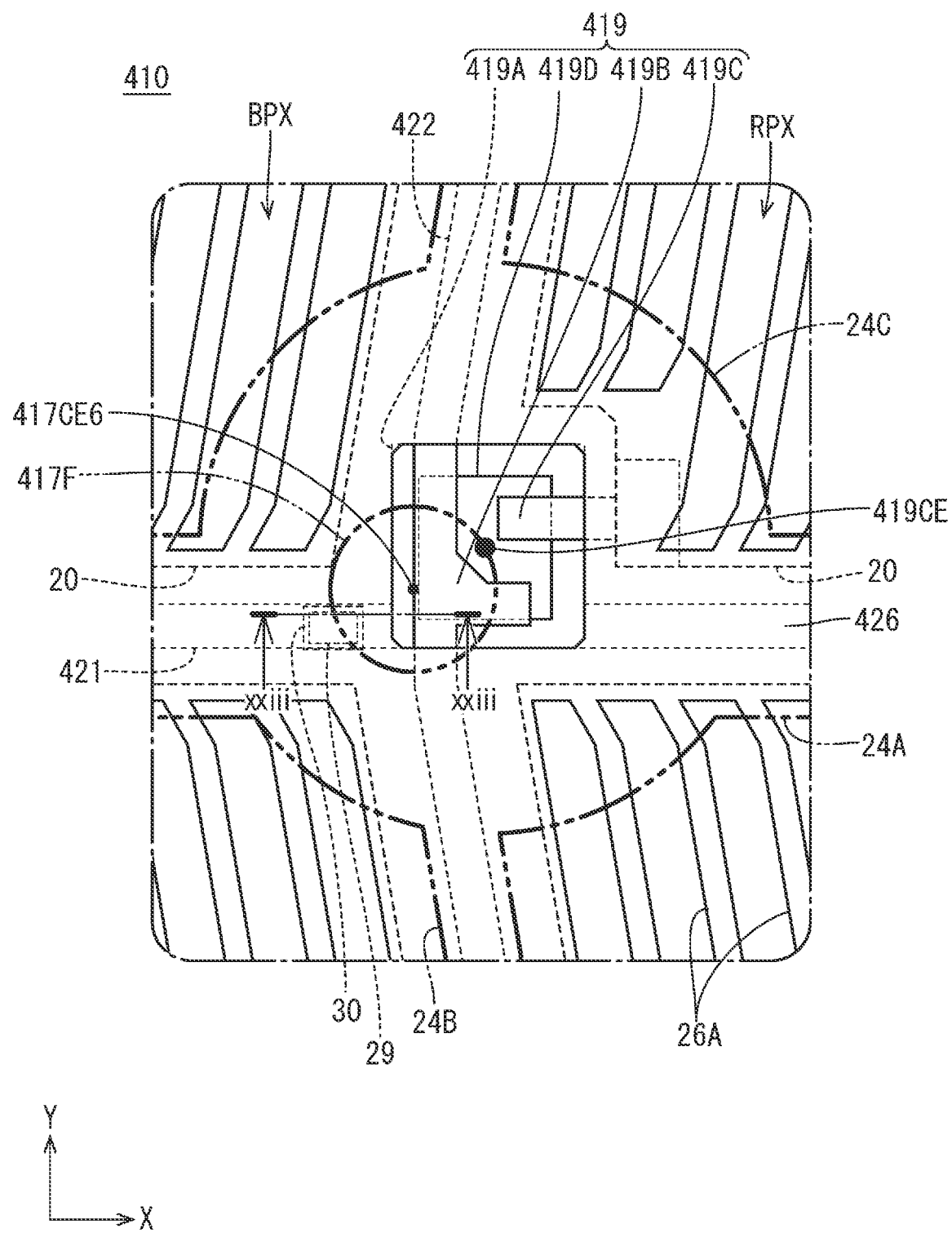
FIG. 20 is a plan view illustrating a positional relationship between a sixth main spacer, a TFT, and a light blocking portion in a display region of a liquid crystal panel according to a fifth embodiment.
Figure 21:
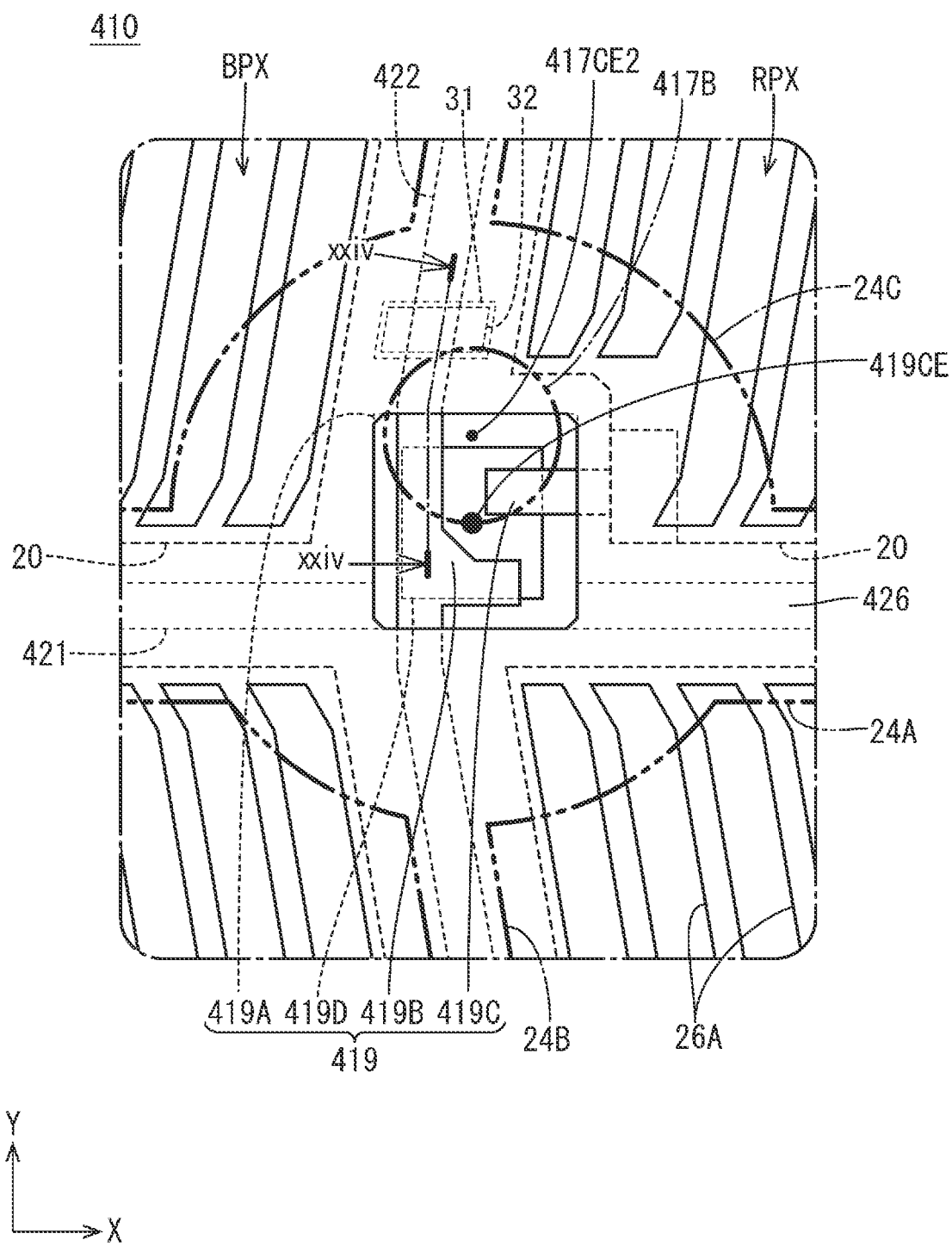
FIG. 21 is a plan view illustrating a positional relationship between a second main spacer, the TFT, and the light blocking portion in the display region of the liquid crystal panel.
Figure 22:
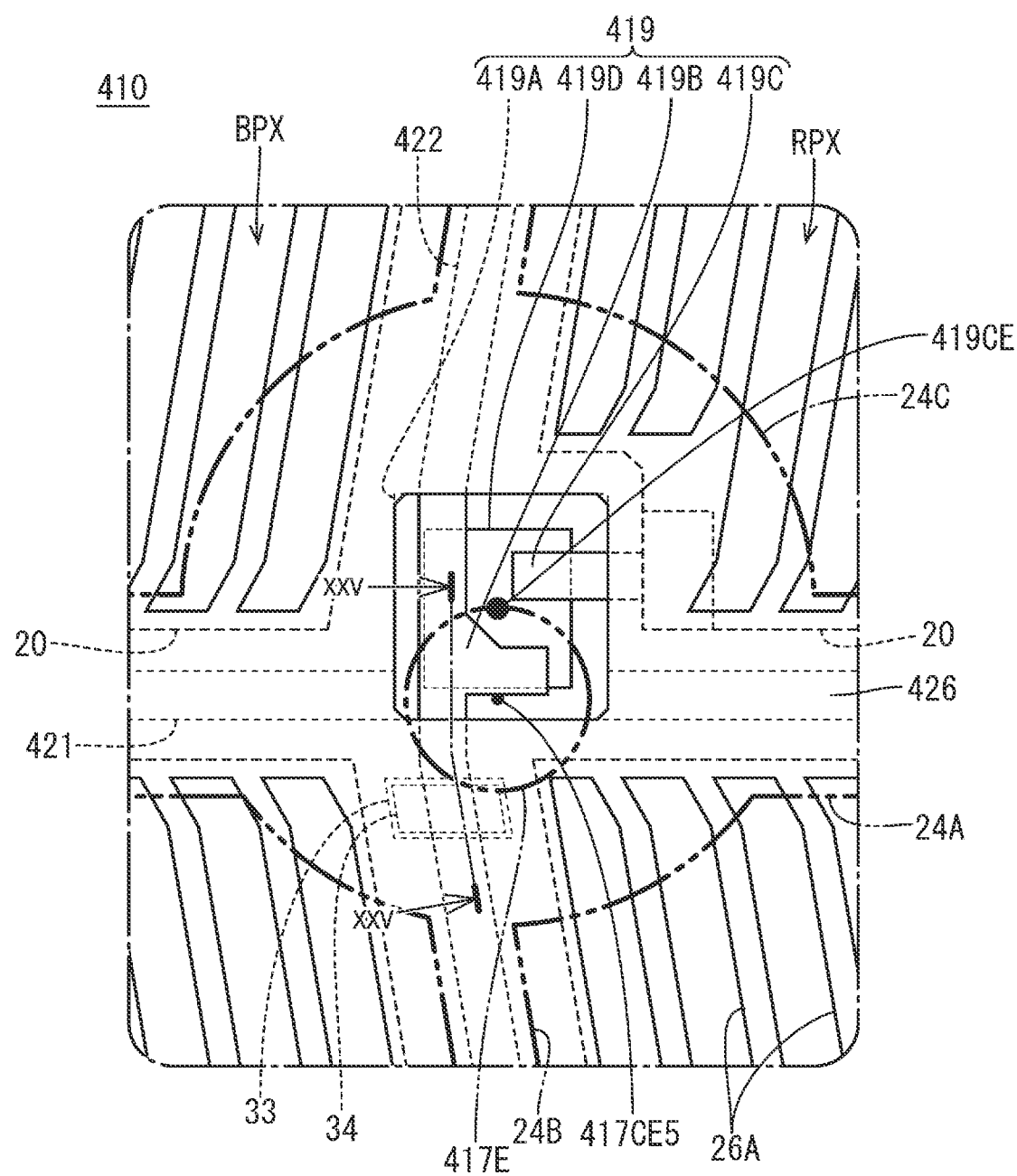
FIG. 22 is a plan view illustrating a positional relationship between a fifth main spacer, the TFT, and the light blocking portion in the display region of the liquid crystal panel.

As illustrated in FIG. 20 to FIG. 22, the array substrate 412 according to the present embodiment is provided with overlapping portions 29 to 34 that overlap a portion of a specific main spacer 417. In FIG. 20 to FIG. 22, a configuration constituted by a first metal film (a gate electrode 419A, a gate wiring line 421, and the like), a configuration constituted by a semiconductor film (an island-shaped semiconductor portion 419D including a channel portion, and the like), and a configuration constituted by a second metal film (a source electrode 419B, a drain electrode 419C, a source wiring line 422, and the like) are illustrated in different shaded patterns. Further, in the present embodiment, three main spacers 417, i.e., a second main spacer 417B, a fifth main spacer 417E, and a sixth main spacer 417F among seven main spacers 417 having different overlapping relationships are representatively illustrated and described as follows.

Figure 23:
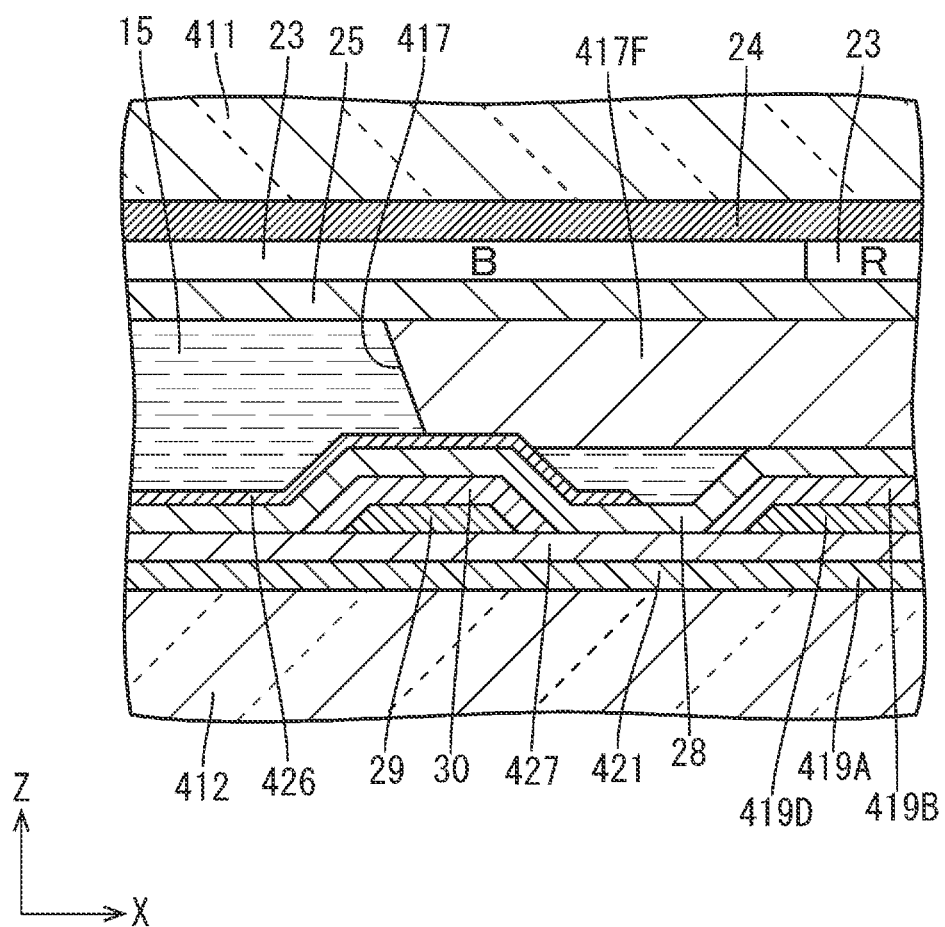
FIG. 23 is a cross-sectional view of the liquid crystal panel taken along line xxiii-xxiii in FIG. 20.

First, as illustrated in FIG. 20, in the sixth main spacer 417F, a center 417CE6 thereof deviates downward in an obliquely left direction in FIG. 20 with respect to a center 419CE of the TFT 419 being an overlapping target, that is, to the gate wiring line 421 side. The array substrate 412 is provided with a first overlapping portion 29 and a second overlapping portion 30 that respectively overlap a portion of the sixth main spacer 417F and a portion of the gate wiring line 421 in the above-described arrangement. As illustrated in FIG. 23, the first overlapping portion 29 is constituted by a portion separate from the island-shaped semiconductor portion 419D in the semiconductor film. The second overlapping portion 30 is constituted by a portion separate from the source electrode 419B, the drain electrode 419C, and the source wiring line 422 in the second metal film. The second overlapping portion 30 is disposed to overlap the first overlapping portion 29. A gate insulating film 427 is interposed between the first overlapping portion 29, the second overlapping portion 30, and the gate wiring line 421 being an overlapping target. That is, the first overlapping portion 29 and the second overlapping portion 30 are electrically isolated. As illustrated in FIG. 20, both of the first overlapping portion 29 and the second overlapping portion 30 have a rectangular shape which is horizontally long and have substantially the same size when viewed in a plan view. The first overlapping portion 29 and the second overlapping portion 30 are disposed such that the dimensions thereof in the Y-axis direction are substantially the same as the line width of the gate wiring line 421, and the entire regions thereof overlap a portion of the gate wiring line 421. End portions of the first overlapping portion 29 and the second overlapping portion 30 on the center 419CE side of the TFT 419 (on the upper side in an obliquely right direction in FIG. 20) are disposed to overlap a portion of the sixth main spacer 417F.

Figure 24:
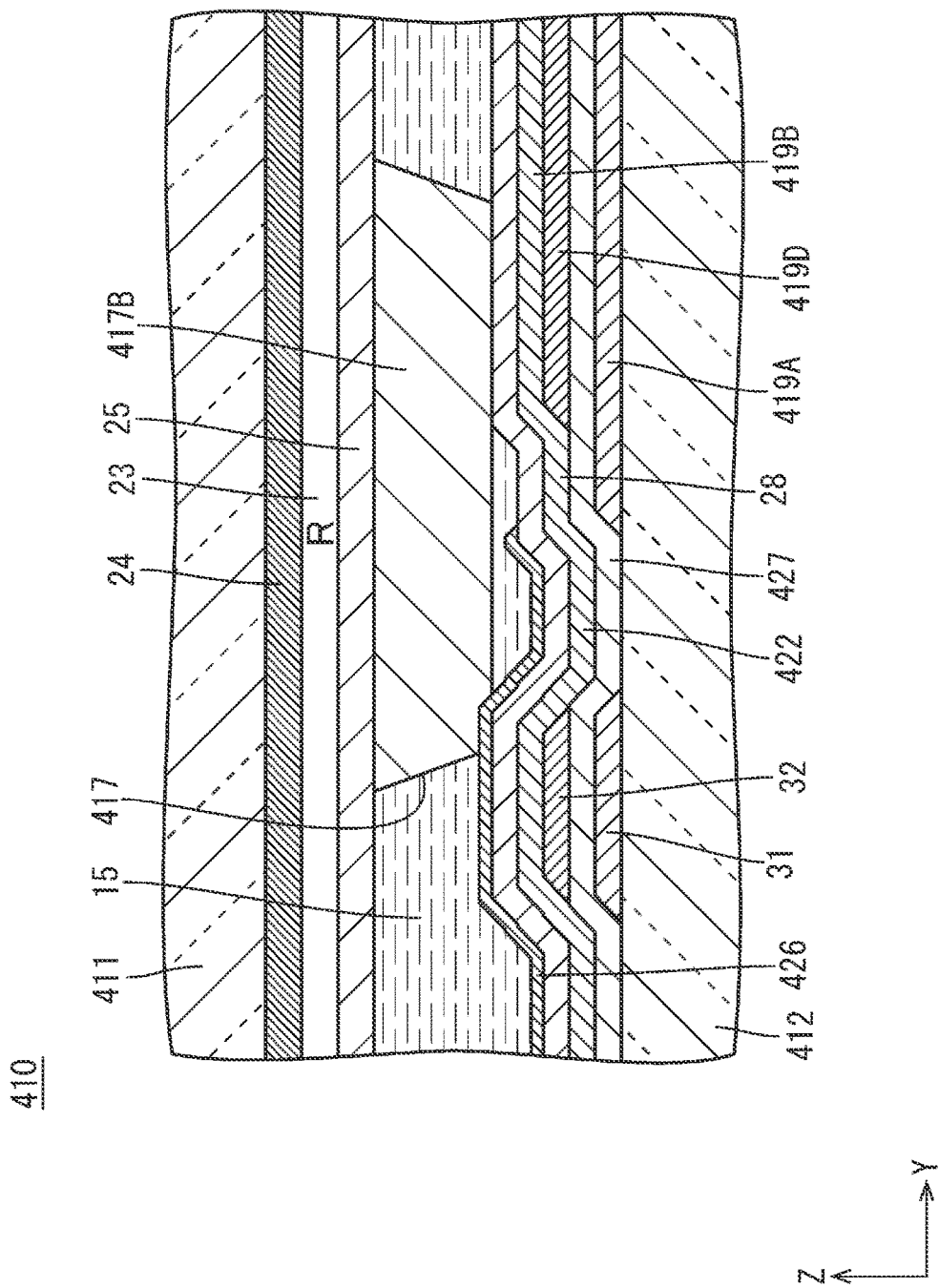
FIG. 24 is a cross-sectional view of the liquid crystal panel taken along line xxiv-xxiv in FIG. 21.

Next, as illustrated in FIG. 21, in the second main spacer 417B, the center 417CE2 thereof deviates upward in FIG. 21 with respect to the center 419CE of the TFT 419 being an overlapping target, that is, along the source wiring line 422. The array substrate 412 is provided with a third overlapping portion 31 and a fourth overlapping portion 32 that respectively overlap a portion of the second main spacer 417B and a portion of the source wiring line 422 in the above-described arrangement. As illustrated in FIG. 24, the third overlapping portion 31 is constituted by a portion separate from the gate electrode 419A and the gate wiring line 421 in the first metal film. The fourth overlapping portion 32 is constituted by a portion separate from the island-shaped semiconductor portion 419D and the first overlapping portion 29 in the semiconductor film. The fourth overlapping portion 32 is disposed to overlap the third overlapping portion 31. The fourth overlapping portion 32 constituted by a portion of the semiconductor film is in contact with the source wiring line 422 being an overlapping target. In addition, the gate insulating film 427 is interposed between the third overlapping portion 31 constituted by a portion of the first metal film and the source wiring line 422. In this manner, the third overlapping portion 31 is electrically isolated. As illustrated in FIG. 21, both of the third overlapping portion 31 and the fourth overlapping portion 32 have a rectangular shape which is horizontally long and have substantially the same size when viewed in a plan view. The third overlapping portion 31 and the fourth overlapping portion 32 are disposed such that the dimensions thereof in the X-axis direction are larger than the line width of the source wiring line 422, and portions thereof (central portions) overlap a portion of the source wiring line 422. End portions of the third overlapping portion 31 and the fourth overlapping portion 32 on the center 419CE side of the TFT 419 (on the lower side in an obliquely right direction in FIG. 21) are disposed to overlap a portion of the second main spacer 417B.

Figure 25:
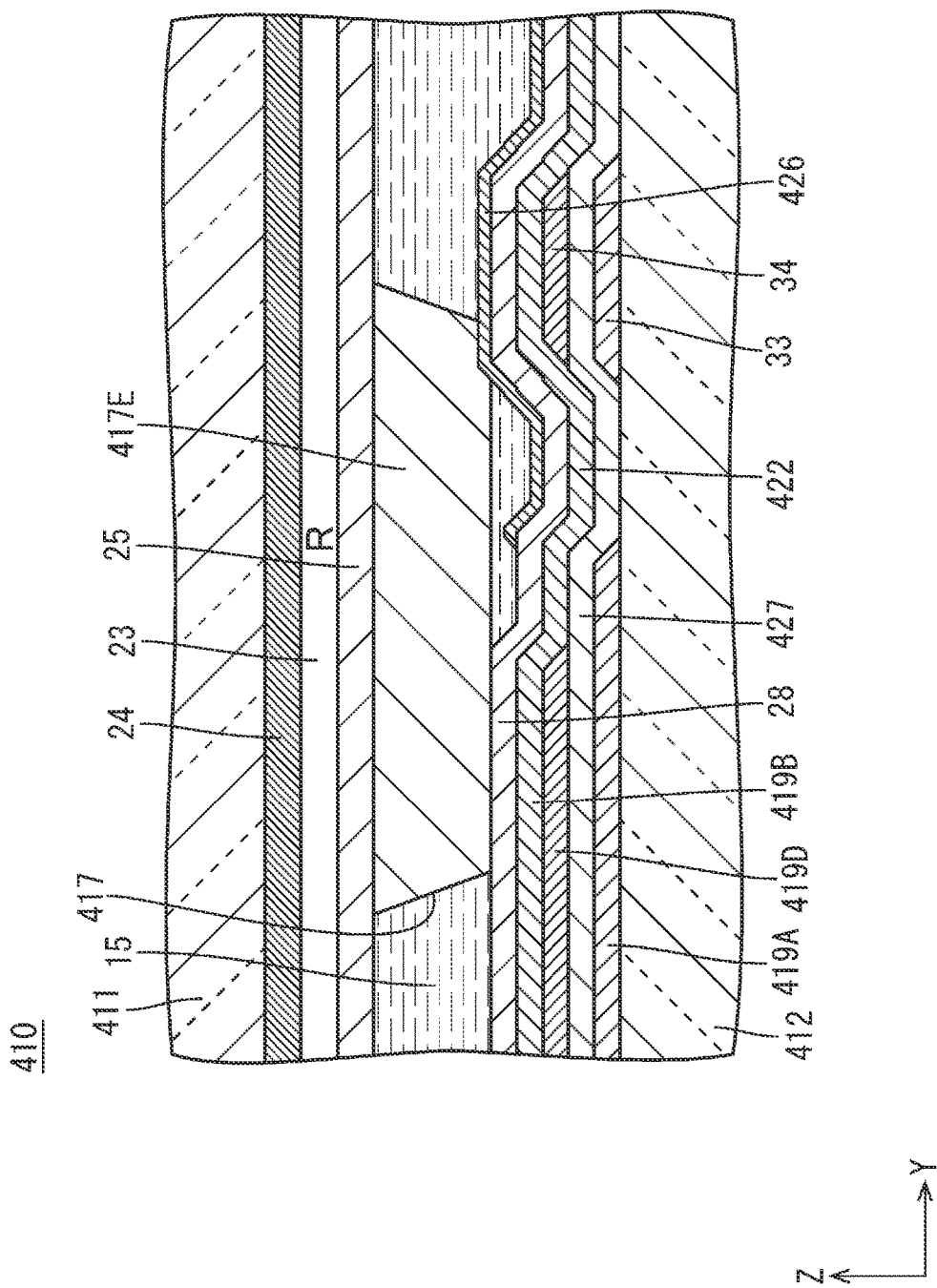
FIG. 25 is a cross-sectional view of the liquid crystal panel taken along line xxv-xxv in FIG. 22.

Subsequently, as illustrated in FIG. 22, in the fifth main spacer 417E, a center 417CE5 thereof deviates downward in FIG. 22 with respect to the center 419CE of the TFT 419 being an overlapping target, that is, along the source wiring line 422. The array substrate 412 is provided with a fifth overlapping portion 33 and a sixth overlapping portion 34 that respectively overlap a portion of the fifth main spacer 417E and a portion of the source wiring line 422 in the above-described arrangement. As illustrated in FIG. 25, the fifth overlapping portion 33 is constituted by a portion separate from the gate electrode 419A, the gate wiring line 421, and the third overlapping portion 31 in the first metal film. The sixth overlapping portion 34 is constituted by a portion separate from the island-shaped semiconductor portion 419D, the first overlapping portion 29, and the fourth overlapping portion 32 in the semiconductor film. The sixth overlapping portion 34 is disposed to overlap the fifth overlapping portion 33. The sixth overlapping portion 34 constituted by a portion of the semiconductor film is in contact with the source wiring line 422 being an overlapping target. In addition, the gate insulating film 427 is interposed between the fifth overlapping portion 33 constituted by a portion of the first metal film and the source wiring line 422. In this manner, the fifth overlapping portion 33 is electrically isolated. As illustrated in FIG. 22, both of the fifth overlapping portion 33 and the sixth overlapping portion 34 have a rectangular shape which is horizontally long and have substantially the same size when viewed in a plan view. The fifth overlapping portion 33 and the sixth overlapping portion 34 are disposed such that the dimensions thereof in the X-axis direction are larger than the line width of the source wiring line 422, and portions thereof (central portions) overlap a portion of the source wiring line 422. End portions of the fifth overlapping portion 33 and the sixth overlapping portion 34 on the center 419CE side of the TFT 419 (on the upper side in an obliquely right direction in FIG. 22) are disposed to overlap a portion of the fifth main spacer 417E.

According to the above-described configuration, a portion of the array substrate 412 which overlaps the first overlapping portion 29 and the second overlapping portion 30 respectively overlapping a portion of the sixth main spacer 417F and a portion of the gate wiring line 421 (FIG. 23), a portion of the array substrate 412 which overlaps the third overlapping portion 31 and the fourth overlapping portion 32 respectively overlapping a portion of the second main spacer 417B and a portion of the source wiring line 422 (FIG. 24), and a portion of the array substrate 412 which overlaps the fifth overlapping portion 33 and the sixth overlapping portion 34 respectively overlapping a portion of the fifth main spacer 417E and a portion of the source wiring line 422 (FIG. 25) are positioned at the same height as a portion of the array substrate 412 overlapping the source electrode 419B and the drain electrode 419C which are the highest (thickest) portions of the TFT 419. As illustrated in FIG. 23, the sixth main spacer 417F is in contact with a portion of the array substrate 412 which overlaps the source electrode 419B, the portion being the highest portion of the TFT 419, and also in contact with a portion of the array substrate 412 which overlaps the first overlapping portion 29 and the second overlapping portion 30. As illustrated in FIG. 24, the second main spacer 417B is in contact with a portion of the array substrate 412 which overlaps the source electrode 419B and the drain electrode 419C, the portion being the highest portion of the TFT 419, and also in contact with a portion of the array substrate 412 which overlaps the third overlapping portion 31 and the fourth overlapping portion 32. As illustrated in FIG. 25, the fifth main spacer 417E is in contact with a portion of the array substrate 412 which overlaps the source electrode 419B, the portion being the highest portion of the TFT 419, and also in contact with a portion of the array substrate 412 which overlaps the fifth overlapping portion 33 and the sixth overlapping portion 34. As described above, an interval between the array substrate 412 and the counter substrate 411 is maintained more satisfactorily. Note that the second main spacer 417B, the fifth main spacer 417E, and the sixth main spacer 417F are in contact with each other across a portion of the inner surface of the array substrate 412 which overlaps the common electrode 426 and a portion thereof which does not overlap the common electrode 426. However, the film thickness of the common electrode 426 is sufficiently thinner (for example, the film thickness of the common electrode 426 is set to approximately 0.05 µm to 0.1 µm, whereas the film thickness of the metal film is set to 0.3 µm to 0.6 µm) than those of other metal films and insulating films, and thus there is almost no step on the inner surface of the array substrate 412 due to the presence or absence of the common electrode 426. From this, the second main spacer 417B, the fifth main spacer 417E, and the sixth main spacer 417F are maintained in stable contact with the inner surface of the array substrate 412.

As described above, according to the present embodiment, the source wiring line 422 extending along a boundary closest to the TFT 419 overlapping the main spacer 417, and the gate wiring line 421 intersecting the source wiring line 422 are provided. The TFT 419 includes the gate electrode 419A constituted by the first metal film (first conductive film), the island-shaped semiconductor portion 419D disposed to overlap the gate electrode 419A with the gate insulating film 427 interposed therebetween, constituted by a semiconductor film, and including a channel portion, the source electrode 419B constituted by the second metal film (second conductive film) and in contact with a portion of the island-shaped semiconductor portion 419D, and the drain electrode 419C constituted by a portion separate from the source electrode 419B in the second metal film, disposed spaced apart from the source electrode 419B, and in contact with a portion of the island-shaped semiconductor portion 419D. The gate wiring line 421 is constituted by a portion separate from the gate electrode 419A in the first metal film and continuous with the gate electrode 419A. The source wiring line 422 is constituted by a portion separate from the source electrode 419B and the drain electrode 419C in the second metal film and continuous with the source electrode 419B. The first overlapping portion 29, the second overlapping portion 30, the third overlapping portion 31, and the fourth overlapping portion 32 are provided. The first overlapping portion 29 is disposed to overlap a portion of the sixth main spacer 417F included in the plurality of main spacers 417B, 417E, and 417F having different overlapping relationships and a portion of the gate wiring line 421, and is constituted by a portion separate from the island-shaped semiconductor portion 419D in the semiconductor film. The second overlapping portion 30 is disposed to overlap the first overlapping portion 29 and is constituted by a portion separate from the source electrode 419B, the drain electrode 419C, and the source wiring line 422 in the second metal film. The third overlapping portion 31 is disposed to overlap a portion of the second main spacer 417B included in the plurality of main spacers 417B, 417E, and 417F having different overlapping relationships and a portion of the source wiring line 422, and is constituted by a portion separate from the gate electrode 419A and the gate wiring line 421 in the first metal film. The fourth overlapping portion 32 is disposed to overlap the third overlapping portion 31 and is constituted by a portion separate from the island-shaped semiconductor portion 419D and the first overlapping portion 29 in the semiconductor film. In this manner, when the TFT 419 is driven based on a signal supplied to the gate electrode 419A, the source electrode 419B and the drain electrode 419C are in an electrical conduction state via the channel portion. Since the source electrode 419B and the drain electrode 419C are in contact with the island-shaped semiconductor portion 419D overlapping the gate electrode 419A with the gate insulating film 427 interposed therebetween, a portion overlapping the source electrode 419B and the drain electrode 419C in the TFT 419 is the highest portion. On the other hand, a portion of the array substrate 412 which overlaps the first overlapping portion 29 and the second overlapping portion 30 respectively overlapping a portion of the sixth main spacer 417F and a portion of the gate wiring line 421, and a portion of the array substrate 412 which overlaps the third overlapping portion 31 and the fourth overlapping portion 32 respectively overlapping a portion of the second main spacer 417B and a portion of the source wiring line 422 are positioned at the same height as a portion of the array substrate 412 overlapping the source electrode 419B and the drain electrode 419C. The sixth main spacer 417F is in contact with a portion of the array substrate 412 which overlaps the source electrode 419B and the drain electrode 419C, the portion being the highest portion of the TFT 419, and also in contact with a portion overlapping the first overlapping portion 29 and the second overlapping portion 30. The second main spacer 417B is in contact with a portion of the array substrate 412 that overlaps the source electrode 419B, the portion being the highest portion of the TFT 419, and also in contact with a portion overlapping the third overlapping portion 31 and the fourth overlapping portion 32. Thereby, an interval between the array substrate 412 and the counter substrate 411 is maintained more satisfactorily.

Sixth Embodiment

A sixth embodiment will be described with reference to FIG. 26 to FIG. 35. In this sixth embodiment, a case where the arrangement of main spacers 517 is changed from the first embodiment described above will be described. Note that repetitive descriptions of the same and/or similar structures, actions, and effects as those of the first embodiment described above will be omitted.

Figure 31:
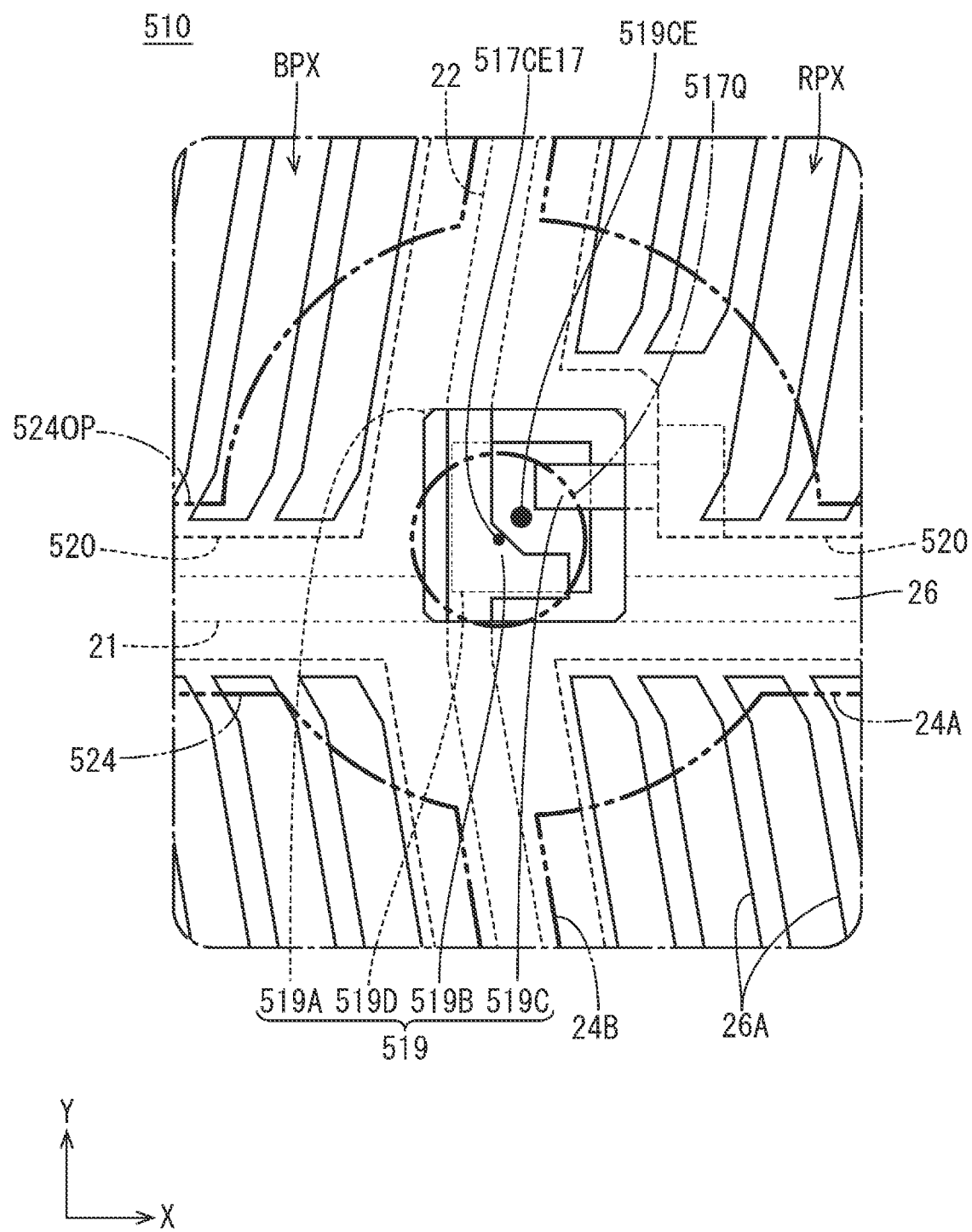
FIG. 31 is a plan view illustrating a positional relationship between a seventeenth main spacer, the TFT, and the light blocking portion in the display region of the liquid crystal panel.
Figure 32:
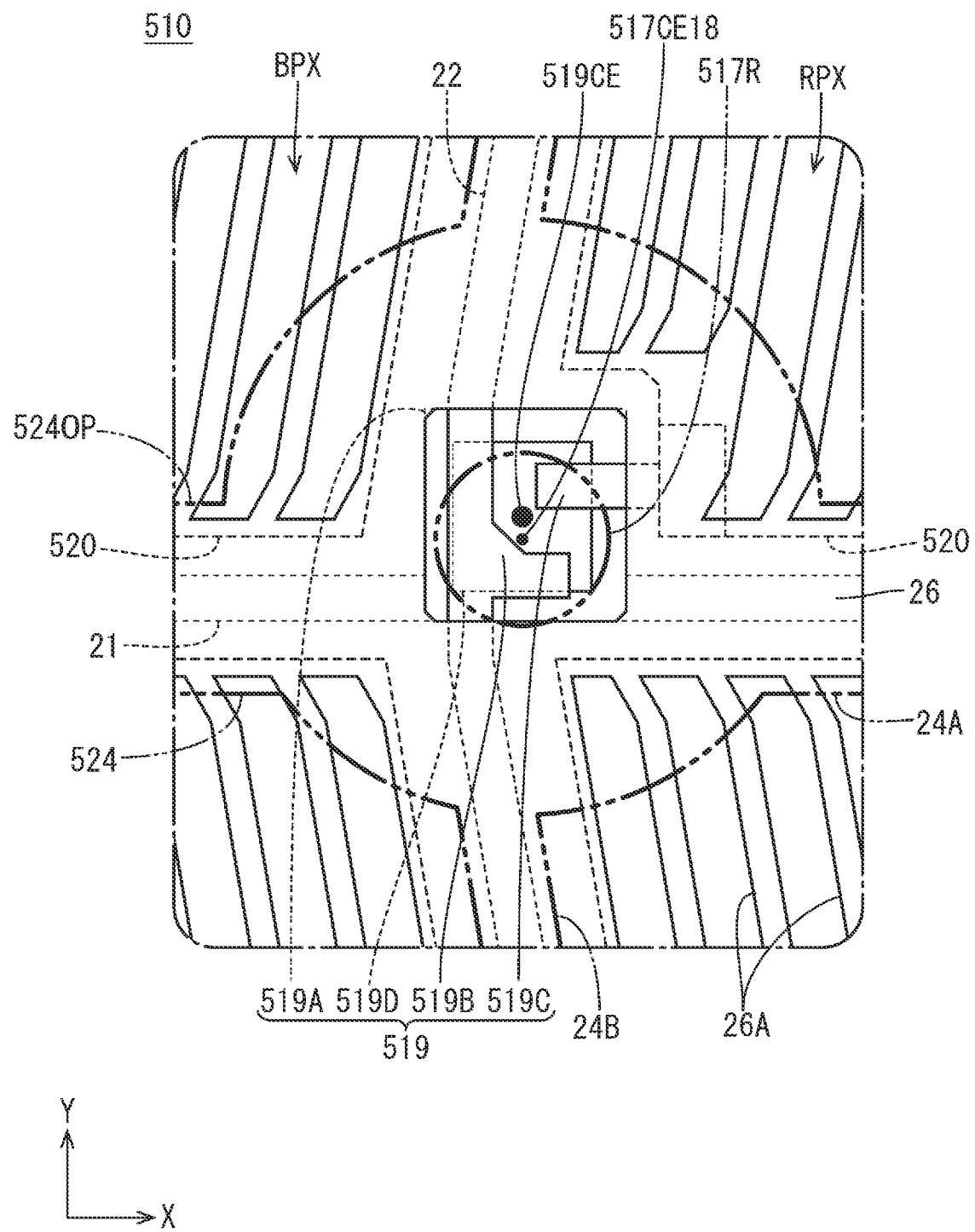
FIG. 32 is a plan view illustrating a positional relationship between an eighteenth main spacer, the TFT, and the light blocking portion in the display region of the liquid crystal panel.
Figure 33:
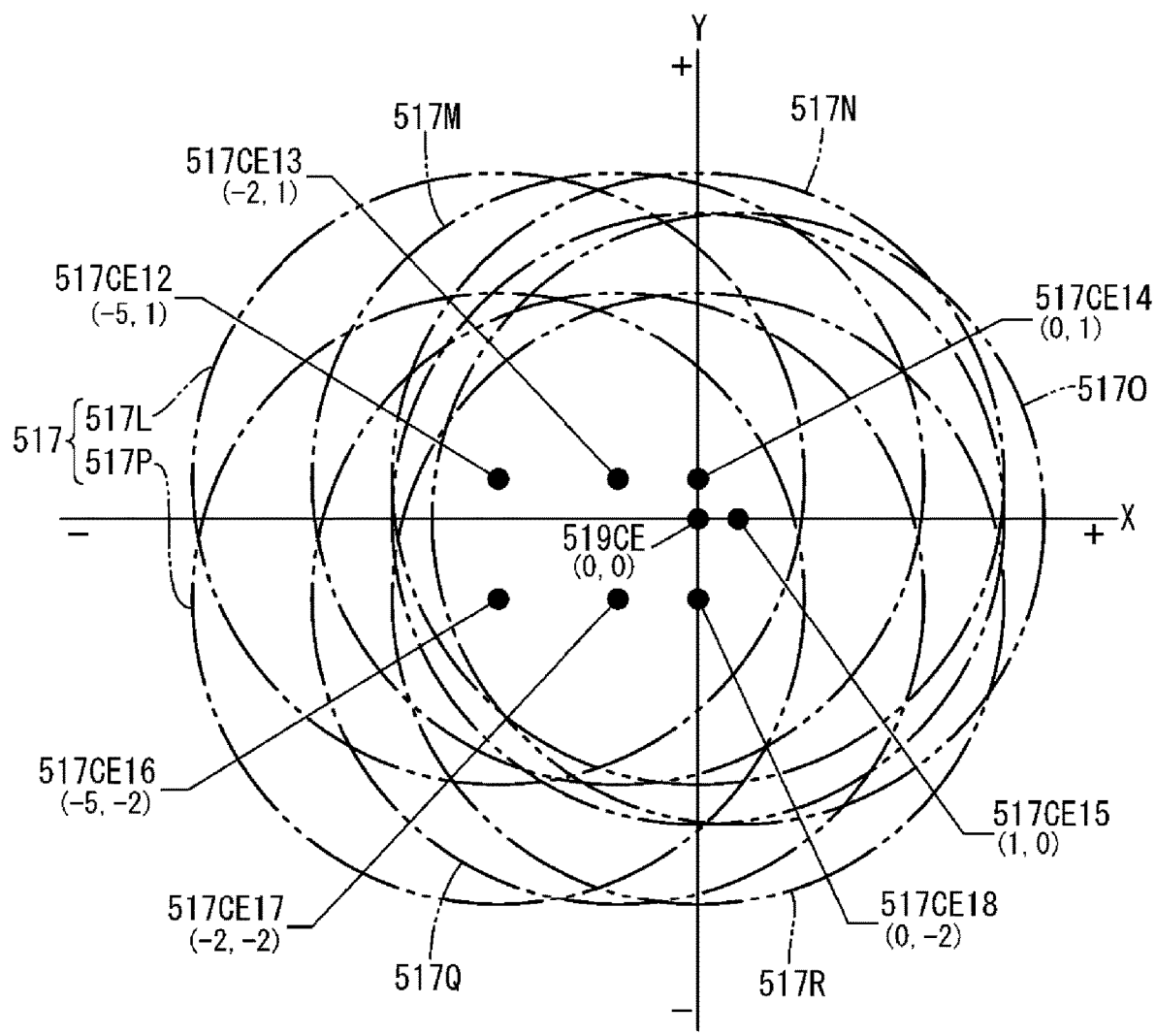
FIG. 33 is a graph showing centers of seven main spacers having different overlapping relationships with respect to the TFT being an overlapping target, the centers being integrated into one coordinate system.

As illustrated in FIG. 26 to FIG. 32, seven main spacers 517L to 517R having different overlapping relationships according to the present embodiment are disposed at positions where respective centers 517CE12 to 517CE18 do not match a center 519CE of a TFT 519 being an overlapping target. That is, in the present embodiment, the seven main spacers 517 having different overlapping relationships do not include a "concentric main spacer" disposed concentrically with the TFT 519 being an overlapping target, and all of them are "non-concentric spacers (unevenly distributed spacers)". The seven main spacers 517 having different overlapping relationships include a twelfth main spacer 517L illustrated in FIG. 26, a thirteenth main spacer 517M illustrated in FIG. 27, a fourteenth main spacer 517N illustrated in FIG. 28, a fifteenth main spacer 517O illustrated in FIG. 29, a sixteenth main spacer 517P illustrated in FIG. 30, a seventeenth main spacer 517Q illustrated in FIG. 31, and an eighteenth main spacer 517R illustrated in FIG. 32. A graph showing the centers 517CE12 to 517CE18 of the seven main spacers 517L to 517R, which are integrated into one coordinate system, is shown in FIG. 33. The graph of FIG. 33 represents a coordinate system that is the same as and/or similar to that in FIG. 16 described above in the first embodiment.

Note that, in a case where the seven main spacers 517 having different overlapping relationships are distinguished from each other, a suffix "L" is appended to the reference numeral of the twelfth main spacer, a suffix "M" is appended to the reference numeral of the thirteenth main spacer, a suffix "N" is appended to the reference numeral of the fourteenth main spacer, a suffix "O" is appended to the fifteenth main spacer, a suffix "P" is appended to the reference numeral of the sixteenth main spacer, a suffix "Q" is appended to the reference numeral of the seventeenth main spacer, and a suffix "R" is appended to the reference numeral of the eighteenth main spacer, and in a case where the seven main spacers 517 are collectively referred to without distinction, no suffix is appended to the reference numerals. Further, in a case where the centers 517CE of the seven main spacers 517 having different overlapping relationships are distinguished from each other, a suffix "12" is appended to the reference numeral of the center of the twelfth main spacer 517L, a suffix "13" is appended to the reference numeral of the center of the thirteenth main spacer 517M, a suffix "14" is appended to the reference numeral of the center of the fourteenth main spacer 517N, a suffix "15" is appended to the reference numeral of the center of the fifteenth main spacer 517O, a suffix "16" is appended to the reference numeral of the center of the sixteenth main spacer 517P, a suffix "17" is appended to the reference numeral of the center of the seventeenth main spacer 517Q, and a suffix "18" is appended to the reference numeral of the center of the eighteenth main spacer 517R, and in a case where the centers 517CE are collectively referred to without distinction, no suffix is appended to the reference numerals.

Figure 26:
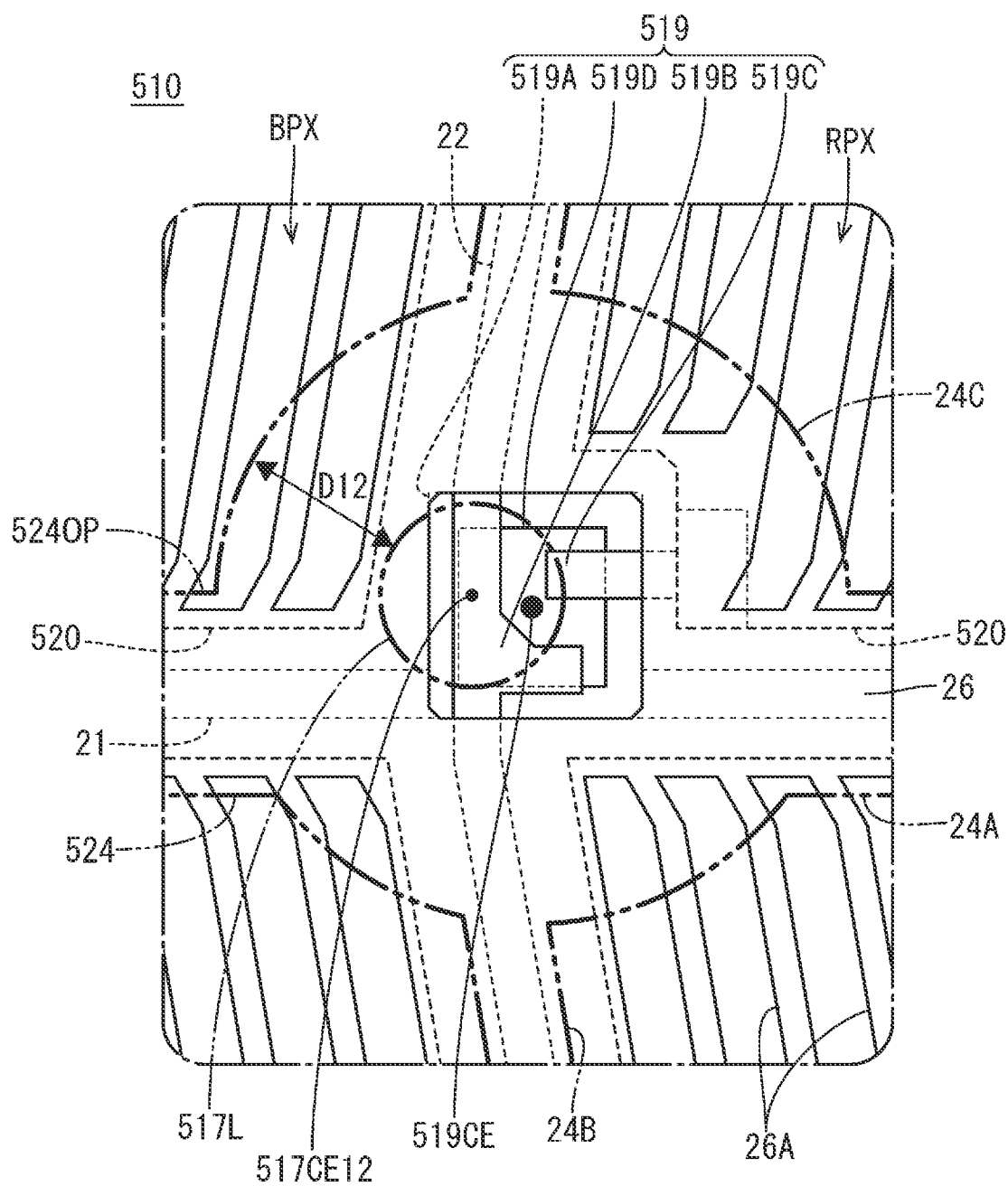
FIG. 26 is a plan view illustrating a positional relationship between a twelfth main spacer, a TFT, and a light blocking portion in a display region of a liquid crystal panel according to a sixth embodiment.
Figure 27:
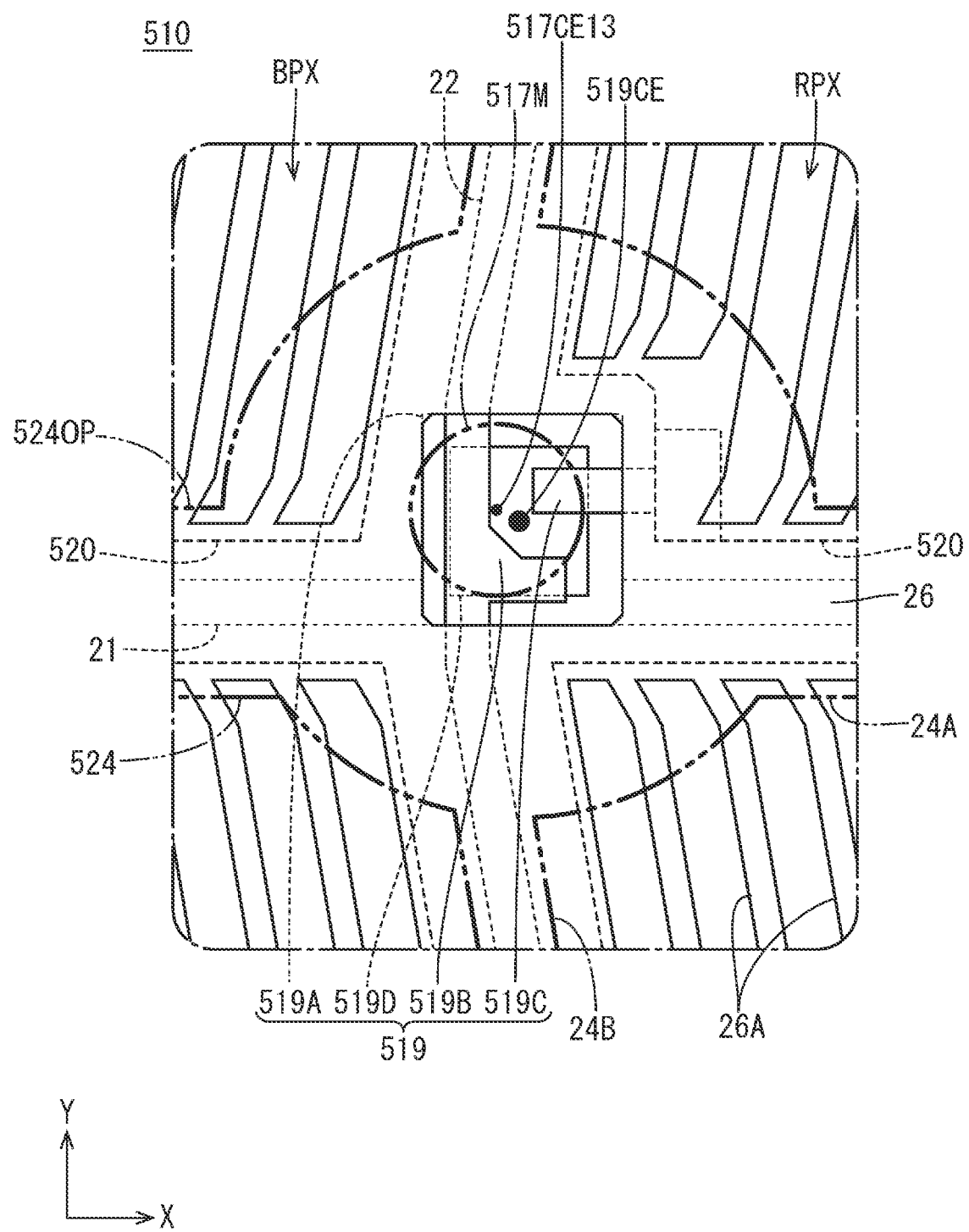
FIG. 27 is a plan view illustrating a positional relationship between a thirteenth main spacer, the TFT, and the light blocking portion in the display region of the liquid crystal panel.
Figure 28:
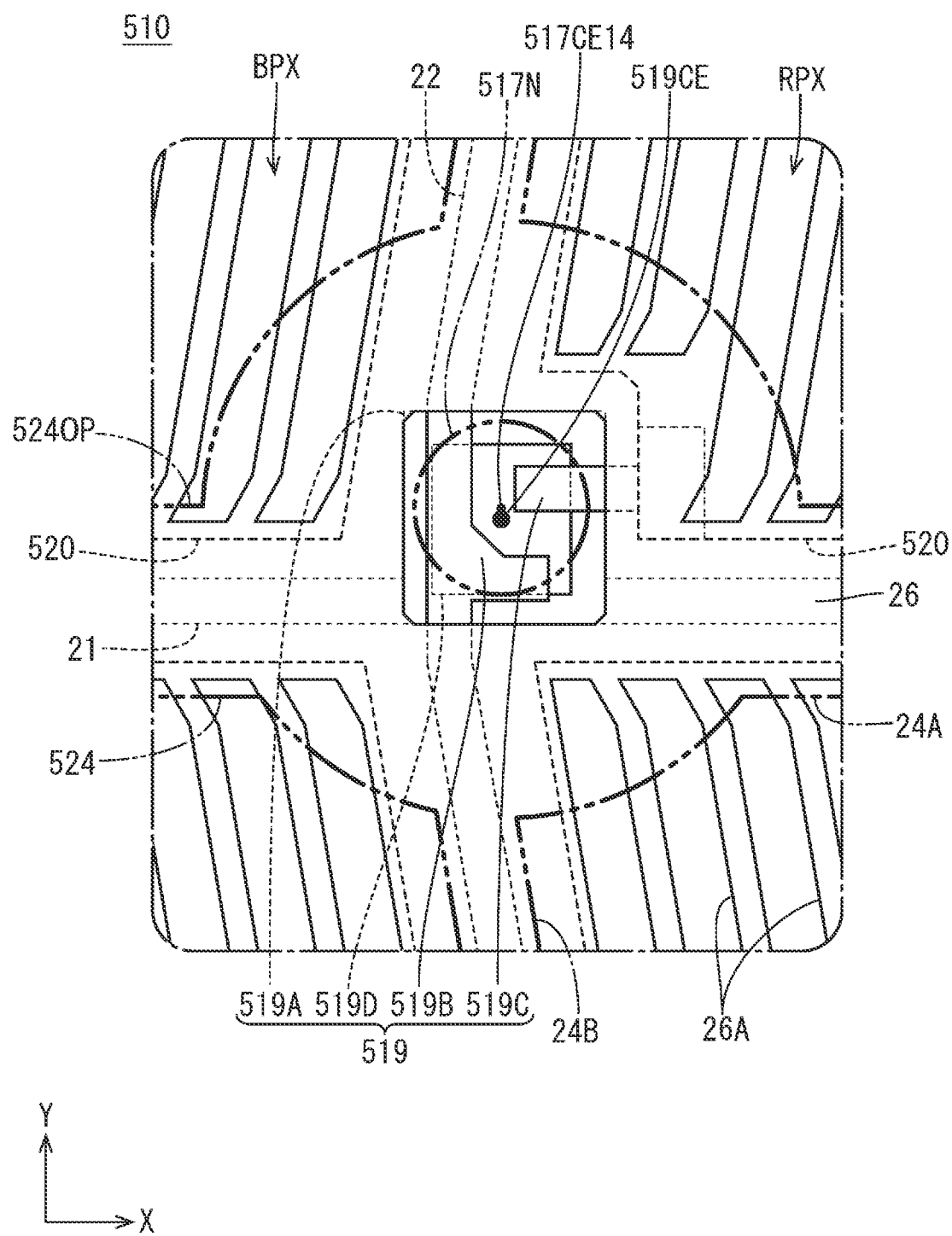
FIG. 28 is a plan view illustrating a positional relationship between a fourteenth main spacer, the TFT, and the light blocking portion in the display region of the liquid crystal panel.
Figure 29:
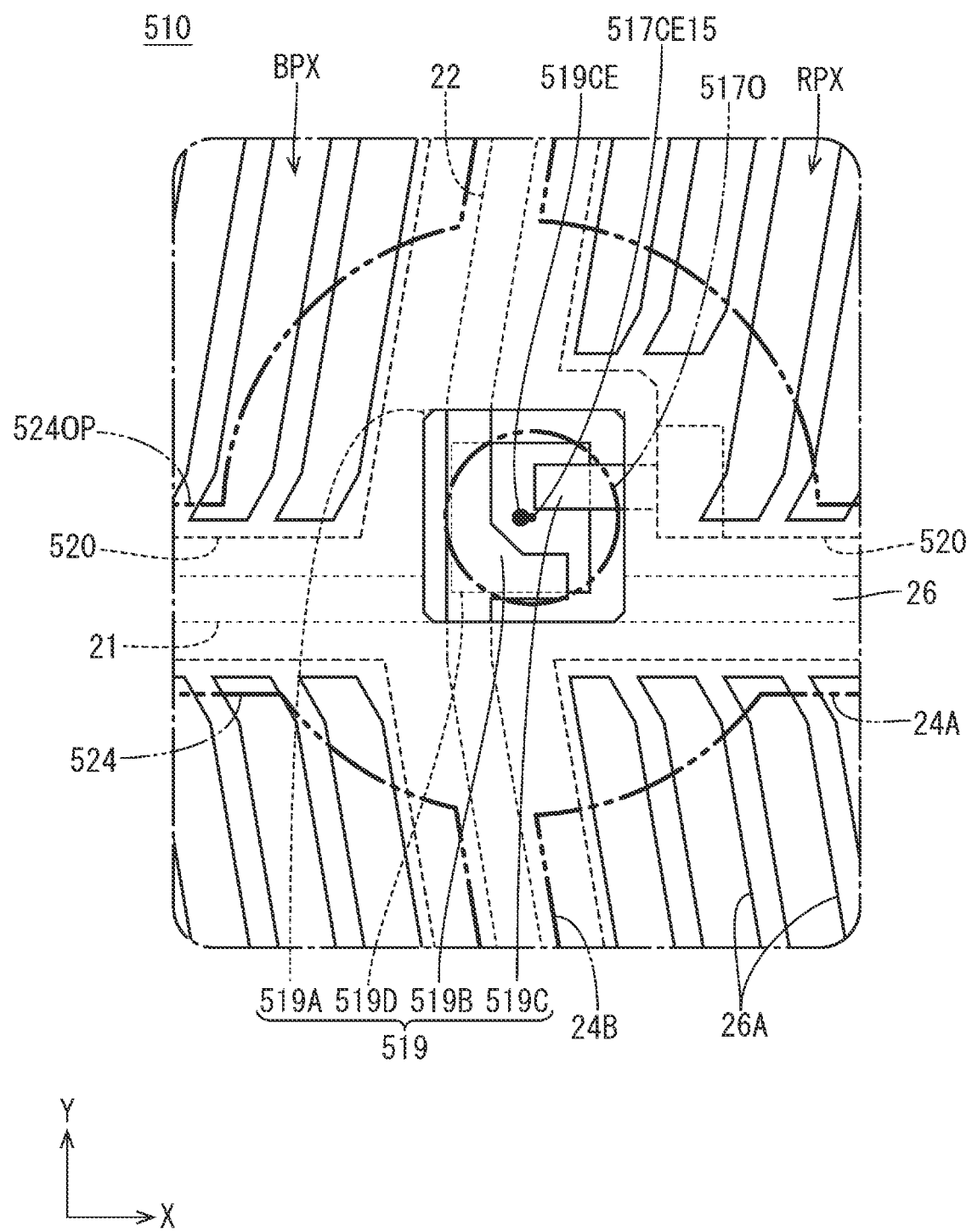
FIG. 29 is a plan view illustrating a positional relationship between a fifteenth main spacer, the TFT, and the light blocking portion in the display region of the liquid crystal panel.
Figure 30:
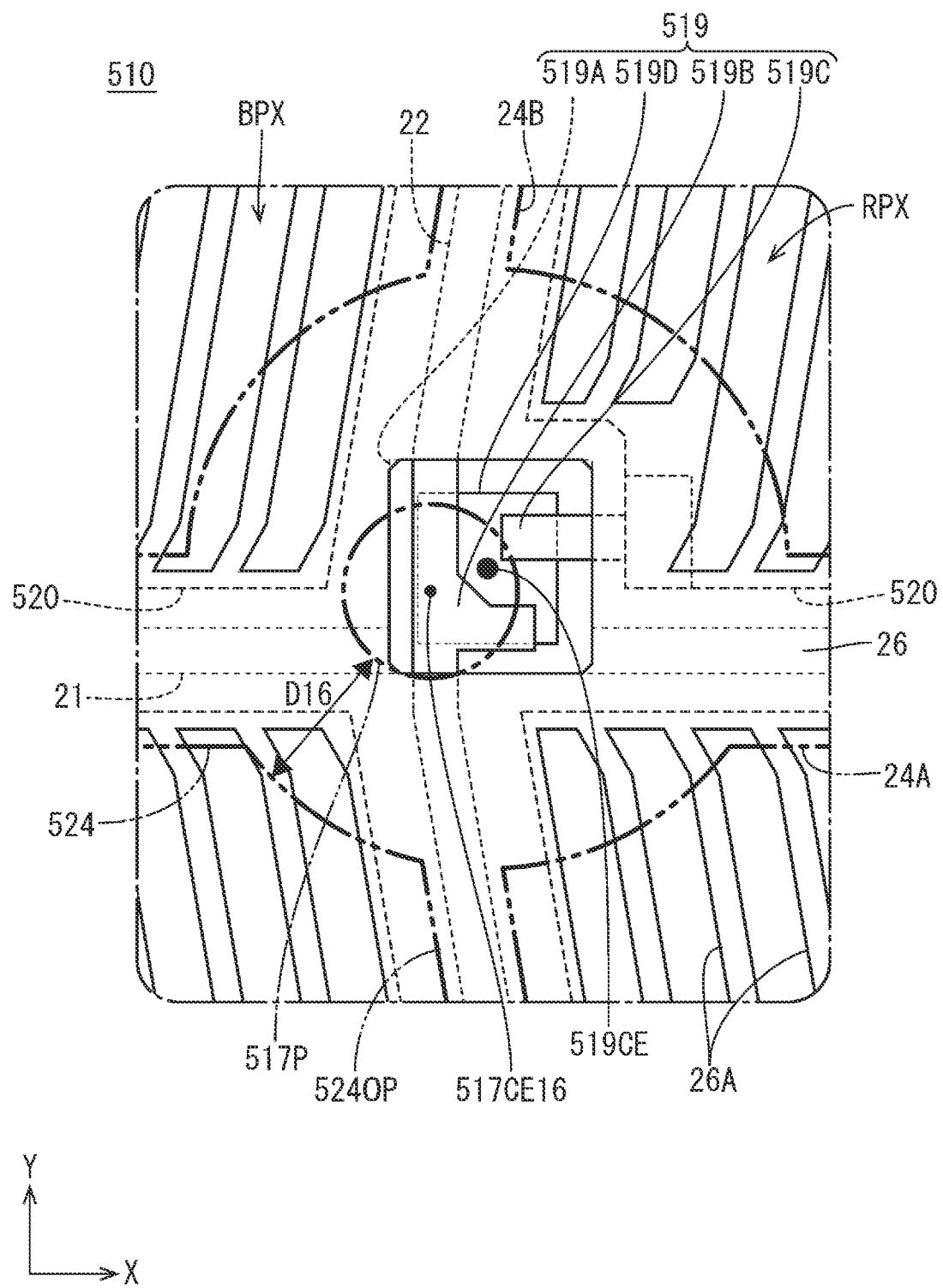
FIG. 30 is a plan view illustrating a positional relationship between a sixteenth main spacer, the TFT, and the light blocking portion in the display region of the liquid crystal panel.

As illustrated in FIG. 26, in the twelfth main spacer 517L, the center 517CE12 thereof deviates upward in an obliquely left direction in FIG. 26 with respect to the center 519CE of the TFT 519 being an overlapping target. The coordinate value of the center 517CE12 of the twelfth main spacer 517L illustrated in FIG. 26 is (−5, 1). As illustrated in FIG. 27, in the thirteenth main spacer 517M, the center 517CE13 thereof deviates upward in an obliquely left direction in FIG. 27 with respect to the center 519CE of the TFT 519 being an overlapping target. The coordinate value of the center 517CE13 of the thirteenth main spacer 517M shown in FIG. 33 is (−2, 1). As illustrated in FIG. 28, in the fourteenth main spacer 517N, the center 517CE14 thereof deviates upward in FIG. 28 with respect to the center 519CE of the TFT 519 being an overlapping target. The coordinate value of the center 517CE14 of the fourteenth main spacer 517N shown in FIG. 33 is (0, 1). As illustrated in FIG. 29, in the fifteenth main spacer 517O, the center 517CE15 thereof deviates rightward in FIG. 29 with respect to the center 519CE of the TFT 519 being an overlapping target. The coordinate value of the center 517CE15 of the fifteenth main spacer 517O shown in FIG. 33 is (1,0). As illustrated in FIG. 30, in the sixteenth main spacer 517P, the center 517CE16 thereof deviates downward in an obliquely left direction in FIG. 30 with respect to the center 519CE of the TFT 519 being an overlapping target. The coordinate value of the center 517CE16 of the sixteenth main spacer 517P shown in FIG. 33 is (−5, −2). As illustrated in FIG. 31, in the seventeenth main spacer 517Q, the center 517CE17 thereof deviates downward in an obliquely left direction in FIG. 31 with respect to the center 519CE of the TFT 519 being an overlapping target. The coordinate value of the center 517CE17 of the seventeenth main spacer 517Q shown in FIG. 33 is (−2, −2). As illustrated in FIG. 32, in the eighteenth main spacer 517R, the center 517CE18 thereof deviates downward in FIG. 32 with respect to the center 519CE of the TFT 519 being an overlapping target. The coordinate value of the center 517CE18 of the eighteenth main spacer 517R shown in FIG. 33 is (0, −2).

As illustrated in FIG. 26 to FIG. 32, in the seven main spacers 517L to 517R having different overlapping relationships, the centers 517CE12 to 517CE18 thereof are positioned further inside than the outer end of an island-shaped semiconductor portion 519D including the channel portion of the TFT 519. In other words, in the present embodiment, it can be said that the seven main spacers 517L to 517R having different overlapping relationships are intensively disposed in the vicinity of the center 519CE (the origin of the coordinate system) of the TFT 519, as compared to the first embodiment described above. Among the seven main spacers 517L to 517R having different overlapping relationships, the twelfth main spacer 517L, the thirteenth main spacer 517M, the sixteenth main spacer 517P, the seventeenth main spacer 517Q, and the eighteenth main spacer 517R are disposed to be closer to a source electrode 519B than a drain electrode 519C provided in the TFT 519 being an overlapping target. That is, the five main spacers 517L, 517M, 517P, 517Q, and 517R, which are a majority of the seven main spacers 517L to 517R having different overlapping relationships, are disposed to be closer to the source electrode 519B. Among these, the twelfth main spacer 517L, the sixteenth main spacer 517P, and the seventeenth main spacer 517Q are disposed such that the respective centers 517CE12, 517CE16, and 517CE17 overlap the source electrode 519B of the TFT 519 being an overlapping target. On the other hand, the fourteenth main spacer 517N and the fifteenth main spacer 517O are disposed to be closer to the drain electrode 519C than the source electrode 519B provided in the TFT 519 being an overlapping target. Both the fourteenth main spacer 517N and the fifteenth main spacer 517O are disposed such that the respective centers 517CE14 and 517CE15 do not overlap the drain electrode 519C of the TFT 519 being an overlapping target. As described above, it can be said that the seven main spacers 517L to 517R having different overlapping relationships are unevenly distributed to the source electrode 519B side out of the source electrode 519B and the drain electrode 519C. Note that all of the seven main spacers 517L to 517R having different overlapping relationships have larger overlapping areas with the source electrode 519B than overlapping areas with the drain electrode 519C.

As described above in the first embodiment, the source electrode 519B and the drain electrode 519C constituting the TFT 519 are different from each other in a contact area with the island-shaped semiconductor portion 519D, and contact areas of the source electrode 519B therewith are larger than contact areas of the drain electrode 519C therewith. A portion of the inner surface of the array substrate 12 which overlaps the source electrode 519B and the drain electrode 519C is the highest portion. In addition, the seven main spacers 517L to 517R having different overlapping relationships are unevenly distributed to the source electrode 519B side having a large contact area with the island-shaped semiconductor portion 519D out of the source electrode 519B and the drain electrode 519C, and thus a contact area with the main spacer 517 with respect to the inner surface of the array substrate 12 can be sufficiently secured even when a positional deviation occurs at the time of bonding the array substrate 12 and the counter substrate together. Thereby, an interval between the array substrate 12 and the counter substrate is maintained more satisfactorily.

A comparative experiment was performed to verify the effects described above. In this comparative experiment, a liquid crystal panel in which all main spacers are disposed concentrically with a TFT being an overlapping target is used as a comparative example, and the liquid crystal panel 10 described before this paragraph is used as an example. In the comparative example, all configurations other than the arrangement of the main spacers with respect to the TFT are the same as and/or similar to those of the example. In the comparative experiment, with respect to the comparative example and the example, a relationship between a contact ratio of the main spacers, which is calculated by dividing the sum of contact areas of all of the main spacers with respect to the inner surface of the array substrate in a display region by a total area of the inner surface of the array substrate in the display region, and the amount of deviation occurring at the time of bonding the counter substrate and the array substrate together was obtained by a simulation. Specifically, in the comparative experiment, a contact ratio of the main spacers was calculated in a case where the counter substrate deviated in the X-axis direction in the range of ±5 μm with respect to the array substrate, and a case where the counter substrate deviated in the Y-axis direction in the range of ±5 μm with respect to the array substrate. Experimental results are as shown in FIG. 34 and FIG. 35. FIG. 34 shows the experimental results of the comparative example, and FIG. 35 shows the experimental results of the example. FIG. 34 and FIG. 35 are tables showing a relationship between a contact ratio of the above-described main spacers and the amounts of deviation of the counter substrate with respect to the array substrate in the X-axis direction and the Y-axis direction. The unit of the contact ratio of the main spacers shown in the tables shown in FIG. 34 and FIG. 35 is unitless. In the tables shown in FIG. 34 and FIG. 35, the amount of deviation of the counter substrate with respect to the array substrate in the X-axis direction is represented as "the amount of deviation in the X-axis direction", and the amount of deviation of the counter substrate with respect to the array substrate in the Y-axis direction is represented as "the amount of deviation in the Y-axis direction". A sign (+) shown in "the amount of deviation in the X-axis direction" means that the counter substrate deviates to the right in FIG. 26 to FIG. 32 with respect to the array substrate. A sign (−) shown in "the amount of deviation in the X-axis direction" means that the counter substrate deviates to the left in FIG. 26 to FIG. 32 with respect to the array substrate. A sign (+) shown in "the amount of deviation in the Y-axis direction" means that the counter substrate deviates upward in FIG. 26 to FIG. 32 with respect to the array substrate. A sign (−) shown in "the amount of deviation in the Y-axis direction" means that the counter substrate deviates downward in FIG. 26 to FIG. 32 with respect to the array substrate.

The experimental results of the comparative experiment will be described. According to FIG. 34 and FIG. 35, in both the comparative example and the example, the contact ratio of the main spacers is maximum when the amounts of deviation in the X-axis direction and the Y-axis direction are approximately 0 μm, and the contact ratio of the main spacers is minimum when the amounts of deviation in the X-axis direction and the Y-axis direction are approximately ±5 inn. This indicates that the larger the amount of deviation is, the more the contact area of the main spacers with respect to the inner surface of the array substrate tends to decrease. According to FIG. 34, in the comparative example, a maximum value of the contact ratio of the main spacers is "0.034", a minimum value of the contact ratio of the main spacers is "0.012", and a difference therebetween is "0.022". According to FIG. 35, in the example, a maximum value of the contact ratio of the main spacers is "0.0298", a minimum value of the contact ratio of the main spacers is "0.016", and a difference therebetween is "0.0138". As compared to the example, in the comparative example, the maximum value of the contact ratio of the main spacers is large, but the minimum value is small, and a difference between the maximum value and the minimum value is large. From this, in the comparative example, in a case where the counter substrate deviates with respect to the array substrate, it can be said that the contact ratio of the main spacers fluctuates greatly depending on the amount of deviation. On the other hand, as compared to the comparative example, in the example, the maximum value of the contact ratio of the main spacers is small, the minimum value is large, and a difference between the maximum value and the minimum value is small. From this, in the example, it can be said that, in a case where the counter substrate deviates with respect to the array substrate, the contact ratio of the main spacers does not fluctuate much regardless of a degree of the amount of deviation, and a variation is small. Thus, according to the example, even when the counter substrate deviates with respect to the array substrate, a contact ratio of the main spacers 517 is not likely to vary, and an interval between the counter substrate and the array substrate can be stably maintained.

In addition, among the seven main spacers 517L to 517R having different overlapping relationships, the twelfth main spacer 517L, the thirteenth main spacer 517M, the sixteenth main spacer 517P, and the seventeenth main spacer 517Q are disposed to be closer to a blue pixel BPX when viewed from the center 519CE of the TFT 519 being an overlapping target, as illustrated in FIG. 26, FIG. 27, FIG. 30, and FIG. 31. In other words, the four main spacers 517L, 517M, 517P, and 517Q, which are a majority of the seven main spacers 517L to 517R having different overlapping relationships, are disposed to be closer to the blue pixel BPX. On the other hand, among the seven main spacers 517L to 517R having different overlapping relationships, the fifteenth main spacer 517O is disposed to be closer to a red pixel RPX when viewed from the center 519CE of the TFT 519 being an overlapping target, as illustrated in FIG. 29. Among the seven main spacers 517L to 517R having different overlapping relationships, the fourteenth main spacer 517N and the eighteenth main spacer 517R are disposed between the blue pixel BPX and the red pixel RPX, as illustrated in FIG. 28 and FIG. 32. In this manner, it can be said that the seven main spacers 517L to 517R having different overlapping relationships are unevenly distributed to the blue pixel BPX side out of the blue pixel BPX and the red pixel RPX that sandwich a boundary closest to the TFT 519 being an overlapping target. In this manner, when comparing an average distance between the main spacer 517 and an opening edge of a pixel opening 5240P overlapping the blue pixel BPX facing the boundary closest to the TFT 519 being an overlapping target, and an average distance between the main spacer 517 and an opening edge of a pixel opening 5240P overlapping the red pixel RPX facing the boundary closest to the TFT 519 being an overlapping target, the former is smaller than the latter. For this reason, the display with the blue pixel BPX is more likely to be adversely affected by the main spacer 517 than the display with the red pixel RPX, but the blue pixel BPX has the lowest relative luminous efficiency, and thus a display failure is not likely to be visually recognized. Thus, the overall display quality can be maintained satisfactorily.

In particular, among the four main spacers 517L, 517M, 517P, and 517Q disposed to be closer to the blue pixel BPX when viewed from the center 519CE of the TFT 519 being an overlapping target, the twelfth main spacer 517L and the sixteenth main spacer 517P have the shortest distances D12 and D16 from the opening edges of two pixel openings 5240P overlapping the blue pixel BPX and the red pixel RPX that sandwich the boundary closest to the TFT 519 being an overlapping target, the shortest distances being the same and smallest values among the values of all of the main spacers 517 as illustrated in FIG. 26 and FIG. 30. However, the twelfth main spacer 517L and the sixteenth main spacer 517P are disposed to be closer to the blue pixel BPX when viewed from the center 519CE of the TFT 519 being an overlapping target. That is, the twelfth main spacer 517L and the sixteenth main spacer 517P are disposed to be closest to the opening edge of the pixel opening 5240P overlapping the blue pixel BPX among all of the main spacers 517, and thus, even when the display with the blue pixel BPX is adversely affected by the main spacers 517L and 517P, the blue pixel BPX has the lowest relative luminous efficiency, and thus a display failure is not likely to be visually recognized. Thus, the overall display quality can be maintained satisfactorily.

As described above, according to the present embodiment, the TFT 519 includes a gate electrode 519A, the island-shaped semiconductor portion 519D disposed to overlap the gate electrode 519A with the gate insulating film 27 interposed therebetween, constituted by a semiconductor film, and including a channel portion, the source electrode 519B which is in contact with a portion of the island-shaped semiconductor portion 519D, and the drain electrode 519C disposed spaced apart from the source electrode 519B and in contact with a portion of the island-shaped semiconductor portion 519D. The source electrode 519B and the drain electrode 519C have contact areas with the island-shaped semiconductor portion 519D different from each other, and the plurality of main spacers 517 are unevenly distributed to the above-described source electrode 519B side having a larger contact area out of the source electrode 519B and the drain electrode 519C. When the TFT 519 is driven based on a signal supplied to the gate electrode 519A, the source electrode 519B and the drain electrode 519C are in an electrical conduction state via the channel portion. Since the source electrode 519B and the drain electrode 519C are in contact with the island-shaped semiconductor portion 519D overlapping the gate electrode 519A with the gate insulating film 27 interposed therebetween, a portion overlapping the source electrode 519B and the drain electrode 519C in the TFT 519 is the highest (thickest) portion. The main spacer 517 is mainly in contact with the portion overlapping the source electrode 519B and the drain electrode 519C which is the highest portion of the TFT 519 in the array substrate 12. The plurality of main spacers 517 are unevenly distributed to the source electrode 519B side having a large contact area with the island-shaped semiconductor portion 519D out of the source electrode 519B and the drain electrode 519C, and thus, even when a positional deviation occurs at the time of bonding the array substrate 12 and the counter substrate 11 together, the contact area of the main spacer 517 with respect to the array substrate 12 can be sufficiently secured. Thereby, an interval between the array substrate 12 and the counter substrate 11 is maintained more satisfactorily.

Additionally, the counter substrate 11 includes the plurality of pixel openings 5240P that respectively overlap the plurality of pixel electrodes 520 and, a light blocking portion 524 disposed to overlap the plurality of main spacers 517, and the plurality of main spacers 517 are unevenly distributed to the blue pixel BPX side out of the blue pixel BPX and the red pixel RPX that sandwich the boundary closest to the TFT 519 being an overlapping target. In this manner, when comparing an average distance between the main spacer 517 and the opening edge of the pixel opening 5240P overlapping the pixel electrode 520 of the blue pixel BPX facing the boundary closest to the TFT 519 being an overlapping target and an average distance between the main spacer 517 and the opening edge of the pixel opening 5240P overlapping the pixel electrode 520 of the red pixel RPX facing the boundary closest to the TFT 519 being an overlapping target, the former is smaller than the latter. For this reason, the display with the blue pixel BPX is more likely to be adversely affected by the main spacer 517 than the display with the red pixel RPX, but the blue pixel BPX has the lowest relative luminous efficiency, and thus a display failure is not likely to be visually recognized. Thereby, the overall display quality can be maintained satisfactorily.

OTHER EMBODIMENTS

The technique disclosed in the present specification is not limited to the embodiments described above and illustrated in the drawings, and the following embodiments, for example, are also included within the technical scope.

(1) The number of the main spacers 17, 117, 217, 317, 417, and 517 having different overlapping relationships can be appropriately changed other than five or seven.

(2) The specific arrangement of the seven main spacers 17A to 17G having different overlapping relationships in the range illustrated in FIG. 7 can be appropriately changed other than those illustrated in FIG. 7.

(3) The range of the display region AA in which all of the plurality of main spacers 17, 117, 217, 317, 417, and 517, having different overlapping relationships are disposed can be appropriately changed other than the range illustrated in FIG. 7 (a range in which 27 pixels PX are aligned in the X-axis direction and nine pixels PX are aligned in the Y-axis direction).

(4) The specific arrangement of the plurality of main spacers 17, 117, 217, 317, 417, and 517 having different overlapping relationships with respect to the centers 19CE, 319CE, 419CE, and 519CE of the TFTs 19, 119, 319, 419, and 519 can be appropriately changed.

(5) As a modification example of the first to fifth embodiments, for example, the plurality of main spacers 17, 117, 217, 317, and 417 having different overlapping relationships may be disposed at positions that are concentric with vertexes of a regular triangle, a regular pentagon, or a regular polygon with seven or more sides which is concentric with the centers 19CE, 319CE, 419CE, and 519CE of the TFTs 19, 119, 319, 419, and 519. Additionally, as a modification example of the first to the fifth embodiments, for example, the plurality of main spacers 17, 117, 217, 317, and 417 having different overlapping relationships may be disposed at positions that are concentric with vertexes of a non-regular polygon, such as a non-regular triangle (including an inequilateral triangle and an isosceles triangle), a rectangle, a parallelogram, a rhomboid, or a trapezoid, which is concentric with the centers 19CE, 319CE, 419CE, and 519CE of the TFTs 19, 119, 319, 419, and 519.

(6) As a modification example of the sixth embodiment, for example, the plurality of main spacers 517 having overlapping relationships may be disposed at different positions where the shortest distances from opening edges of two pixel openings 5240P overlapping the pixel electrode 520 of the blue pixel BPX and the pixel electrode 520 of the red pixel RPX that sandwich a boundary closest to the TFT 519 being an overlapping target are all different.

(7) As a modification example of the first to fifth embodiments, the plurality of main spacers 17, 117, 217, 317, and 417 may not include the main spacers 17, 117, 217, 317, and 417 disposed concentrically with the TFTs 19, 119, 319, and 419 being overlapping targets.

(8) As a modification example of the sixth embodiment, the plurality of main spacers 517 may include the main spacer 517 disposed concentrically with the TFT 519 being an overlapping target.

(9) As a modification example of the first, third, fourth, and sixth embodiments, specific values of coordinate values of the main spacers 17, 217, 317, and 517 can be appropriately changed.

(10) As a modification example of the first to third, and fifth embodiments, the centers 17CE2 to 17CE7, 217CE2 to 217CE7, 417CE2, 417CE5, and 417CE6 of the six main spacers 17B to 17G, 217B to 217G, 417B, 417E, and 417F which are not concentric with the centers 19CE and 419CE of the TFTs 19, 119, and 419 being overlapping targets may be positioned on sides closer to the inner peripheries than the outer ends of the first main spacers 17A, 117A, 217A, and 317A or may be positioned on sides closer to the outer peripheries than the outer ends thereof.

(11) As a modification example of the second embodiment, the diameter dimensions and the sum of the areas of the four fifth light blocking portions 24E may be different from the diameter dimensions and the sum of the areas of the four fourth light blocking portions 124D surrounding the sub-spacer 118.

(12) As a modification example of the second embodiment, the shortest distance related to the first main spacer 117A may be different from the shortest distances D2 to D7 related to the other six main spacers 17B to 17G.

(13) As a modification example of the third embodiment, the plurality of main spacers 217 may be disposed such that the plurality of main spacers 17 described in the first embodiment are disposed to be rotated by angles (for example, 30 degrees, 45 degrees, 60 degrees, or the like) other than 90 degrees around the origin.

(14) As a modification example of the fourth embodiment, the centers 317CE8 to 317CE11 of the four main spacers 317H to 317K that are not concentric with the center 319CE of the TFT 319 being an overlapping target may be positioned on the outer end of the first main spacer 317A or may be positioned on a side closer to the outer periphery than the outer end thereof.

(15) As a modification example of the fifth embodiment, an overlapping portion that overlaps both a portion of any one of the first main spacer, the third main spacer, the fourth main spacer, and the seventh main spacer and a portion of the gate wiring line 421 or the source wiring line 422 may be provided. The configuration of the overlapping portion provided in this case is the same as and/or similar to those of the overlapping portions 29 to 34 described in the fifth embodiment.

(16) The main spacers 17, 117, 217, 317, 417, and 517 may be provided to be divided into the counter substrates 11 and 411 and the array substrates 12 and 412. In this case, first main spacer components provided in the counter substrate 11 and 411 and second main spacer components provided in the array substrates 12 and 412 may be disposed to overlap each other and may be in contact with each other.

(17) The planar shapes of the main spacers 17, 117, 217, 317, 417, and 517 can be changed to, for example, an ellipse, a rectangle, a triangle, a polygon with five or more sides, or the like in addition to a circle.

(18) The number of the sub-spacers 18 and 118 installed and installation ratios thereof can be changed appropriately. The number of the TFTs 19, 119, 319, 419, and 519 in which none of the main spacers 17, 117, 217, 317, 417, and 517 and the sub-spacers 18 and 118 overlap each other can also be appropriately changed.

(19) Specific planar shapes and sizes of the source electrodes 19B, 419B, and 519B and the drain electrodes 19C, 419C, and 519C constituting the TFTs 19, 119, 319, 419, and 519, contact areas thereof with the island-shaped semiconductor portions 19D, 419D, and 519D including the channel portions, and the like can be appropriately changed. In this case, the contact areas of the source electrodes 19B, 419B, and 519B with the island-shaped semiconductor portions 19D, 419D, and 519D and the contact areas of the drain electrodes 19C, 419C, and 519C with the island-shaped semiconductor portions 19D, 419D, and 519D may be equal to each other. Further, the contact areas of the drain electrodes 19C, 419C, and 519C with the island-shaped semiconductor portions 19D, 419D, and 519D may be larger than the contact areas of the source electrodes 19B, 419B, and 519B with the island-shaped semiconductor portions 19D, 419D, and 519D.

(20) Specific planar shapes and sizes of the gate electrodes 19A, 419A, and 519A constituting the TFTs 19, 119, 319, 419, and 519, overlapping areas thereof with the island-shaped semiconductor portions 19D, 419D, and 519D, and the like can be appropriately changed.

(21) Specific planar shapes, sizes, and the like of the island-shaped semiconductor portions 19D, 419D, and 519D constituting the TFTs 19, 119, 319, 419, and 519 can be appropriately changed.

(22) As described above in (19) to (21), the TFTs 19, 119, 319, 419, and 519 may have bilaterally symmetrical shapes as a whole as a result of changing the configurations such as the electrodes 19A, 419A, 519A, 19B, 419B, 519B, 19C, 419C, and 519C and the island-shaped semiconductor portions 19D, 419D, and 519D. In addition, in the case of a complex shape in which the outer edges of the island-shaped semiconductor portions 19D, 419D, and 519D include irregularities, the center of gravity thereof may be the center of the island-shaped semiconductor portion.

(23) Specific arrangement of the TFTs 19, 119, 319, 419, and 519 with respect to the pixels PX can be appropriately changed. For example, the TFTs 19, 119, 319, 419, and 519 may be disposed in the vicinity of the lower right corner of the pixel electrode 20 to be connected in FIG. 3. In this case, the TFTs 19, 119, 319, 419, and 519 closest to a boundary between the blue pixel BPX and the red pixel RPX are the TFTs 19, 119, 319, 419, and 519 connected to the pixel electrodes 20 constituting the blue pixel BPX. In such a configuration, the main spacers 17, 117, 217, 317, 417, and 517 may be disposed to overlap the TFTs 19, 119, 319, 419, and 519 connected to the pixel electrodes 20 constituting the blue pixel BPX.

(24) In addition to (23) described above, the TFTs 19, 119, 319, 419, and 519 may be disposed at the upper left corner position or the upper right corner position of the pixel electrode 20 to be connected in FIG. 3.

(25) In addition to (23) and (24) described above, for example, the TFTs 19, 119, 319, 419, and 519 may be disposed at the central position of the pixel PX in the X-axis direction. Further, the TFTs 19, 119, 319, 419, and 519 may be disposed at positions between the center position of the pixel PX in the X-axis direction and intersections between the gate wiring lines 21 and 421 and the source wiring lines 22 and 422.

(26) There may be a plurality of types of arrangement of the TFTs 19, 119, 319, 419, and 519 with respect to the pixel PX. For example, in a certain pixel row (first pixel row), the TFTs 19, 119, 319, 419, and 519 are disposed in the vicinity of the lower left corner position of the pixel electrode 20 to be connected in FIG. 3, whereas in the next pixel row (second pixel row), the TFTs 19, 119, 319, 419, and 519 may be disposed in the vicinity of the lower right corner position of the pixel electrode 20 to be connected in FIG. 3. That is, the TFTs 19, 119, 319, 419, and 519 that are unevenly distributed to one side in the X-axis direction with respect to the pixel electrode 20, and the TFTs 19, 119, 319, 419, and 519 that are unevenly distributed to the other side in the X-axis direction with respect to the pixel electrode 20 may be arranged in a zigzag shape in which they are repeatedly arranged for each pixel row. In this case, the plurality of main spacers 17, 117, 217, 317, 417, and 517 may include the main spacers 17, 117, 217, 317, 417, and 517 that are disposed to overlap the TFTs 19, 119, 319, 419, and 519 connected to the pixel electrodes 20 constituting the red pixel RPX, and the main spacers 17, 117, 217, 317, 417, and 517 that are disposed to overlap the TFTs 19, 119, 319, 419, and 519 connected to the pixel electrodes 20 constituting the blue pixel BPX.

(27) The configurations of the TFTs 19, 119, 319, 419, and 519 may be a top gate type, a double gate type, or the like, in addition to the bottom gate type illustrated in the drawings.

(28) Specific patterns of the light blocking portions 24, 124, and 524 can be appropriately changed.

(29) The color filter 23 may be provided in the array substrates 12 and 412. In this case, the pixel electrodes 20 constituting the pixel PX and the color filter 23 are both provided in the array substrates 12 and 412, and the components of the pixel PX are not provided in the counter substrates 11 and 411.

(30) The pixel PX may be constituted by a self-luminous element provided in the array substrates 12 and 412. In this case, both the pixel electrode 20 and the color filter 23 can be omitted, or only the pixel electrode 20 can be omitted.

(31) The number of colors of the pixels PX may be four or more. A pixel PX to be added may be a yellow pixel capable of emitting yellow light included in a yellow wavelength region (approximately 570 nm to approximately 600 nm), a white pixel capable of emitting light in a full wavelength region, or the like.

(32) The alignment film is not limited to a type in which photo-alignment treatment is performed, and may be a type in which rubbing treatment is performed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A display device comprising:
an array substrate;
a counter substrate spacing apart from and facing the array substrate;
a plurality of color filters provided in the array substrate or the counter substrate, the plurality of color filters exhibiting different colors;
a plurality of pixel electrodes provided in the array substrate, the plurality of pixel electrodes overlapping the plurality of color filters;
a plurality of pixels constituted by the plurality of color filters and the plurality of pixel electrodes, the plurality of pixels having different relative luminous efficiency;
a plurality of thin film transistors provided in the array substrate, the plurality of thin film transistors respectively connected to the plurality of pixel electrodes; and
a plurality of spacers provided in at least the counter substrate, the plurality of spacers protruding toward the array substrate from the counter substrate, the plurality of spacers disposed to overlap at least some of the plurality of thin film transistors,
wherein the plurality of pixels include
a plurality of first pixels each having the highest relative luminous efficiency,
a plurality of second pixels each having the lowest relative luminous efficiency, and
a plurality of third pixels disposed adjacent to the second pixels, the plurality of third pixels each having relative luminous efficiency lower than the relative luminous efficiency of the plurality of first pixels and higher than the relative luminous efficiency of the plurality of second pixels,
the plurality of spacers include a plurality of spacers having different overlapping relationships with the plurality of thin film transistors each being an overlapping target, and
an overlapping target of each of the plurality of spacers having different overlapping relationships is a thin film transistor of the plurality of thin film transistors that is closest to a boundary between a second pixel of the plurality of second pixels and a third pixel of the plurality of third pixels.

2. The display device according to claim 1,
wherein the counter substrate includes
a plurality of pixel openings respectively overlapping the plurality of pixel electrodes, and
a light blocking portion disposed to overlap the plurality of spacers, and
the plurality of spacers having different overlapping relationships include a plurality of the spacers having shortest distances being equal to each other, the shortest distances being distances from opening edges of two of the plurality of pixel openings overlapping a pixel electrode of the plurality of pixel electrodes of the second pixel and a pixel electrode of the plurality of pixel electrodes of the third pixel that sandwich the boundary closest to the thin film transistor being an overlapping target.

3. The display device according to claim 2, wherein the plurality of spacers having the shortest distances being equal to each other are configured such that distances between centers of the plurality of spacers and respective centers of the plurality of thin film transistors each being an overlapping target are equal to each other.

4. The display device according to claim 3, wherein the plurality of spacers having the shortest distances being equal to each other are disposed at positions that are concentric with vertexes of a regular polygon that is concentric with each of the centers of the plurality of thin film transistors being an overlapping target.

5. The display device according to claim 2, wherein the light blocking portion is configured such that, among the plurality of pixel openings respectively overlapping the pixel electrodes of the plurality of second pixels and the pixel electrodes of the plurality of third pixels that sandwich a plurality of the boundaries closest to the plurality of thin film transistors respectively overlapping the plurality of spacers having the shortest distances being equal to each other, planar shapes of the plurality of pixel openings respectively overlapping the pixel electrodes of the plurality of second pixels are the same, and planar shapes of the plurality of pixel openings respectively overlapping the pixel electrodes of the plurality of third pixels are the same.

6. The display device according to claim 2, wherein the plurality of spacers having the shortest distances being equal to each other are disposed to overlap the respective centers of the plurality of thin film transistors each being an overlapping target.

7. The display device according to claim 2, wherein the plurality of spacers having different overlapping relationships include a spacer of the plurality of spacers disposed concentrically with the thin film transistor being an overlapping target, and the spacer disposed in a concentric manner has the shortest distance larger than the shortest distances of the plurality of spacers having the shortest distances being equal to each other.

8. The display device according to claim 2, wherein the plurality of spacers having different overlapping relationships include a spacer of the plurality of spacers disposed concentrically with the thin film transistor being an overlapping target, and the spacer disposed in a concentric manner and the plurality of spacers having the shortest distances being equal to each other have the same shortest distances.

9. The display device according to claim 8, further comprising:
a plurality of sub-spacers provided in at least the counter substrate, the plurality of sub-spacers protruding toward the array substrate from the counter substrate, the plurality of sub-spacers having protrusion dimensions smaller than protrusion dimensions of the plurality of spacers,
wherein the plurality of sub-spacers are disposed to overlap at least some of a plurality of thin film transistors in which the plurality of spacers are not disposed among the plurality of thin film transistors, and
the light blocking portion is disposed to overlap the plurality of sub-spacers and is configured such that, among the plurality of pixel openings, planar shapes of the plurality of pixel openings overlapping the plurality of pixel electrodes respectively connected to the plurality of thin film transistors respectively overlapping the plurality of sub-spacers and planar shapes of two of the plurality of pixel openings overlapping the pixel electrode of the second pixel and the pixel electrode of the third pixel that sandwich the boundary closest to the thin film transistor overlapping the spacer disposed in a concentric manner are the same.

10. The display device according to claim 1, wherein the thin film transistor includes
a gate electrode,
an island-shaped semiconductor portion disposed to overlap the gate electrode with a gate insulating film interposed between the gate electrode and the island-shaped semiconductor portion, the island-shaped semiconductor portion constituted by a semiconductor film, the island-shaped semiconductor portion including a channel portion,
a source electrode being in contact with a portion of the semiconductor portion, and
a drain electrode disposed spaced apart from the source electrode, the drain electrode being in contact with a portion of the semiconductor portion,
the source electrode and the drain electrode have different contact areas with the semiconductor portion, and
the plurality of spacers are unevenly distributed to be closer to the electrode having a large contact area out of the source electrode and the drain electrode.

11. The display device according to claim 10, wherein the counter substrate includes
a plurality of pixel openings respectively overlapping the plurality of pixel electrodes, and
a light blocking portion disposed to overlap the plurality of spacers, and
the plurality of spacers are unevenly distributed to be closer to the second pixel out of the second pixel and the third pixel that sandwich the boundary closest to the thin film transistor being an overlapping target.

12. The display device according to claim 1, further comprising:
a source wiring line extending along the boundary closest to the thin film transistor overlapping a spacer of the plurality of spacers, and
a gate wiring line intersecting the source wiring line,
wherein the thin film transistor includes
a gate electrode constituted by a first conductive film,
an island-shaped semiconductor portion disposed to overlap the gate electrode with a gate insulating film interposed between the gate electrode and the island-shaped semiconductor portion, the island-shaped semiconductor portion constituted by a semiconductor film, the island-shaped semiconductor portion including a channel portion,
a source electrode constituted by a second conductive film, the source electrode being in contact with a portion of the semiconductor portion, and
a drain electrode constituted by a portion of the second conductive film, the portion being separate from the source electrode, the drain electrode disposed spaced apart from the source electrode, the drain electrode being in contact with a portion of the semiconductor portion, the gate wiring line is constituted by a portion of the first conductive film, the portion being separate from the gate electrode, and is continuous with the gate electrode, the source wiring line is constituted by a portion of the second conductive film, the portion being separate from the source electrode and the drain electrode, and is continuous with the source electrode, and the display device further comprises a first overlapping portion disposed to overlap a portion of the spacer included in the plurality of spacers having different overlapping relationships, and a portion of the gate wiring line, the first overlapping portion constituted by a portion of the semiconductor film, the portion being separate from the semiconductor portion, and a second overlapping portion disposed to overlap the first overlapping portion and constituted by a portion of the second conductive film, the portion being separate from the source electrode, the drain electrode, and the source wiring line.

13. The display device according to claim 12, further comprising:

a third overlapping portion disposed to overlap a portion of the spacer included in the plurality of spacers having different overlapping relationships, and a portion of the source wiring line, the third overlapping portion constituted by a portion of the first conductive film, the portion being separate from the gate electrode and the gate wiring line; and a fourth overlapping portion disposed to overlap the third overlapping portion, the fourth overlapping portion constituted by a portion of the semiconductor film, the portion being separate from the semiconductor portion and the first overlapping portion.

14. The display device according to claim 1, further comprising:

a source wiring line extending along the boundary closest to the thin film transistor overlapping a spacer of the plurality of spacers, and a gate wiring line intersecting the source wiring line, wherein the thin film transistor includes a gate electrode constituted by a first conductive film, an island-shaped semiconductor portion disposed to overlap the gate electrode through a gate insulating film interposed between the gate electrode and the island-shaped semiconductor portion, the island-shaped semiconductor portion constituted by a semiconductor film, the island-shaped semiconductor portion including a channel portion, a source electrode constituted by a second conductive film, the source electrode being in contact with a portion of the semiconductor portion, and a drain electrode constituted by a portion of the second conductive film, the portion being separate from the source electrode, the drain electrode disposed spaced apart from the source electrode, the drain electrode being in contact with a portion of the semiconductor portion, the gate wiring line is constituted by a portion of the first conductive film, the portion being separate from the gate electrode, and is continuous with the gate electrode, the source wiring line is constituted by a portion of the second conductive film, the portion being separate from the source electrode and the drain electrode, and is continuous with the source electrode, and the display device further comprises a third overlapping portion disposed to overlap a portion of the spacer included in the plurality of spacers having different overlapping relationships, and a portion of the source wiring line, and constituted by a portion of the first conductive film, the portion being separate from the gate electrode and the gate wiring line, and a fourth overlapping portion disposed to overlap the third overlapping portion and constituted by a portion of the semiconductor film, the portion being separate from the semiconductor portion.

* * * * *